United States Patent
Toda

(10) Patent No.: US 8,392,770 B2
(45) Date of Patent: Mar. 5, 2013

(54) RESISTANCE CHANGE MEMORY DEVICE HAVING HIGH-SPEED TWO-STEP WRITE MODE

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 436 days.

(21) Appl. No.: 12/691,169

(22) Filed: Jan. 21, 2010

(65) Prior Publication Data

US 2010/0235714 A1 Sep. 16, 2010

(30) Foreign Application Priority Data

Mar. 13, 2009 (JP) ................................. 2009-060945

(51) Int. Cl.
G11C 29/00 (2006.01)
G11C 7/00 (2006.01)
(52) U.S. Cl. .......................... 714/721; 714/719; 365/200
(58) Field of Classification Search .................. 714/718, 714/719, 721; 365/200
See application file for complete search history.

(56) References Cited

U.S. PATENT DOCUMENTS

| 6,087,674 | A | 7/2000 | Ovshinsky et al. | |
|---|---|---|---|---|
| 6,141,241 | A | 10/2000 | Ovshinsky et al. | |
| 6,870,755 | B2 * | 3/2005 | Rinerson et al. | 365/148 |
| 7,292,469 | B2 * | 11/2007 | Lee et al. | 365/163 |
| 7,369,433 | B2 * | 5/2008 | Toda | 365/185.03 |
| 7,835,172 | B2 * | 11/2010 | Shinozaki | 365/148 |
| 7,903,448 | B2 * | 3/2011 | Oh et al. | 365/148 |
| 8,139,432 | B2 * | 3/2012 | Choi et al. | 365/211 |
| 2009/0106014 | A1 * | 4/2009 | Norman | 703/23 |
| 2009/0198881 | A1 | 8/2009 | Toda | |
| 2009/0213639 | A1 | 8/2009 | Toda | |
| 2009/0279344 | A1 | 11/2009 | Toda | |

FOREIGN PATENT DOCUMENTS

JP 2006-302465 11/2006

OTHER PUBLICATIONS

Zhuang et al, "Novel colossal magnetoresistive thin film nonvolatile resistance random access memory (RRAM)," Electron Devices Meeting, 2002. IEDM '02. International, vol., no., pp. 193-196, Dec. 8-11, 2002.*
U.S. Appl. No. 13/011,318, filed Jan. 21, 2011, Toda.
Office Action issued Oct. 23, 2012 in Japanese Patent Application No. 2009-060945, filed Mar. 13, 2009 (with English translation).

* cited by examiner

Primary Examiner — Cynthia Britt
(74) Attorney, Agent, or Firm — Oblon, Spivak, McClelland, Maier & Neustadt, L.L.P.

(57) ABSTRACT

A resistance change memory device including a cell array, in which memory cells are arranged, the memory cell being reversibly set in one of a first data state and a second data state defined in accordance with the difference of the resistance value, wherein the memory device has a data write mode including: a first write procedure for writing the first data in the cell array; and a second write procedure for writing the second data in the cell array.

23 Claims, 55 Drawing Sheets

| mode \ gate | Vm | Vg |
|---|---|---|
| Reset (data"0";/Write"L") | Vdd | Vg_reset |
| FormIng/Set (data"1";/Write"L") | Vt+ε | Vpp>Vdd+Vt |
| Read (/Write"H") | Vread | Vread |

Vss<Vt+ε<Vread<Vg_reset<Vdd<Vpp

FIG. 36 Problem (1) – Initial State – in the Sense System

FIG. 39
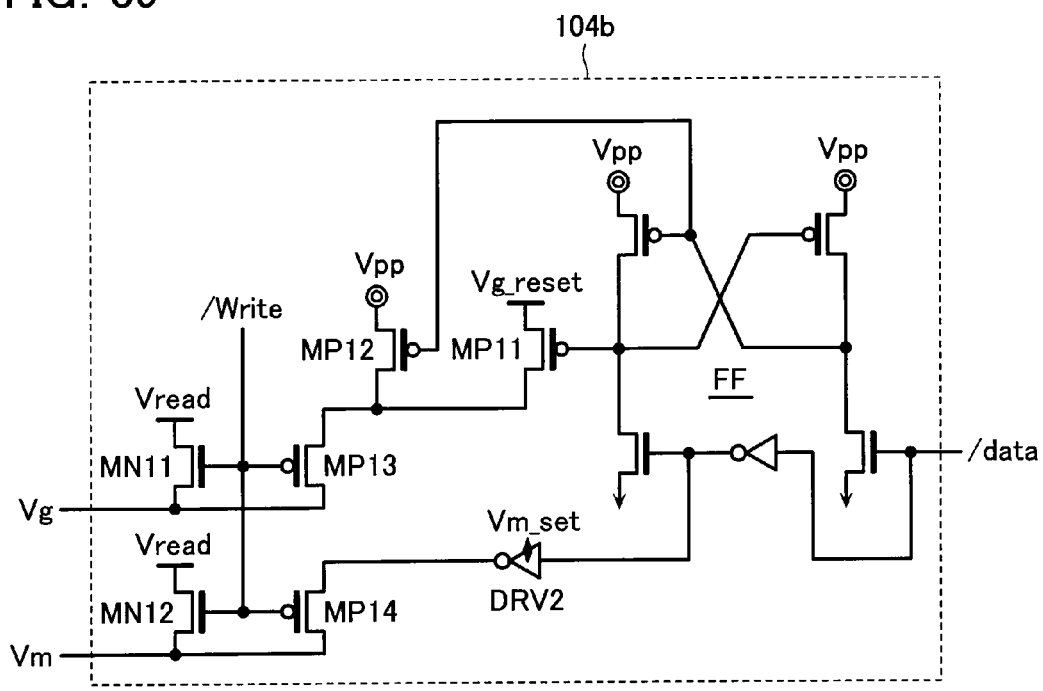
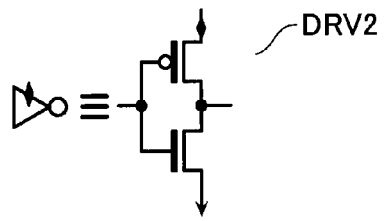
FIG. 40
| mode \ gate | Vm | Vg |
|---|---|---|
| Reset (data"0";/Write"L") | Vss | Vg_reset |
| Forming/Set (data"1";/Write"L") | Vm_set | Vpp>Vdd+Vt |
| Read (/Write"H") | Vdd | Vg_read |
Vss<Vm_set∼Vg_read<Vg_reset<Vdd Stop of Read Burst Cycle Interrupt of Over-Write Burst

FIG. 52

Procedures of Main Operation Modes i. Forming Write burst
 A: Command (new burst add.) → buffer register '1' set → '1' Write Tr.
 B: '1' Write Tr. → ↑

0. '0' all Write burst
 A: Command (new burst add.) → buffer register '0' set → '0' Write Tr.
 B: '0' Write Tr. → ↑

1. Read burst
 A: Command (new burst add.) → new add. Read Tr. → new burst
 B: burst data out → ↑

2. over Write burst
 A: Command (new burst add.) → new add. Read Tr. → new burst
    ECC & all '1' Write →'0' Write Tr. → ↑
 B: burst data in → ↑

3. '1' only Write burst
 A: Command (new burst add.) → buffer register '0' set → new burst
    ECC → '1' Write Tr. → ↑
 B: burst data in → ↑

4. ECC Refresh burst
 A: Command (new burst add.) → new add. Read Tr. (ECC)
    → all '1' Write →'0' Write Tr. → ↑             → all '1' Write →'0' Write Tr.
 B: Read Tr. ↑ (ECC)

FIG. 63

| CMD | c0 | c1 | c2 |
|---|---|---|---|
| R | 0 | 0 | 0 |
| over W | 1 | 0 | 0 |
| 0 all W | 0 | 1 | 0 |
| 1only W | 1 | 1 | 0 |
| Stop | 0 | 0 | 1 |
| Refresh | 1 | 0 | 1 |
| Forming | 0 | 1 | 1 | x16
A0 ~A21;burst
A22~A28;burst top
A29~      ;mat layer

RESISTANCE CHANGE MEMORY DEVICE HAVING HIGH-SPEED TWO-STEP WRITE MODE

CROSS-REFERENCE TO RELATED APPLICATION

This application is based on and claims the benefit of priority from the prior Japanese Patent Application No. 2009-060945, filed on Mar. 13, 2009, the entire contents of which are incorporated herein by reference.

BACKGROUND OF THE INVENTION

1. Field of the Invention

This invention relates to a resistance change memory device, specifically to high-speed write mode thereof in a case where the memory device is integrated with a large capacity.

2. Description of the Related Art

A resistance change memory (i.e., resistive RAM; ReRAM), in which the resistance state of cells is exchanged by voltage, current or heat and it serves as data, is noticed for succeeding a conventional NAND type flash memory. The ReRAM is suitable for shrinking the cell size and for constituting a cross-point cell array, and the cell arrays may be easily stacked. Therefore, it is noticed that a large capacity of file memory may be constructed as a three-dimensional (3D-) cell array. For example, refer to Y. Hosoi et al, "High Speed Unipolar Switching Resistance RAM(RRAM) Technology" IEEE International Electron Devices Meeting 2006 Technical Digest p. 793-796.

What is material to achieve a large capacity of ReRAM and a high-speed read/write property is that there are asymmetric characteristics between the reset and set operations of a ReRAM. In detail, there is such a basic difference in case of a kind of memory cell material that the set operation is a voltage mode while the reset operation is a current mode. Another asymmetric property is in that the reset operation of the current mode needs a long time such as several times to one hundred times in comparison with the set operation of the voltage mode. Note here that if the cell material is changed, the above-described time relationship between the reset and set operations may be reversed.

Which of the voltage mode and current mode takes a long time is dependent on the cell material. If not considering sufficiently the above-described asymmetric properties of the reset and set operations, it becomes difficult to achieve a high performance ReRAM with a large capacity.

SUMMARY OF THE INVENTION

According to an aspect of the present invention, there is provided a resistance change memory device including a cell array, in which memory cells are arranged, the memory cell being reversibly set in one of a first data state and a second data state defined in accordance with the resistance value, wherein the memory device has a data write mode including: a first write procedure for writing the first data in the cell array; and a second write procedure for writing the second data in the cell array, the second write procedure being different from the first write procedure.

According to another aspect of the invention, there is provided a resistance change memory device including:

a cell array, in which memory cells are arranged, the memory cell being reversibly set in one of a first data state and a second data state defined in accordance with the resistance value, the time necessary for writing the first data being twice or more as long as the second data; and a data write mode for writing multi-bit data containing the first data and the second data in the cell array, the data write mode including a first write operation for writing only the first data and a second write operation for writing only the second data, the second write operation being different from the first write operation.

BRIEF DESCRIPTION OF THE DRAWINGS

FIG. 39 shows the write control circuit in the system.

FIG. 40 shows the voltage setting example of the write control circuit.

FIG. 52 shows the procedures of main operation modes.

FIG. 63 shows the example of command codes and address bits.

DETAILED DESCRIPTION OF THE EMBODIMENTS

Figure 1:
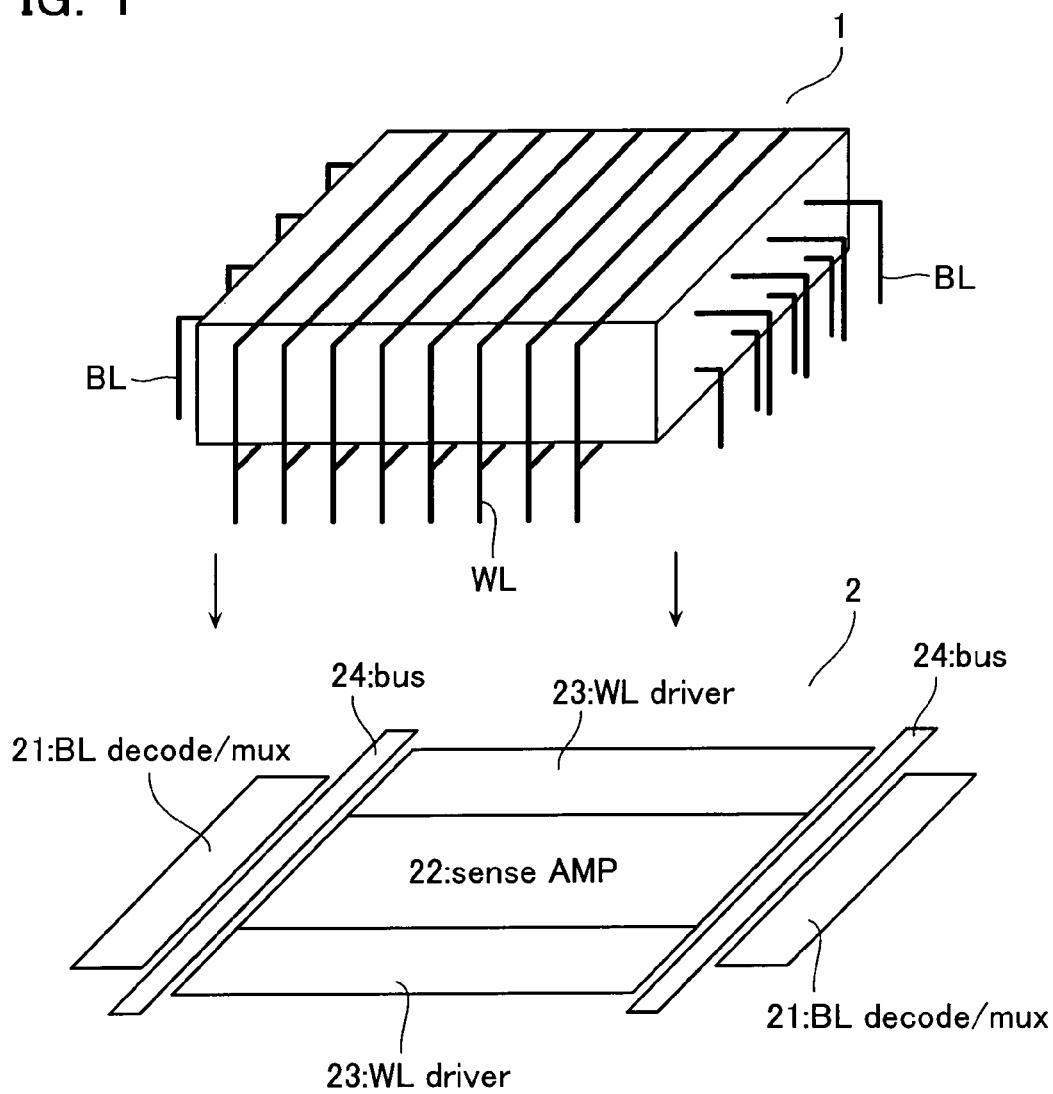
FIG. 1 shows a cell array construction in accordance with an embodiment.

Illustrative embodiments of this invention will be explained with reference to the accompanying drawings below.

To constitute a large capacity of file memory, it is desirable to use an ReRAM with a 3-D cell array structure. ReRAM cells have some features different from the conventional NAND flash memory. Therefore, it is material to set the memory specifications for making use of the features.

In the embodiment described below, as two data states of an ReRAM cell, a high resistance state is defined as a "reset state" while a low resistance state is defined as a "set state". A write operation for changing a cell from the high resistance state to the low resistance state is defined as a "set operation" while another write operation for changing a cell from the low resistance state to the high resistance state is defined as a "reset operation".

It is assumed here that the set operation is a "voltage mode" for applying voltage to the cell while the reset operation is a "current mode" for applying current to the cell, thereby bringing it cell state change with Joule-heat.

Further, to change the cell state in the current mode, it takes at least twice or more (several times to one hundred times in practice) time as long as that in the voltage mode. For example in case of binary data, the high resistance state (i.e., reset state) is defined as data "0"; and the low resistance state (i.e., set state) as data "1".

The memory cell is formed of a variable resistance element for storing the resistance state in a non-volatile manner and a diode connected in series to the variable resistance element for selecting a cell. Since the diode is reverse-biased in an unselected cell, leakage current can not be avoided. Specifically, it becomes a material problem that in case there is a bad cell with a large reverse-bias leakage, the data reliability is reduced.

Although the relationships between the set and reset states, between the high resistance and low resistance states, and between the state-transition times are different in accordance with the cell material, it should be confirmed without regard to the cell material that the transition time in the set operation is largely different from that in the reset operation; and one of the set and reset operations is a voltage mode while the other is a current mode. Therefore, the examined results in the embodiment described below may be easily transformed in accordance with the cell materials.

The features of the memory specifications in the embodiment described below will be summarized as follows:

[First, Simultaneous Multi-Bit Access]

To increase the occupying rate of the memory cells and to reduce the bit cost of the memory device, it is a prerequisite for making the memory device product. For this purpose, it is effective to increase the cell numbers in the cell array. However, if increasing the cell numbers, access-waiting cell numbers increase, and the total waiting leakage also increases.

To achieve a memory device with a power consumption suppressed, it is necessary to consider the bias condition of the waiting cells. In addition, to transfer a number of data in a large scale cell array simultaneously, it becomes necessary to be able to simultaneously access multi bits selected by a select line.

[Second, Complete Separation between Read and Write Modes]

Since the ReRAM is unique in the write operation (set and reset operations), it is necessary to use such a specification that read and write operations are not mixed. In the specification used in the embodiment described below, it is assumed such applications that read and write modes may be completely isolated or separated from each other. Explaining in detail, a read and write mode defined as "WRIM" (Write Read Isolation Mode) will be used.

[Third, "1" only Write Mode]

To achieve a high speed write mode, it is used that the set operation (i.e., "1" write operation) is a voltage mode, in which multi bits may be simultaneously accessed. That is, a "1" only write mode is brought in a write mode for a selected area in the cell array in such a manner that the entire selected area is preliminarily set in a reset state (i.e., "0" write), and then only a set operation (i.e., "1" only write) is performed. In other words, data write is performed basically with two write steps, in which "1" write step and "0" write step are time-isolated from each other.

[Fourth, ECC Refresh]

The data reliability matters in a large capacity of file memory. To assure data, it is utilized a data refresh mode, i.e., ECC refresh mode, in which cell data are refreshed with an on-chip ECC circuit.

As a target market, in which the above-described specifications are adaptable, it may be considered such applications that the direct access scheme is useful for data transfer, and read and write operations may be separated from each other. One of the applications is a game contents-use file memory with a large capacity, in which the read operation needs high-speed data transferring. Another one is a recoding media to be used in a high definition video apparatus, in which data will be directly written from an image-sensing apparatus at high speed. In these applications, it will be obtained effective merits based on the WRIM specification.

The respective specifications will be explained in detail below.

There will be sequentially explained a sense system, with which multi-bit access becomes adaptable; a memory system, in which data transfer methods and high-speed data read methods are considered; another sense system, in which the multi-bit data transfer in case there is a bad cell is considered; and operation modes and specifications, with which the features of WRIM are effectively derived.

A large capacity of ReRAM, in which a variable resistance element is used as an information storing media, is formed as a cross-point cell array and a 3D-cell array. The basic memory structure will be explained initially.

Basic Structure of ReRAM

FIG. 1 shows a 3D-cell array block 1 and read/write control circuit 2 formed on the underlying semiconductor substrate. The cell array block 1 is formed of three-dimensionally stacked and cross-point type of cell arrays. Word lines and bit line used as signal lines in the cell array block are hooked-up via vertical wiring areas arranged on the four sides of the cell array block to the underlying substrate.

Bit lines BL are hooked-up at the both ends of the cell array block 1 in the bit line direction and selected in the bit line decoder/multiplexers 21 in accordance with externally supplied address and command signals, thereby being coupled to the sense amplifier circuit 22. In a read mode, the sense amplifier senses cell current in comparison with reference current. In a write mode, sense amplifier system and decode system applies a suitable write voltage or current to a selected cell.

Word lines WL also are hooked-up at the both ends of the cell array block 1 in the word line direction to be coupled to word line drivers 23, which selectively set word line levels in accordance with externally supplied address and command signals.

As a bus area for reciprocating data between the cell array and the external, there are disposed buses 24 on the gaps formed between the bit line decoder/multiplexers 21 and cell array block 1. Therefore, bit lines BL are passed over the bus areas 24 from the cell array block 1 to the bit line decoder/multiplexers 21. The bit line signals are supplied to the sense amplifier circuit 22 underlying the cell array block 1 though the bus areas 24, and sense-amplified in a read mode and transformed to write voltage or current in a write mode. Data transfer between the sense amplifier circuit 22 and the external is performed via the bus areas 24.

Figure 2:
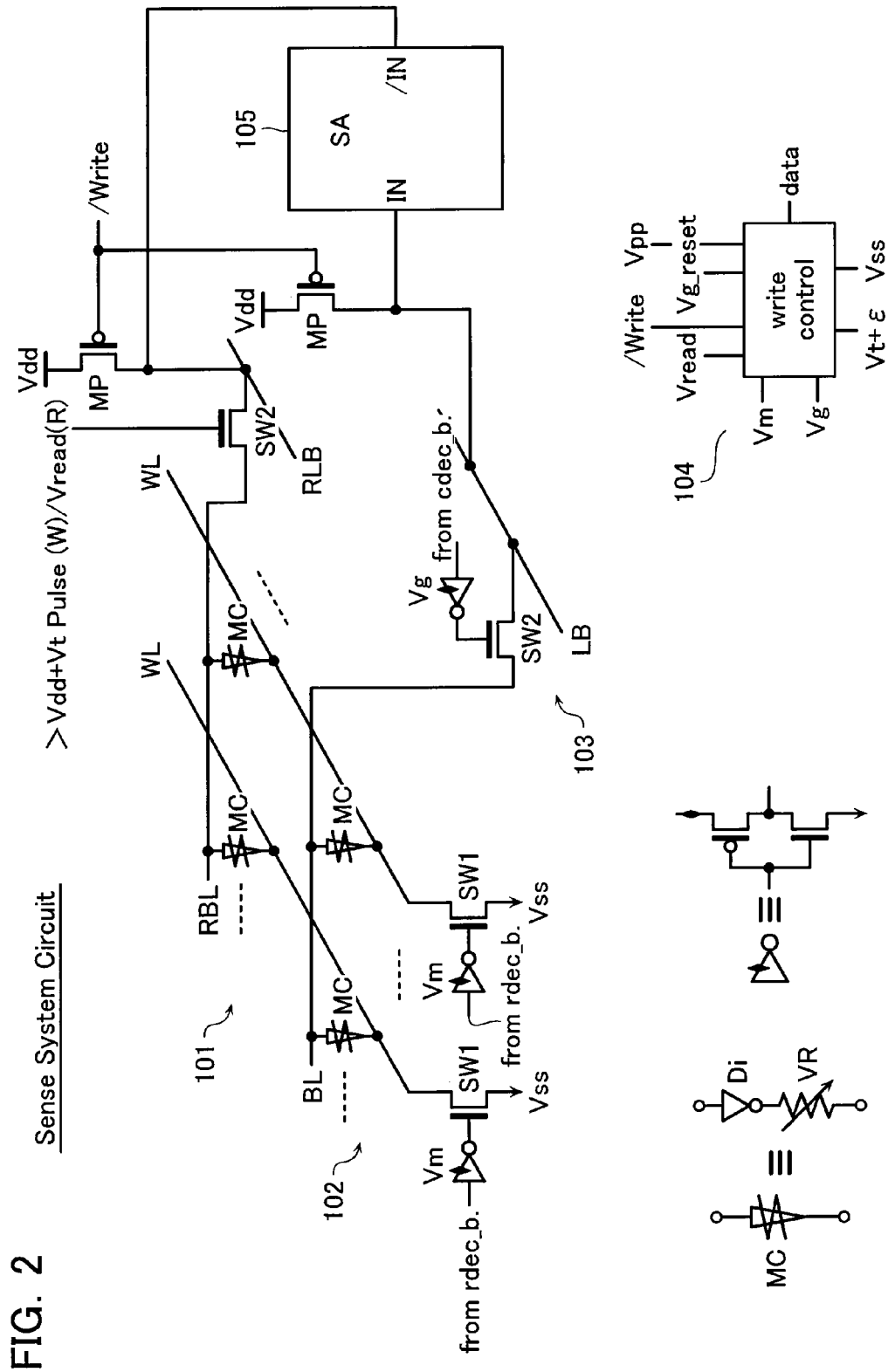
FIG. 2 shows an example of a sense system circuit.

FIG. 2 shows a detailed example of a sense system circuit. Here is shown typical one layer of cell array 101. Arranged in this cell array 101 at the respective cross-points of the bit lines BL and word lines WL are memory cells MC, each of which is formed of variable resistance element VR and diode Di connected in series. Anodes the cell diodes Di are coupled to bit lines BL and reference bit lines RBL.

One reference bit line RBL, which is set at a reference level in a sense mode, is disposed for multiple bit lines BL. The initial state of the memory cell MC is a set state with a low resistance or a forming completion state, which is referred to as data "1" hereinafter. By contrast, a high resistance state of the memory cell MC is referred to as data "0".

Memory cells MC on the bit lines BL are selected by a selected word line WL to be written into the reset states or the set states again from the set states in accordance with information to be stored. Memory cells (reference cells) MC on the reference bit line RBL selected by the same selected word line WL are written into "1" data state in a write mode, i.e., cell data are refreshed. In accordance with this operation, the reference cell on the reference bit lines are stably set at "1" data state for assuring the reference level used in a read mode. This is achieved by applying a boosted pulse of Vdd+Vt or more to the bit line switch (i.e., MOS transistor) SW2 in a write mode (W).

Word line driver 102 has word line switches (NMOS transistors), SW1, which are turned on when selected by row address, and a selected word line is coupled to the ground potential Vss via the selected switch SW1. The switch transistor is to be selected by the "L" level of decoded signal "from rdec_b", and its on-resistance will be controlled by the gate level Vm.

Gate level Vm of the switch SW1 is exchanged in accordance with forming, "1" write, "0" write and read modes. Write control circuit 104 is prepared to exchange the gate level.

Bit line select circuit 103 has select switches (NMOS transistors), SW2, which are turned on when selected by column address, and a selected bit line is coupled to a local bus line LB. This switch transistor is also selected by the "L" level of decoded signal "from cdec_b", and its on-resistance will be controlled by the gate level Vg. The gate level Vg of the switch SW2 is exchanged in accordance with forming, "1" write, "0" write and read modes as similar to the word line switch.

Drivers used for driving NMOS transistors in the switches SW1 and SW2 with Vm and Vg, respectively, are CMOS drivers shown in FIG. 2, and the PMOS transistor used in the CMOS driver is driven by Vm or Vg.

Reference bit line RBL is coupled to reference local bus RLB via selection switch SW2. The gate level of this selection switch is set at a level higher than Vdd+Vt temporally with a pulse in a write mode (W). Vt is a threshold voltage of the NMOS transistor. The gate level is set at Vread in a read mode (R).

Write control circuit 104, which is used for generating the gate levels Vm and Vg in the word line and bit line selection states, will be explained in detail later.

Local bus LB and reference local bus RLB are coupled to inputs of a current-sensing type of sense amplifier SA. PMOS transistor MP is driven by signal "/Write (=L)" to be turned on in a write mode, so that local bus LB and reference local bus RBL are applied with power supply voltage Vdd.

Figure 3:
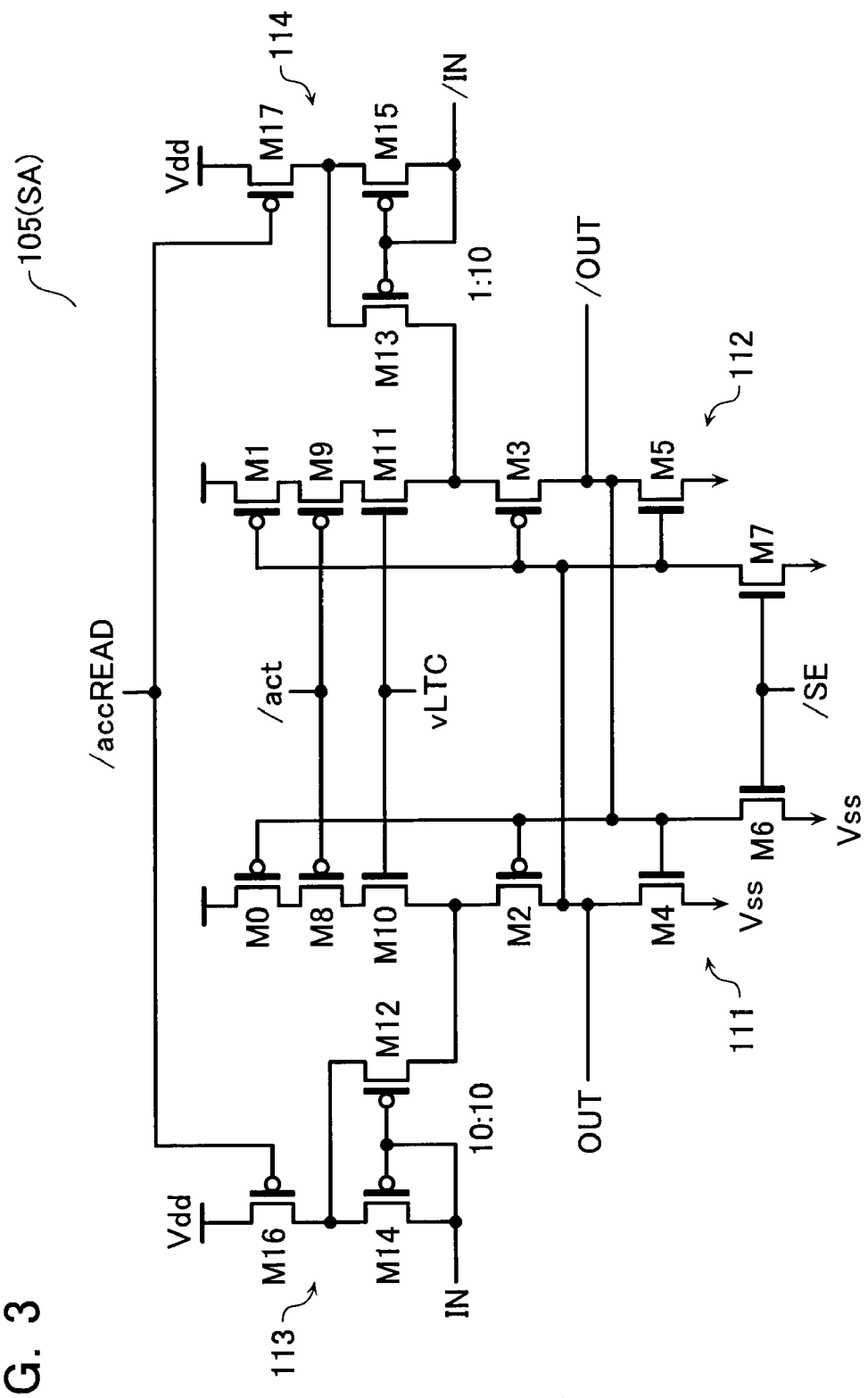
FIG. 3 shows a current comparing type of a sense amplifier.

FIG. 3 shows a current-comparing type of sense amplifier (SA) 105, which is constructed as to sense small cell current such as 100 nA or less at high speed.

In the sense amplifier 105, first current path 113 and second current path 114 are disposed symmetrically. The first current path 113 contains PMOS transistors M0, M8, NMOS transistors M10, PMOS transistor M2 and NMOS transistor M4 connected in series between Vdd and Vss. Similarly, the second current path 114 contains PMOS transistors M1, M9, NMOS transistors M11, PMOS transistor M3 and NMOS transistor M5 connected in series between Vdd and Vss.

Sources of NMOS transistors M2 and M3 are coupled to input nodes IN and /IN via current mirror circuits 113 and 114, respectively. With this mirror circuits 113 and 114, one input current at input node IN (i.e., cell current to be sensed) is supplied to the source of PNOS transistor M2 as it is while the other input current at input node /IN (i.e., reference current) is reduced to be one tenth via mirror circuit 114 and supplied to the source of PMOS transistor M3. This is for setting the reference current supplied to the sense amplifier between "1" data bit line current and "0" data bit line current because the reference cell data is "1" and the reference bit line current is large.

That is, the current mirror 114 disposed on the input node /IN to be coupled to a reference bit line RBL has PMOS transistors M13 and M15, the size ratio of which is set to be 1:10. Therefore, one tenth of the reference cell's current is carried in the sense amplifier as "reference current".

The current mirror 113 disposed on the input node IN side is a dummy circuit for securing a symmetry between the input nodes IN and /IN, and the size ratio of PMOS transistors M12 and M14 is set to be 10:10. Therefore, a selected cell's current carried in the input node IN is carried in the sense amplifier as it is.

These current mirrors 113 and 114 are coupled to the power supply node Vdd via PMOS transistors M16 and M17, respectively, driven by activation signal /accREAD.

The connection node between PMOS transistor M2 and NMOS transistor M4 in the first current path 111 serves as one output node OUT. The connection node between PMOS transistor M3 and NMOS transistor M5 in the second current path 112 serves as the other output node /OUT.

Gates of PMOS transistors M0, M2 and NMOS transistor M4 in the first current path 111 are coupled in common to one output node /OUT; and gates of PMOS transistors M1, M3 and NMOS transistor M5 in the second current path 112 to the other output node OUT. These transistors constitute a CMOS latch. That is, a CMOS inverter constituting the first current path 111 and another CMOS inverter constituting the second current path 112 constitute a latch with such an interconnection that input/output nodes thereof are cross-coupled.

PMOS transistors M8 and M9 are activating-use ones, the gates of which are driven by activation signal "/act". NMOS transistors M10 and M11 serve as current regulating devices in the current paths 111 and 112, respectively, the gates of which are driven by signal "vLTC". The sense amplifier current will be defined by these current regulating devices.

Gates of NMOS transistors M4 and M5 are coupled to Vss via NMOS transistors M6 and M7, respectively, the common gate of which is driven by sense signal "/SE". That is, when /SE="H", these NMOS transistors M6 and M7 are turned on, so that NMOS transistors M4 and M5 in the CMOS latch are kept off.

Currents flowing in the current paths 111 and 112 in accordance with activation signal /act="L" are drawn to Vss via NMOS transistors M6 and M7, respectively, until when "/SE" becomes "L". When cell current and reference current are input, and then "/SE" becomes "L" in a data sense mode, NMOS transistors M6 and M7 are turned off to shut the current paths, and drain voltage difference thereof is subjected to positive feed-back and amplified.

The operation of the sense amplifier SA will be explained in detail with reference to FIG. 4.

While the sense signal "/SE" is "H", NMOS transistors M6 and M7 are kept on, and output nodes OUT and /OUT are kept in a low level ("L") state. When activation signal "/act" becomes "L", current flows in the current paths 111 and 112. When cell current catching signal "/accREAD" becomes "L" and starting current injection for the bit line BL and reference bit line RBL coupled to the input nodes IN and /IN, a small drain voltage difference is generated between the drains of NMOS transistors M6 and M7 in accordance with the difference between a cell current and a reference current (one tenth of the reference cell current). The above-described "difference" between the cell current and the reference current will be simply referred to as a "cell current difference" hereinafter.

After a certain time ΔT while the cell current difference is influenced, sense signal "/SE" becomes "L". In receipt of it, NMOS transistors M6 and M7 are turned off, whereby one of NMOS transistors M4 and M5 is turned on while the other is turned off due to the positive feed back operation of the latch circuit. That is, when NMOS transistors M6 and M7 are turned off, the timing difference based on the cell current difference is transformed to the drain voltage difference, and this is amplified.

Transistors M10 and M11 are suppressed in a low conductance state with gate signal "vLTC" set at low level VRR at the beginning of sensing. Therefore, the sense amplifier current supplied from the power supply node Vdd is squeezed, and the cell current difference supplied via the pair of transistors M12 and M13 will affect strongly the state of the sense amplifier. When the sense amplifier balance is broken and decided due to the cell current difference as a result of the initial sensing, gate signal "vLTC" is boosted to Vpp higher than Vdd from VRR. As a result, the power supply voltage is applied to the sense amplifier, the output of which fully swings to Vdd. At this time, signal "/accREAD" is raised to be "H", the cell current supplied to the sense amplifier is shut off.

Variations of shrunk transistor pairs are generated due to fluctuations of the fabrication processes. Therefore, it is desirable for canceling the variations of the sense amplifier that many transistors are connected in series in the respective current paths 111 and 112 to constitute pairs as shown in FIG. 3. In detail, M0-M1 pair, M8-M9 pair and M10-M11 pair are disposed on the Vdd side of the latch.

Specifically, NMOS transistor pair of M10 and M11 serves for suppressing the variations of PMOS transistor pair of M0 and M1 and PMOS transistor pair of M8 and M9, which serve as the feed back operation of the sense amplifier. That is, as s result of that the conductance of NMOS transistors is suppressed, the drain and source voltages of PMOS transistors disposed on the power supply node are boosted, and the conductance of PMOS transistors is increased. In other words, channel conductances of the PMOS transistor and NMOS transistor function to suppress the influences of variations of the respective transistors.

Time difference ΔT, that is defined as a time length from the falling time of signal "/accREAD" to the falling time of sense start signal "/SE", will be adjusted to start sensing when the input current is set in such a level that the cell current is sufficiently influenced after starting the cell current injection by falling "/accREAD".

Figure 5:
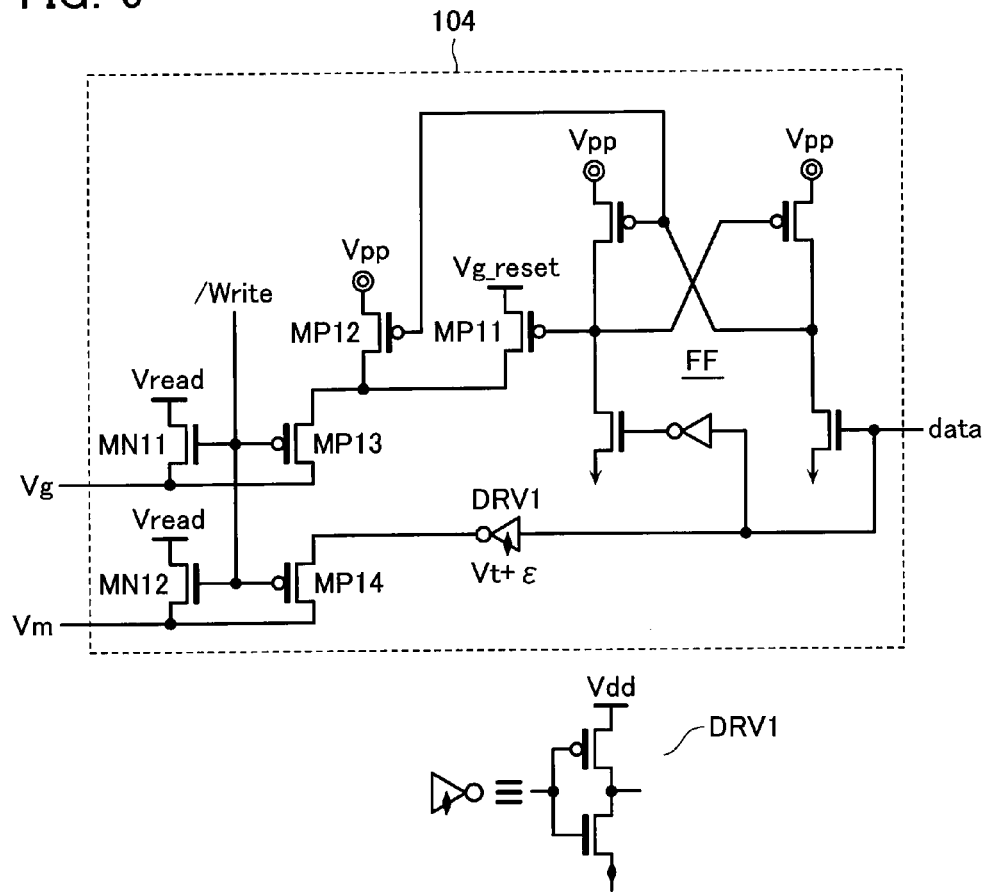
FIG. 5 shows a write control circuit used in the ReRAM.

FIG. 5 shows the configuration of the write control circuit 104. Input signals to be supplied to this circuit are control signal "/Write" and information data "data" to be written into a cell, while output signals are gate levels Vg and Vm, which drive NMOS transistors of word line switch SW1 and bit line switch SW2, respectively. That is, this circuit is for generating the power supply voltages in accordance with the memory operation modes and in accordance with data "data".

There is prepared PMOS flip-flop FF, the state of which is changed in accordance with data "data". PMOS transistors MP11 and MP12 are controlled by the flip-flop FF to output the power supply voltages Vpp and Vg_reset used in the set and reset modes, respectively. These output voltages will be output to "Vg" node via PMOS transistor MP13.

Disposed on "Vm" node side are driver DRV1 for outputting Vdd and Vt+ϵ in the reset mode (data="0") and set modes (data="1"), respectively, and PMOS transistor MP14 for transferring the output voltage. Driver DRV1 is a similar CMOS driver as those used at the gate driver portions of word line switch SW1 and bit line switch SW2.

PMOS transistors MP13 and MP14 are driven by /Write="L" to be turned on in a write mode (i.e., reset or set mode), so that necessary write control voltages Vm and Vg are generated. In a read mode, NMOS transistors MN11 and MN12 are driven by /Write="H" to be turned on, so that read voltage Vread is output to "Vg" node and "Vm" node.

Figures 6, 7:
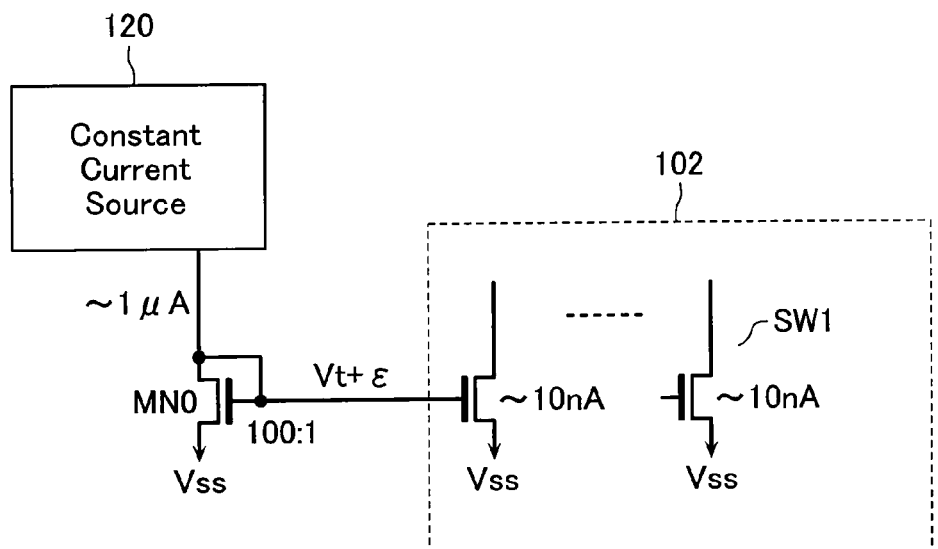
FIG. 6 shows an example of voltages set in the write control circuit.
FIG. 7 shows a gate level generating circuit.

FIG. 6 is a table showing the control voltage levels at Vm and Vg nodes in the respective operation modes. For example, the relationship between the control voltages is set as follows: Vss<Vt+ϵ<Vread<Vg_reset<Vdd<Vpp. Note here that the voltage relationship is not limited to this example. In addition, it is assumed here that word line switch SW1 and bit line switch SW2 each is formed of NMOS transistor.

In a reset mode, selected word line selection switch SW1 is turned on with Vm=Vdd, and the selected word line is set at Vss while selected bit line selection switch SW2 is driven by Vg=Vg_reset, so that necessary reset current is supplied to the selected bit line. In a set mode, selected word line selection switch SW1 is set in a high resistance on-state with Vm=Vt+ϵ, and the selected word line is set at Vss while selected bit line selection switch SW2 is driven by Vpp to be in a low resistance on-state, so that necessary set voltage is applied. In a cell forming mode, which is basically the same as the set mode, Vm=Vt+ϵ and Vg=Vpp are applied.

Explaining in detail, in the state change mode from the reset state to the set state, bit line selection switch SW2 is set in a sufficiently low resistance on-state with high gate voltage Vg while word line selection switch SW1 is set in a low current state in a current saturated region, so that the cell current is clamped to be sufficiently smaller than reset current Ireset.

By contrast, in the state change from the set state to the reset state, word lien selection switch SW1 is driven by boosted gate voltage Vm to be set in a sufficiently low resistance non-saturated region. As a result, the word line level variation is suppressed. On the other hand, bit line selection switch SW2 is driven by lowered gate voltage Vg to be set in a saturated region. As a result, the cell voltage is suppressed to be lower than the set voltage when the selected cell is set in a reset state.

As described above, it becomes possible to stably perform set and reset operations without cell state variations.

What is specifically material with respect to the word line selection switch SW1 is as follows: before forming or in a reset state where extremely small current flows in the high resistance cell, the NMOS transistor driven by Vm appears to be sufficiently conductive to Vss; and in case the selected cell is changed to the set state with large cell current, the NMOS transistor appears to be in a sufficiently high resistance state. In consideration of this, as the gate level Vm, a gate level necessary for carrying 1 μA current (so called "1 μVth") will be used.

The maximum current carried from the cell in a high resistance state is about 10 nA. Therefore, it is necessary to construct a suitable current mirror in consideration of the above-described cell current and the transistor size of the word line switch SW1. In detail, as shown in FIG. 7, a current mirror circuit is constructed by combining the NMOS transistor (channel width "W") in the selection switch SW1 in the word line driver 102 with diode-connected current source NMOS transistor MN0 (channel width "100W"). Constant current source 120 is set to supply about 1 μA to the NMOS transistor MN0, whereby gate level Vt+ϵ is generated.

As a result, the maximum current of the word line switch SW1 becomes one tenth of 1 μA, i.e., 10 nA. Therefore, as described above, when the selected cell is changed to a low resistance state to be able to carry a large cell current, the word line switch SW1 serves as a high resistance device, and it prevents the selected cell from being applied with set current.

In the above described sense system circuit, the simultaneous multi-bit access is not examined. To achieve a high data transfer rate with a large scale cell array, it becomes necessary to be able to simultaneously access multiple bits on a selected word line. It will be explained below the examination result of the multi-bit access.

Simultaneous Multi-bit Write

Figure 8:
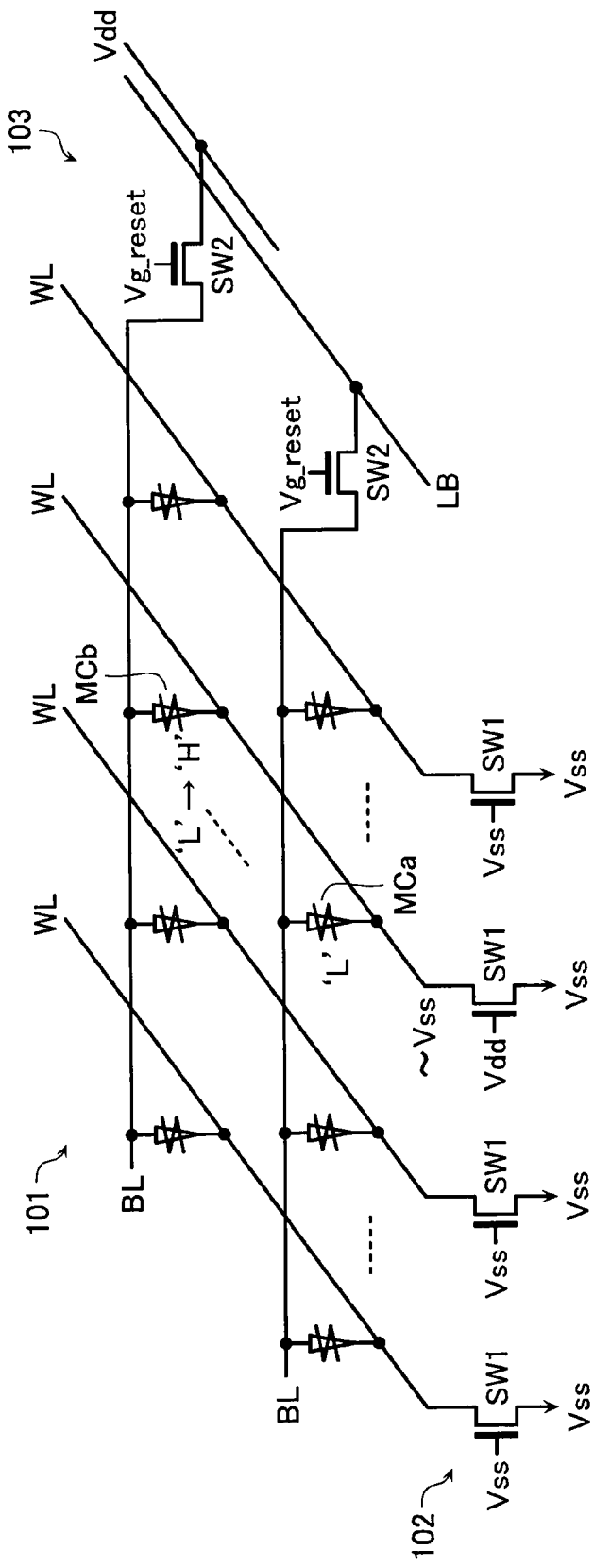
FIG. 8 is diagram for explaining a multi-bit "1" write operation.

FIG. 8 shows an example of multi-bit "0" write, in which "0" data is written into two memory cells MCa and MCb on the different bit lines, simultaneously. This example shows such a situation that one cell MCb is completely reset to a high resistance state "H" from a low resistance state "L". That is, in plural bit line selection switches SW2, gate voltage Vg=Vg_reset is applied to the respective NMOS transistors while one word line is selected, and NMOS transistor in the selected word line switch SW1 is driven by gate voltage Vm=Vdd.

"0" write is a reset operation in accordance with the current mode. Therefore, the number of cells to be simultaneously written is limited under a permissible number, which is defined by the maximum number of low resistance cells at the beginning, i.e., which is defined by the maximum current to be drawn by a selected word line with Vss. So, it is required of the bit lines driven simultaneously by a word line to be sectioned to plural groups, which are sectioned on the condition that the total writing current of simultaneously written cells is limited under a permissible value. These groups are sequentially accessed to be simultaneous written.

If one cell is reset to be "0" data in a group, it becomes highly resistive, and the total cell current of the group, which flows into the selected word line, is reduced. As a result, the remaining cells may be reset without a troublesome problem.

Figure 9:
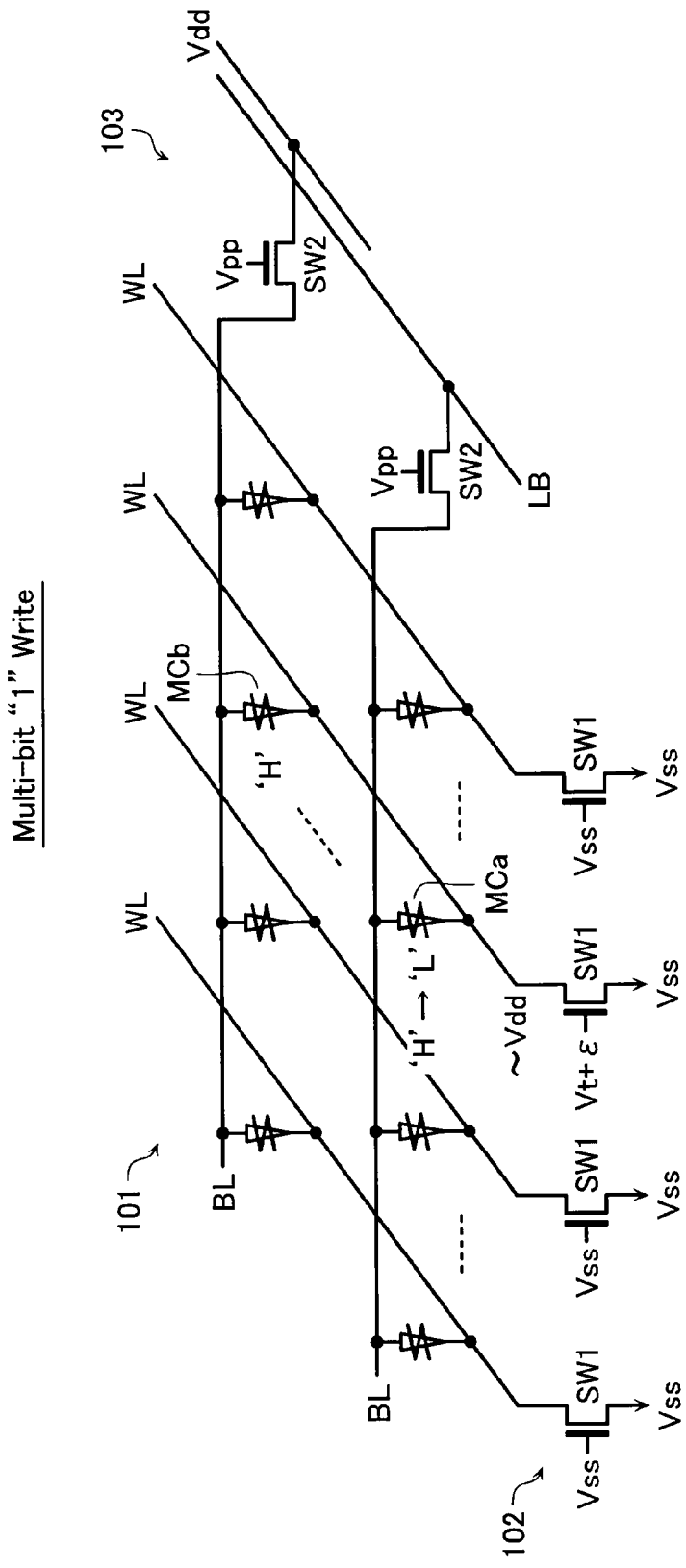
FIG. 9 is diagram for explaining a multi-bit "0" write operation.

FIG. 9 shows an example of multi-bit "1" write, in which "1" data is written into two memory cells MCa and MCb on the different bit lines, simultaneously. This example shows such a situation that one cell MCa is completely set to a low resistance state "L" from a high resistance state "H". That is, in plural bit line selection switches SW2, gate voltage Vg=Vpp is applied to the respective NMOS transistors while one word line is selected, and NMOS transistor in the selected word line switch SW1 is driven by gate voltage Vm=Vt+ϵ.

"1" write is a set operation in accordance with the voltage mode. Therefore, there is little electric limitation for the number of cells to be simultaneously written, and "1" write itself may be expanded to the total cells on a selected word line. However, at least one cell is set in the low resistance state "L" (="1"), cell current flows in the selected word line selection switch SW1, and the selected word line is boosted to Vdd. Therefore, only one within the cells belonging to a selected word line may be written into "1" data state. That is, multi-bit simultaneous write is impossible, and "1" data should be written bit by bit in case of this sense circuit system.

As described above, in the sense system shown in FIG. 2, multi-bit write for cells on a selected word line may be adaptable for only "0" data. In addition, there is such a limitation that the cells on the selected word line need to be classified into plural cell groups, which are sequentially subjected to simultaneous write. Further, since "0" write is reset operation of a current mode, it takes a long time for data writing. These situations make the high-speed write data transfer difficult. Therefore, it is desired to form a new sense system circuit.

Figure 10:
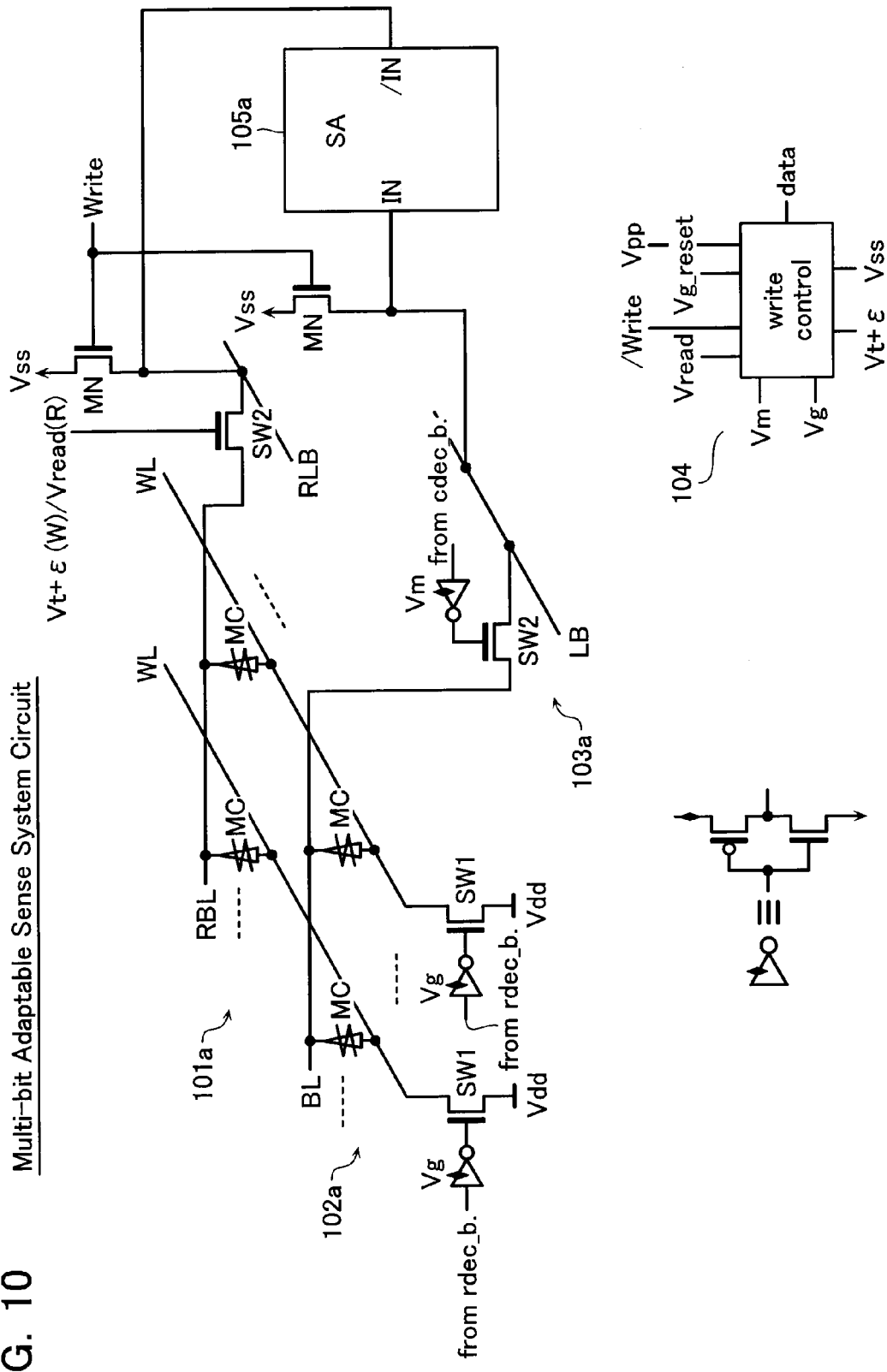
FIG. 10 shows a multi-bit adaptable sense system circuit.

FIG. 10 shows a multi-bit adaptable sense system circuit, in which the direction of memory cell MC is reversed to that in FIG. 2. That is, in the cell array 101a, cathodes of cell diodes are coupled to the bit lines BL. Therefore, the functions of word line selection switch SW1 and bit line selection switch SW2 are reversed to those in FIG. 2, and voltage levels of the word line WL and bit line BL are also exchanged to those in FIG. 2.

One of cells on a bit line BL is selected by a word line WL to be written into a high resistive reset state ("0" data), or a low resistive set state ("1" data) from the reset state. By contrast, in one of cells (reference cells) on the reference bit line RBL, always "1" data is written, i.e., cell data is refreshed, when it is selected by the same word line selected in the above-described cell write mode.

The reference cells on the reference bit line RBL are always set at the "1" data state stably with the above-described refresh operation, so that the reference level to be used in a data read mode will be assured. This becomes possible to apply gate level Vt+ϵ to the selection switch SW2 of the reference bit line RBL at the same time as a bit line BL is selected in a cell write mode (W) as shown in FIG. 10.

Word line WL will be selected in such a manner that a selected word line is coupled to power supply voltage Vdd when a selection switch SW1 (NMOS transistor) is turned on with word line driver 102a. That is, switch SW1 is selected by decoded signal "from rdec_b"(="L"), and the on-resistance is controlled by the gate level Vg. This gate level will be exchanged in accordance with operation modes (i.e., forming, "1" write, "0" write and read operations).

Bit line BL will be selected in such a manner that a selected bit line is coupled to local bus LB when a selection switch SW2 (NMOS transistor) is turned on with bit line selection circuit 103a. That is, switch SW2 is selected by decoded signal "from cdec_b"(="L"), and the on-resistance is controlled by the gate level Vm. This gate level will be exchanged in accordance with operation modes (i.e., forming, "1" write, "0" write and read operations).

To couple reference bit line RBL to reference local bus RLB, the gate level of switch SW2 is set at Vt+ϵ (in a write mode (W)) or Vread (in a read mode (R)) as shown in FIG. 10.

Write control circuit 104, which is used for generating the above-described gate levels Vg and Vm, is the same as in the above-described sense system circuit.

Local bus LB and reference local bus RLB are coupled to the respective input nodes of the sense amplifier (SA) 105a. Local bus LB and reference local bus RLB are coupled to low level power supply voltage Vss via NMOS transistors driven by write control signal "Write" (="H") in a write mode.

Figure 11:
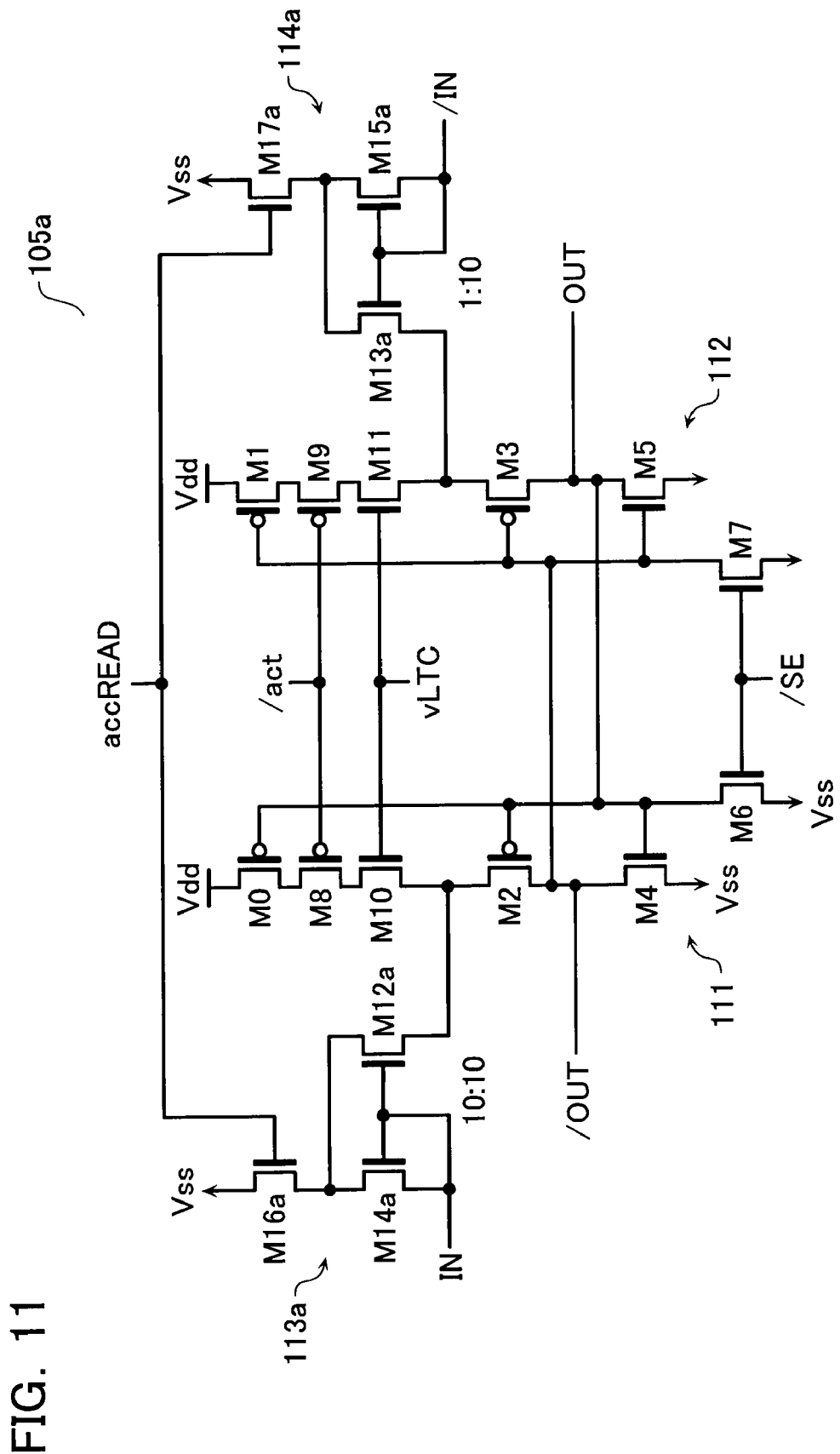
FIG. 11 shows the sense amplifier used in FIG. 10.

Sense amplifier (SA) 105a is of a current sensing type, which is possible to detect small current at high speed. As shown in FIG. 11, the construction of this sense amplifier 105a is slightly different from the above-described sense amplifier 105 because the current direction is different from that of above-described sense amplifier 105.

There are prepared current mirror circuits 113a and 114a at the input nodes IN and /IN of the sense amplifier SA, with which input current on one input node /IN is set to be one tenth of that on the other input node IN. Since the direction of input and output current is reversed to that in the above-described sense system, mirror circuit 113a and 114a are formed as NMOS current mirrors with NMOS transistor pairs (M12a, M14a) and (M13a, M15a).

Reference cells on the reference bit line RBL are set at "1" data. When read signal "accREAD" becomes "H" in a read mode, current mirror circuits 113a and 114a are activated, and the reference current of one tenth of the reference cell's current flows out from the sense amplifier SA via current mirror 114a. With this current mirror 114a, there will be generated the reference current amount less than "1" cell current and greater than "0" cell current.

The basic operation of the sense amplifier SA is as follows: when signal "/act" is lowered in the state of /SE="H", the transistor pair of M8 and M9 are turned on and current starts to flow in the sense amplifier SA; then current mirror circuits 113a and 114a are activated with "accREAD" (="H") to draw out cell current of the selected cell on the bit line BL (input node IN side) and reference current (i.e., one tenth of the reference cell's current on the reference bit line RBL) from the current paths 111 and 112 of sense amplifier SA, respectively; and drain voltage difference between paired transistors M6 and M7 is generated based on the current difference between the cell current and reference current, and it is amplified together with the transistor's state change from a linear region to a saturation region to be latched.

The remaining internal operations are the same as in the above-described sense amplifier SA.

As a result of the initial sensing of the sense amplifier SA, the balance of it is broken based on the cell current difference. After the balance is changed decisively, gate signal "vLTC" is set at VPP higher than Vdd from VRR. As a result, the sense amplifier SA is applied with the power supply voltage Vdd, and the sense amp output is fully swung to Vdd. At this time, signal "accREAD" is stepped down, whereby the cell current supplied to the sense amplifier SA is shut off. The relationship between outputs OUT and /OUT is reversed to that in the above-described sense amplifier because the direction of the cell current to be detected is reversed to that in the above-described sense amplifier.

Figure 4:
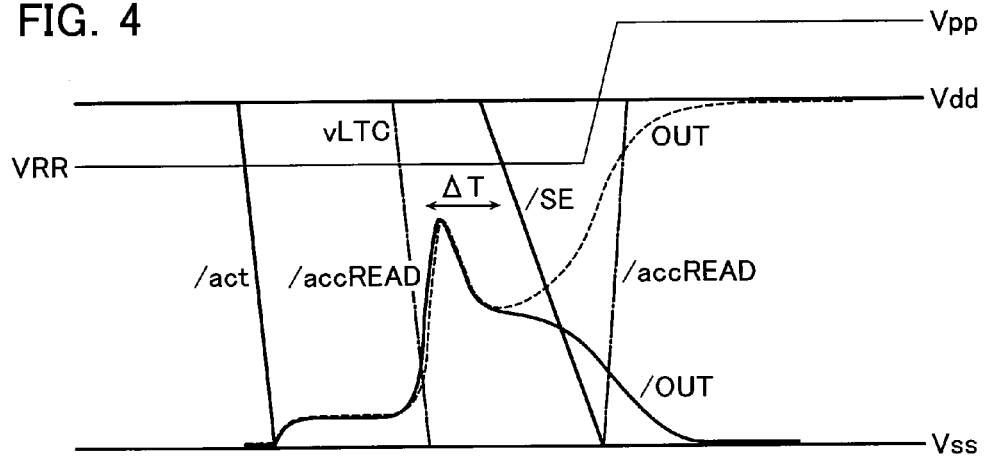
FIG. 4 shows operation waveforms of the sense amplifier.
Figure 12:
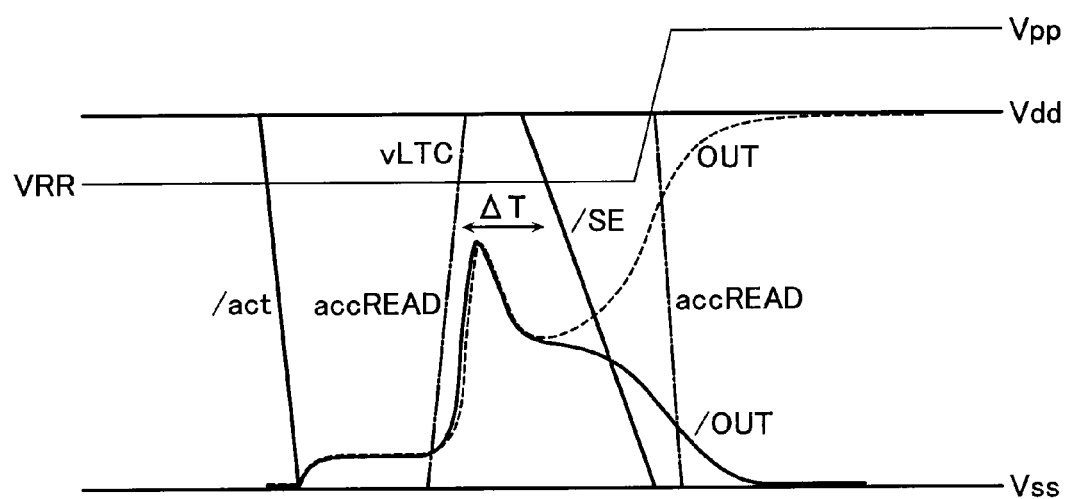
FIG. 12 shows the operation waveforms of the sense amplifier.

FIG. 12 shows the control signals and node voltages in contrast to those shown in FIG. 4. The time difference ΔT between the rising time of signal "accREAD" and the falling time of the signal "/SE" is set for adjusting timing in such a manner as to start the sense operation when the cell current becomes to be sufficiently influenced after starting the cell current drawing by raising "accREAD".

Multi-bit Access Adaptable Sense System Circuit (1)

Figure 13:
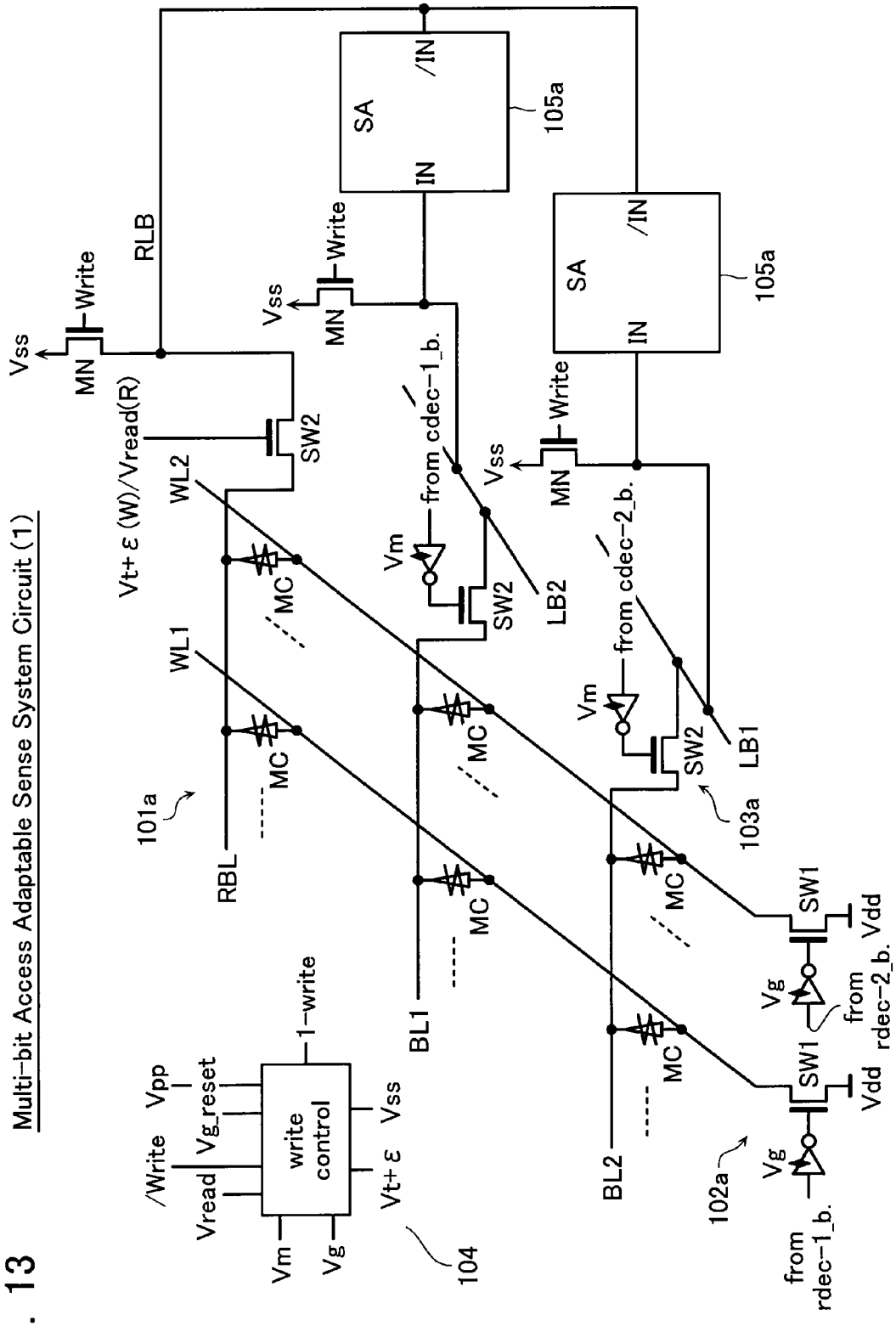
FIG. 13 shows a multi-bit adaptable sense system circuit (1).

FIG. 13 shows a first sense system circuit example with multiple bit lines simultaneously accessed, in which the circuit scheme shown in FIG. 10 is adapted. In FIG. 13, there are shown two bit lines BL1 and BL2 as simultaneously accessed bit lines, which are coupled to individual sense amplifiers 105a via the local buses LB1 and LB2, respectively.

These bit lines BL1 and BL2 are selected simultaneously with the reference bit line RBL. It has already been explained above that reference bit line RBL is always written with "1" data. It is impossible to write "1" and "0" data into cells simultaneously, which are driven by a selected word line, on the different bit lines because the word line selection switch should be set on different bias conditions in accordance with data.

Therefore, data write should be performed with two steps as follows: "1" data write is performed for all cells (including reference cells) on a selected word line in accordance with a voltage mode, in which simultaneous multi-bit write is adaptable; and "0" data write is performed for cells to be written in a "0" data state on the selected word line in accordance with a current mode in such a way as to sequentially write the "0" data state in multiple cell groups. Here, the cell groups are sectioned in a selected area on the condition that the total cell current of simultaneously written cells is limited under a permissible value.

Explaining in detail, initially, word line WL1 is selected when signal "from rdec-1_b" becomes "L". Bit line switches SW2 are selected by Vt+ϵ, "from cdec-1_b" (="H") and "from cdec-2_b" (="H") for reference bit line RBL, bit lines BL1 and BL2, respectively. If Write data signal "1-Write" is "H", write control circuit 104 outputs "1" write-use gate voltages Vg and Vm to control switches SW1 and SW2, whereby data "1" is written in two cells.

Next, signal "1-Write" becomes "L", and "0" write use-gate voltages Vm and Vg are output. At this time, selection switch SW2 of the reference bit line RBL is off. With respect to bit lines BL1 and BL2, if these bit lines belong to one group to be simultaneously "0" written, both of the selection switches SW2 are turned on, whereby two cells on the bit lines BL1 and BL2 are simultaneously written into a "0" data state. If these bit lines BL1 and BL2 belong to different groups, the two cells will be sequentially written into the "0" data state with a delay time. During this write operation, local buses LB are coupled to Vss by signal "Write" (="H"), and sense amplifiers are kept inactive.

In a read mode, all bit lines BL1 and BL2 are selected simultaneously together with reference bit line RBL, and coupled to the respective sense amplifiers 105.

As described above, data write is performed with two steps of initial "1" write and the following "0" write for the remaining cells.

Figure 14:
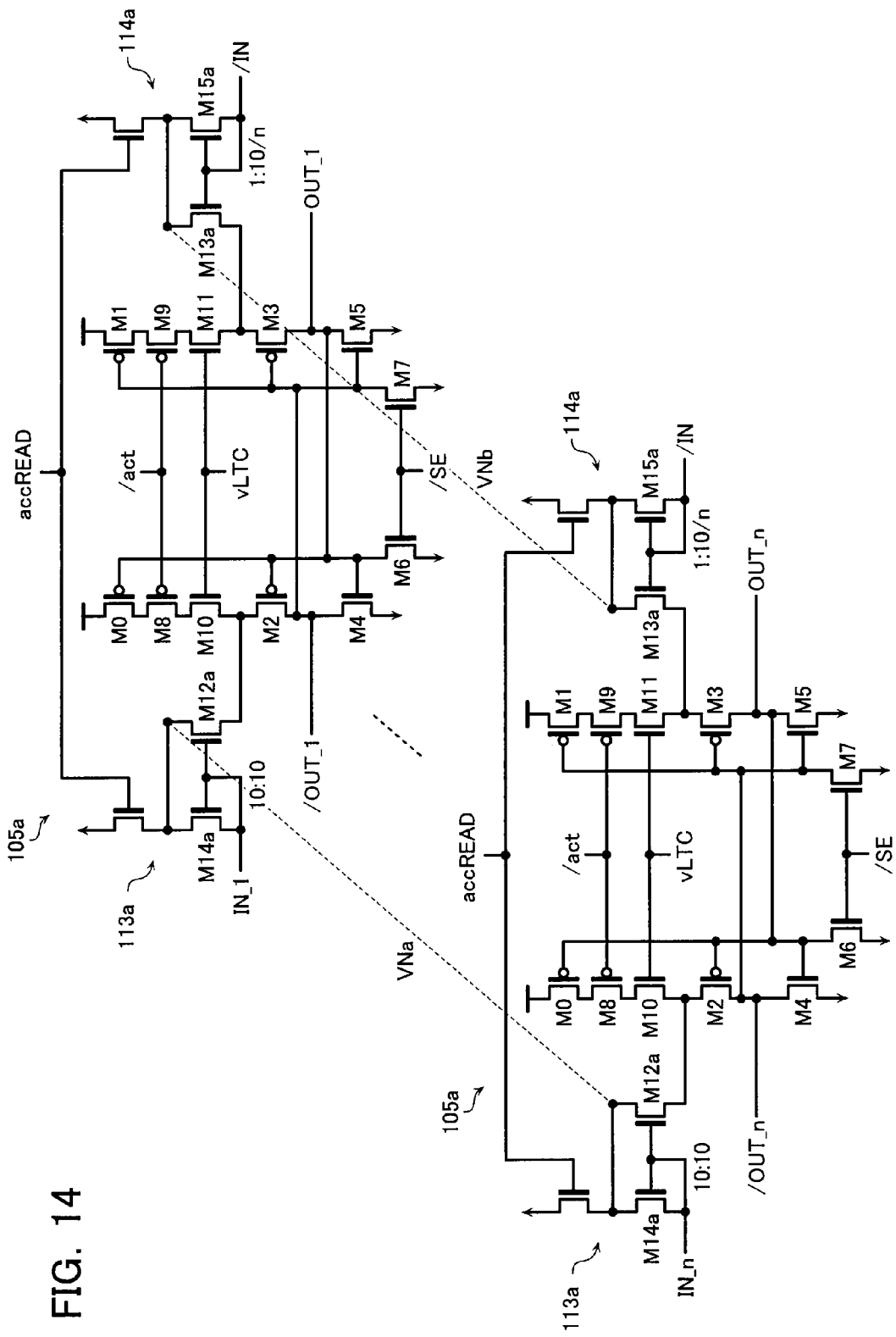
FIG. 14 shows the configuration example of the sense amplifier circuit.

FIG. 14 shows a configuration example of the sense amplifier circuit adapted to the above-described simultaneous multi-access. Plural sense amplifiers 105a with the same number as simultaneously accessed bit lines are activated simultaneously. Assuming that the number of simultaneously selected cells is "n", one input nodes /IN of n-sense amplifiers 105 are coupled in common to a reference bit line RBL. If simultaneously accessed bit lines are dispersed in the cell array to have different circumstances, bit lines with about the same circumstances as each other will be collected to be shared by a reference bit line. The other input nodes IN serve as individual input nodes IN_1 to IN_n corresponding to the respective bit lines BL.

Current mirror circuits 113a and 114a disposed at the input portions of the respective sense amplifiers have common nodes VNa and VNb. With respect to the mirror circuits 114a on the reference bit line RGL, the transistor size ratio is set at 1:10/n for each sense amplifier so that the ratio of the collected reference bit line current to the bit line current becomes 1:10.

Next, it will be explained a bit line decoder for controlling the selection switches SW2 in the bit line selection circuit 103a, which is adaptable to the above-described two step data write scheme.

In the example explained above, all selected cells simultaneously accessed are written in the "1" data state at the first step in two write steps. However, the first step may be changed into a selective "1" write scheme, in which "1" data is written only for cells to be written into "1" data state.

Figure 15:
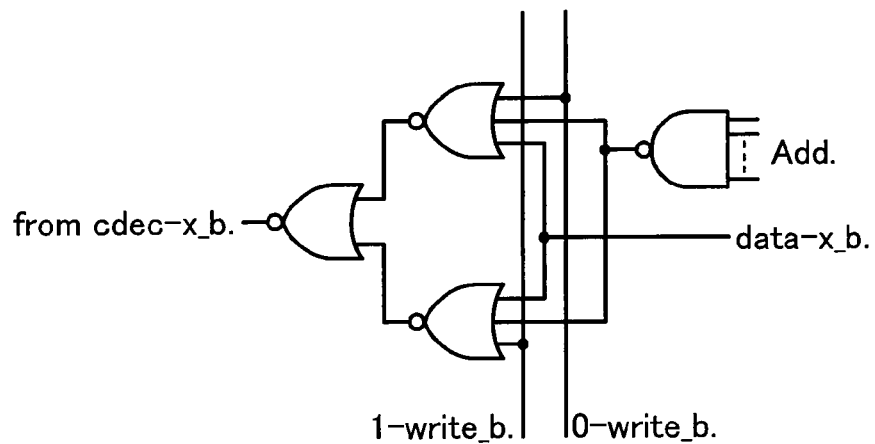
FIG. 15 shows bit line decoder 130 used in case of "1" and "0" individual write.

FIG. 15 shows bit line decoder 130 used in the case where the selective "1" write scheme described above is adapted. That is, this decoder circuit is used in case of "1" and "0" individual write. For example, assuming that signals "1-write_b" and "0-write_b" are ones raised at the first step and the second step, respectively, and "data-x_b" is inverted data to be written, selection signal "from cdec-x_b" of the bit line selection switch selected by address "Add." is lowered at the respective steps in accordance with write data. Here, "x" is the corresponding bit line address.

In this decoder, there are used many logic gates because it is in need of distinguish between "1" and "0" write data.

Figure 16:
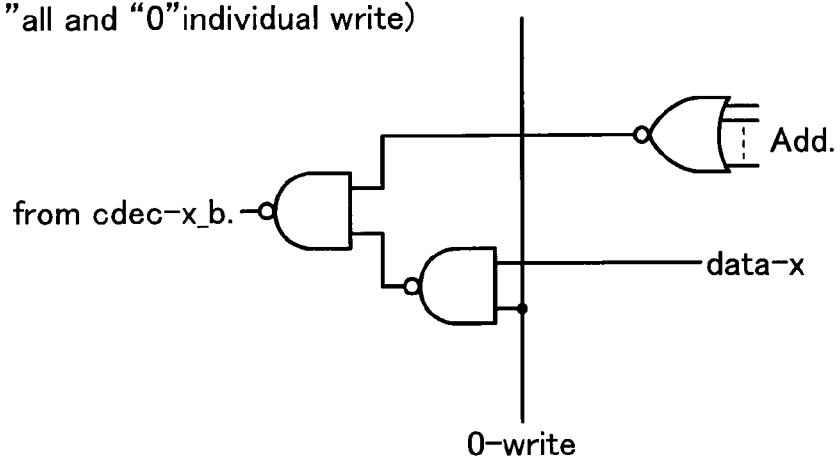
FIG. 16 shows another bit line decoder 130a used in case of "1" all and "0" individual write.

By contrast, FIG. 16 shows another bit line decoder 130a used in the case where all selected cells driven by a word line on the entire bit lines are written in the "1" data state in the first step. That is, this decoder is used in case of "1" all and "0" individual write (i.e., "1" is written for all cells while "0" is individually written). In the first step, data "1" is written into all cells on the entire bit lines. Therefore, in the first step with signal "0-write" set "L", bit line switches selected by address "Add." are selected by signal "from cdec-x_b" (="L") without regard to data. In the second step, only bit line switches in which "data-x" is "0" are selected.

Comparing FIG. 15 with FIG. 16, it will be understood that although the "1" all and "0" individual write scheme appears to be wasteful, it is desirable for lessening the decoder circuit scale. In addition, in this write scheme, since all cells are set in the set state once, it will be expected to obtain the same effect as the forming process for activating the cell state, and stabilize the cell operation.

Next, it will be explained a method of constructing a large capacity memory device with the multi-bit access scheme.

Large Capacity Memory Device

Figure 17:
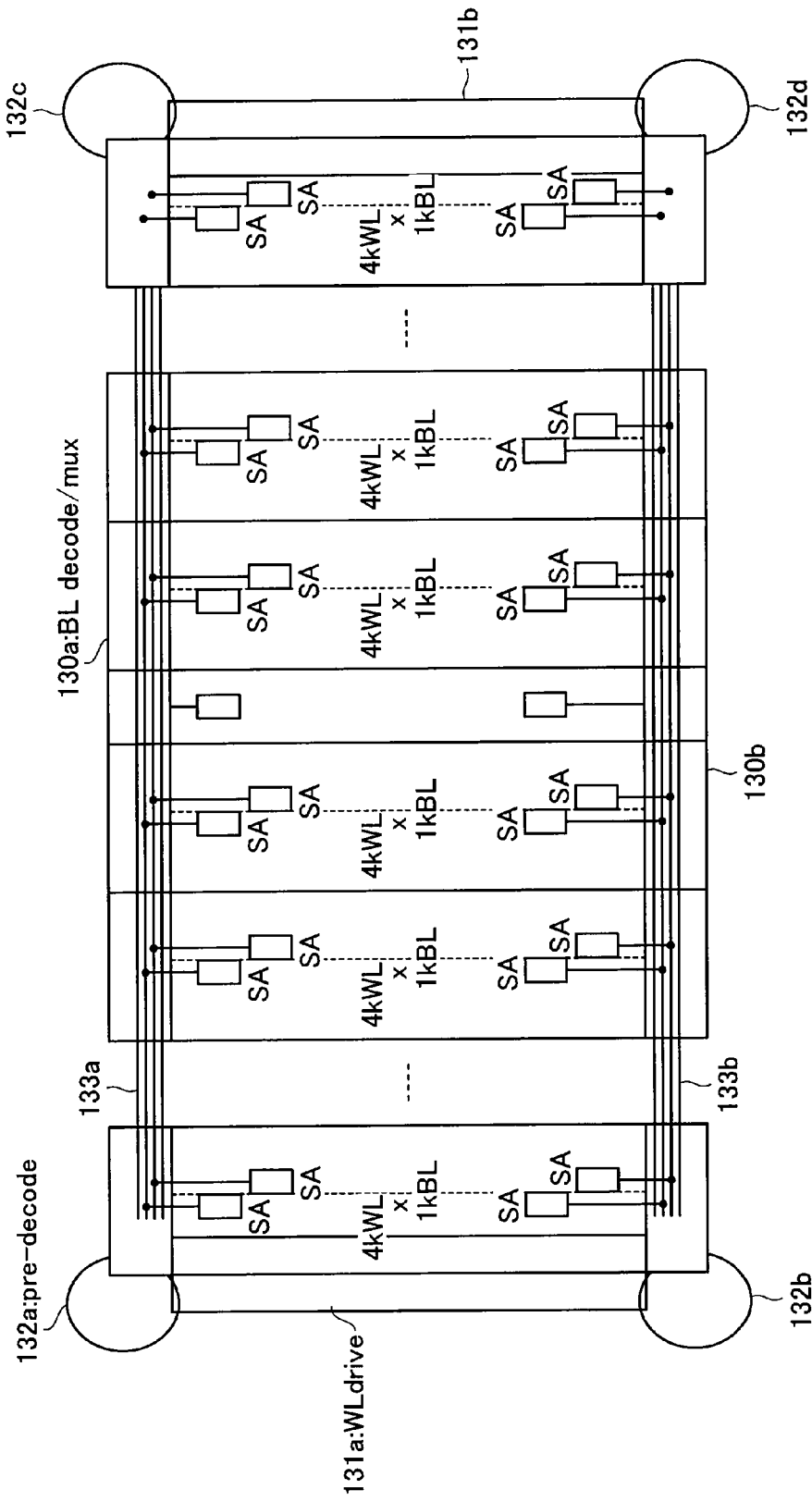
FIG. 17 is an equivalent circuit including a cell array block/mat and underlying control circuit.

FIG. 17 shows the relationship between sense amps and buses under a cell array block/mat, which is formed of 11.5 array units each having 4 k word lines (WL) and 1 k bit lines (BL). That is, this is an example of the basic cell array block with 46 Mb(=4 kWL×11.5 kBL)/mat.

46 sense amplifiers SA are disposed for the cell array block. That is, there are arranged 23 sense amplifiers along each side, to which bit lines hooked-up from the both ends of each mat are coupled. If one word line is selected by word line drivers 131a or 131b, 23+23 bit lines are selected from the both sides, and 46 cells are accessed.

There are arranged address lines used for selecting word lines and bit lines and data lines in buses 133a and 133b. Disposed at the cross areas of bit line decoders/multiplexers 130a, 130b and word line drivers 131a, 131b are pre-decoders 132a-132d for selectively driving the word line drivers.

Figure 18:
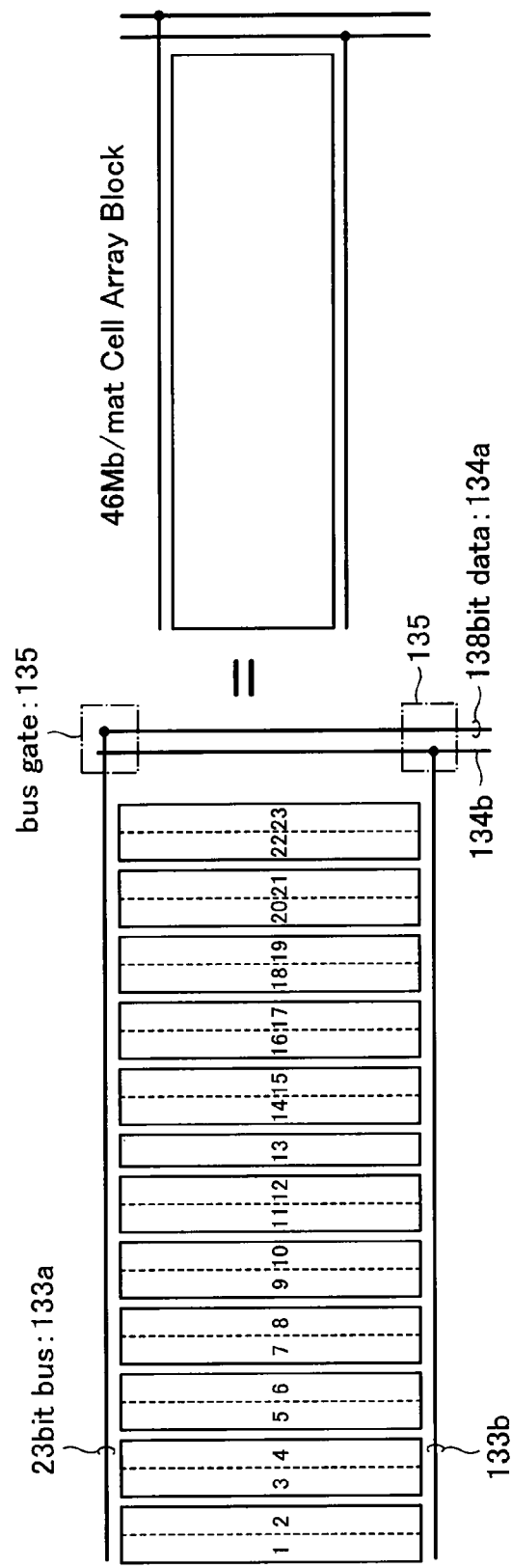
FIG. 18 shows data buses and the cell array groups defined in the cell array block.

FIG. 18 shows data buses and the cell array groups defined in a cell array block CAB and the symbol of the cell array block CAB. Buses 133a and 133b disposed to cross the bit line decoders/multiplexers in each cell array block are 23-bit ones, respectively. In addition, two buses 134a and 134b each being 138-bit buses are disposed at one vertical side of the cell array block, to which buses 133a and 133b are selectively coupled via bus gates 135.

It is desirable that 46 cells are simultaneously accessed in every case when one word line WL is selected in a cell array block. However, in a current mode write, cell current is concentrated to one word line. Therefore, in order to disperse the cell current, simultaneously accessed cells are classified into plural groups, which are sequentially written. In detail, 46 cells are sectioned to some groups to be sequentially written in a reset mode (i.e., "0" write mode).

FIG. 18 shows an example of the grouping situation and the access order in a cell array block CAB. In this example, the cell array block/mat CAB is sectioned to 23 groups. For example, the group numbers 1 to 23 designate the access order. The group selection may be performed with a shift register.

In a data "1" write mode (i.e. set mode) of a voltage mode and a read mode with small current carried, all groups are simultaneously accessed.

As shown by dotted lines in FIGS. 17 and 18, reference bit lines each are disposed for every 1 kBL, so that a reference bit line and a bit line with about the same circumstances are selected to be a bit line pair, and common disturb components thereof will be cancelled.

Figure 19:
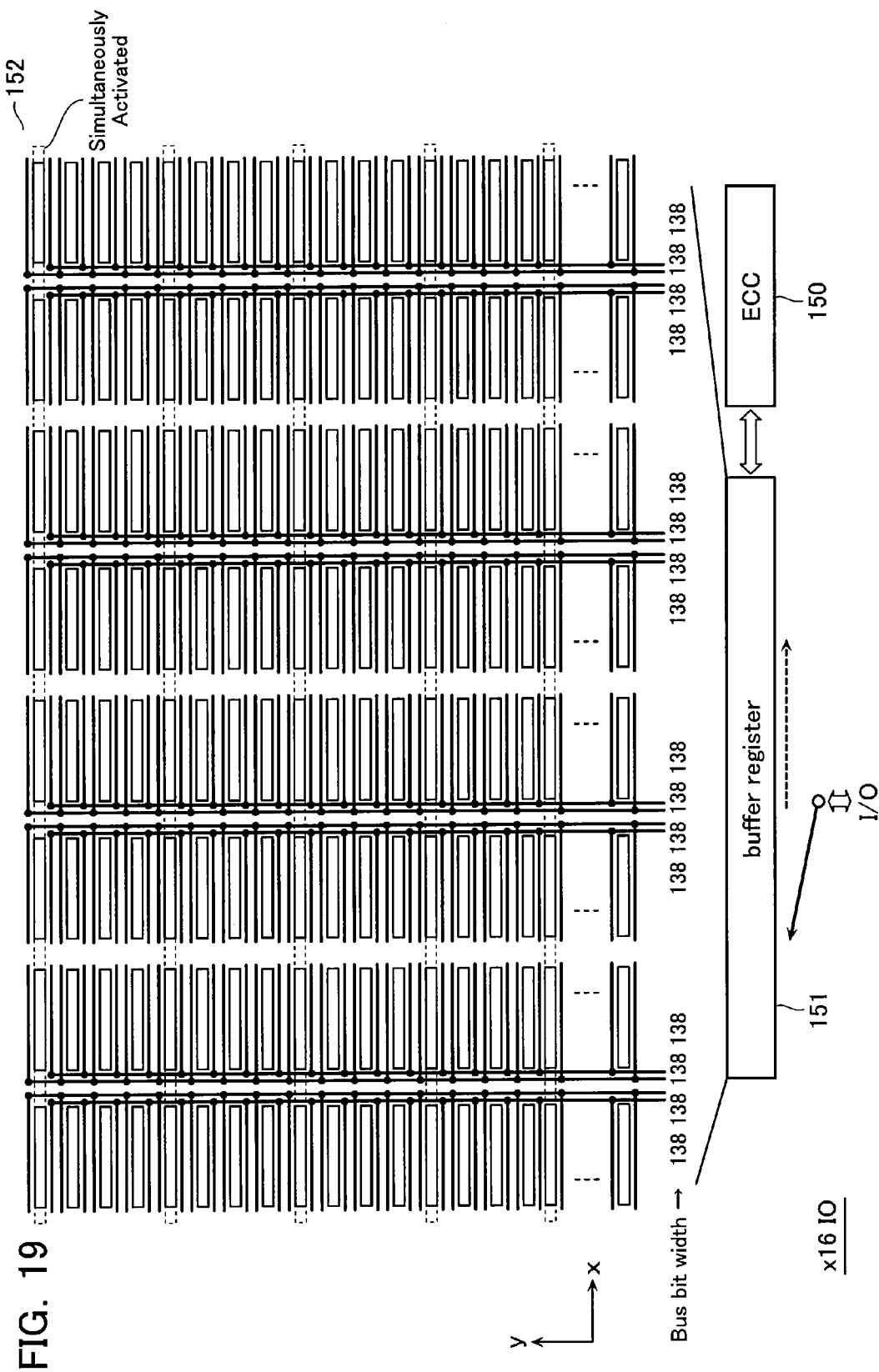
FIG. 19 shows the relationship between cell array blocks and data buses in a practical ReRAM chip.

FIG. 19 shows the relationship between cell array blocks and data buses in a practical ReRAM chip. There is shown (8 Gb+832 Mb)×m bit memory core 152, in which cell array blocks CAB each of 46 Mb/mat are arranged in a matrix manner. This example is of ×16IO type, in which 16 bit data are read and written in parallel.

Explaining in detail, 8 cell array blocks are arranged in "x" direction; and 24 cell array blocks in "y" direction, whereby one mat capacity of the memory core 152 becomes 8 Gb+832 Mb, and the total capacity becomes (8Gb+832Mb)×m.

In this example, one layer in the entire mats is selected, and a quarter therein is activated simultaneously. That is, as the simultaneously activated regions each are shown by dotted lines, the array regions are selected as equally as possible.

This memory system has ECC circuit 150, which is able to detect and correct up to 4 bit errors. This ECC circuit 150 will be explained in detail later. 832 Mb cell portions in every cell array mat are disposed for storing check bits generated in the ECC circuit 150.

Data read from the cell array at a time are 128 bit×16+40 bit×4, which are transferred via 138 bit buses from every cell array block. 128 bit data are reciprocated between every IO node and the memory core. This 128 bit data serve as a burst data unit.

Prepared for temporally storing read and write burst data is buffer register 151, which includes 138 bits for each IO. The buffer register includes 40 bits for every 512 bits for serving as ECC check bits.

Between buffer register 151 and ECC circuit 150, data encoding (i.e., check bit generating in a write mode) and data decoding (i.e., error-detecting and correcting in a read mode) are performed. ECC processed data are over-written in the buffer register 151 and transferred to the external or the cell array.

As described later, two systems of buffer registers are disposed in practice, which are interleaved with each other. As a result, it becomes possible to perform gapless read and write data transferring. The data transfer rate is 133 Mbps per 10 with data cycle of 7.5 ns. Therefore, as the memory chip, it will be obtained data transfer rate of 266 MByte/s.

Next, data transfer between the buffer register 151 and the memory cell array and the external will be explained in detail below. In the following explanation, data transfer between the memory cell array and the buffer register is referred to as "internal data transfer" or "internal transfer" simply; and the data transfer between the buffer register and the external as "external data transfer" or "external transfer" simply.

Write Data Transfer

Figure 20:
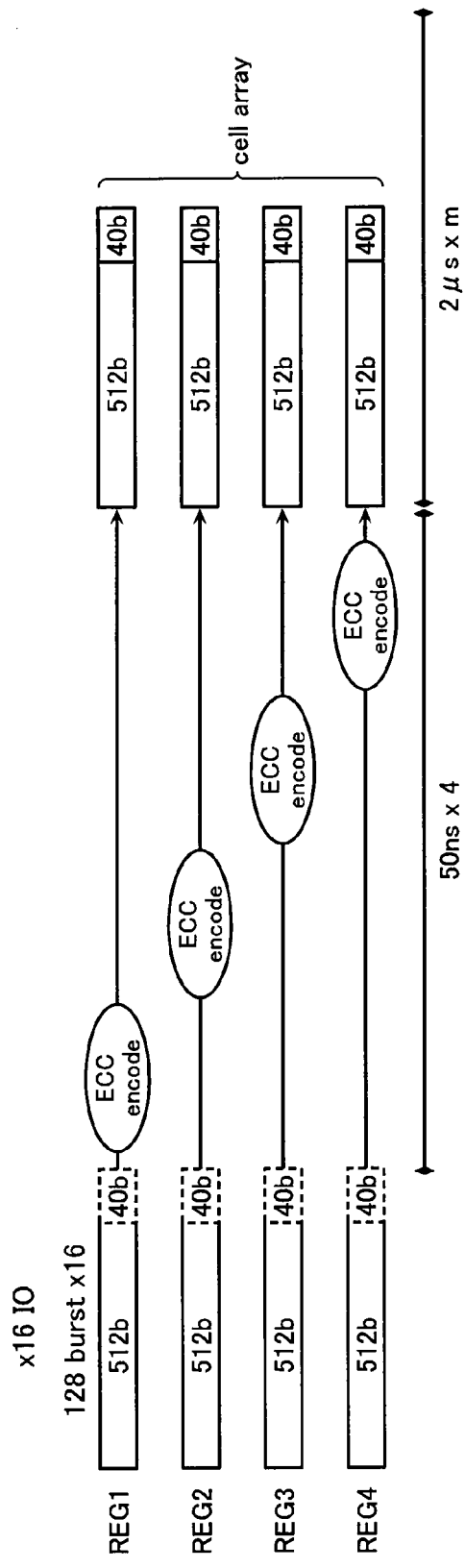
FIG. 20 shows an example of write data transfer.

Firstly, write data transfer will be explained with reference to FIG. 20.

In case of ×16IO and burst data per IO is of 128 bit, it is in need of preparing 2048 bit buffer register for storing write data. In detail, to store 2048 bit write data and ECC check bits of 40 bit×4, four buffer registers REG1 to REG4 each of 512 bit+40 bit are disposed.

2048 bit write data stored in these registers are encoded with the ECC circuit, and over-written in the same registers together with generated check bits. That is, The ECC encode process is performed for every 512 bit as four times time-divisional processes. Each encode time is about 50 ns, and it takes 50 ns×4=200 ns for encoding all write data.

The ECC data code over-written in the registers REG1-REG4 is transferred to the memory cell array. In case of reset write (i.e., "0" write) with a current mode, it takes 2 μs to transfer a data unit. If write data cell area is sectioned to "m" groups, it is in need of transferring data "m" times, and it takes 2 μs×m to transfer the entire data.

Figure 21:
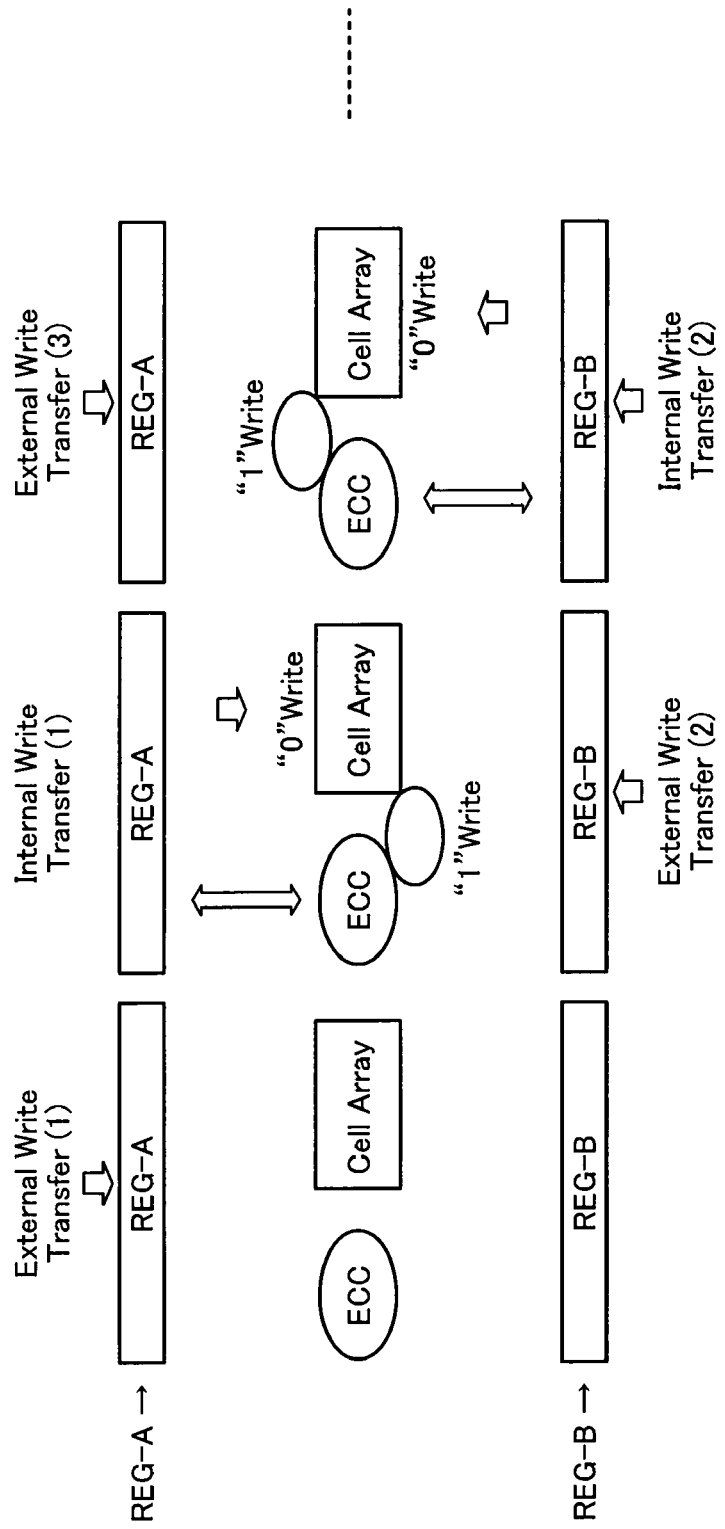
FIG. 21 shows an interleaved write burst transfer operation with two systems of buffer registers.

FIG. 21 is a diagram for explaining an interleave operation of write burst transfer with two systems of buffer registers REG-A and REG-B. Firstly, external write transfer (1) is performed for buffer register REG-A. Following it, write data in the buffer register REG-A is subjected to internal write transfer (1). In this internal write transfer (1), two-step write is performed as follows: ECC encode process for the write data and "1" write into the burst address of the cell array are performed in parallel (first write step). After the decoded data and check bit data are over-written in the buffer register REG-A, "0" data in the over-written data and check bit data in the buffer register REG-A are written into the cell array (second write step).

During the internal write transfer (1), next write data are transferred to the buffer register REG-B (i.e., external write transfer (2)). Data in the buffer register REG-B is subjected to the following internal write transfer (2) like the internal write transfer (1), and during this internal write transfer (2), next write data are transferred to the buffer register REG-A (i.e., external write transfer (3)). The same operation will be repeated as described above.

In the example shown in FIG. 21, the first step "1" write is performed for burst address cells in a lump during ECC process, and then the second step "0" write is performed. However, in case it is able to write "1" and "0" simultaneously, the first step "1" write need not to be performed.

Which method is to be used depends on the sense system circuit.

Read Data Transfer

Figure 22:
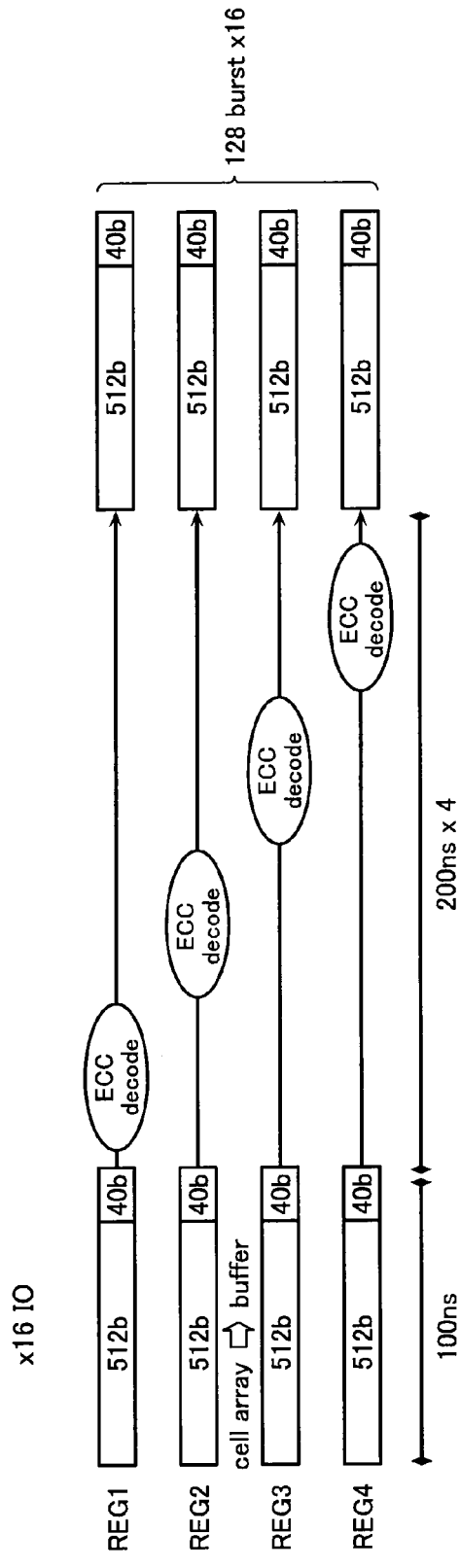
FIG. 22 shows an example of read data transfer.

Next, read data transfer will be explained in reference to FIG. 22. In case of ×16IO, for 128 bit burst transfer per IO, there are prepared four buffer registers REG1-REG4 each having 512 bit+40 bit. Read data from the memory cell array are ECC processed, and decoded data of (512 bit+40 bit)×4 are transferred to and over-written in the buffer registers REG1-REG4. It takes about 200 ns to decode 512 bit data. Since four ECC processes are repeated, the total decoding time is about 800 ns.

Finally stored in buffer registers REG1-REG4 are error-corrected read data and check bits. Read data part excepting the check bits stored in buffer registers REG1-REG4 will be sequentially burst-transferred and output to IO terminals.

Figure 23:
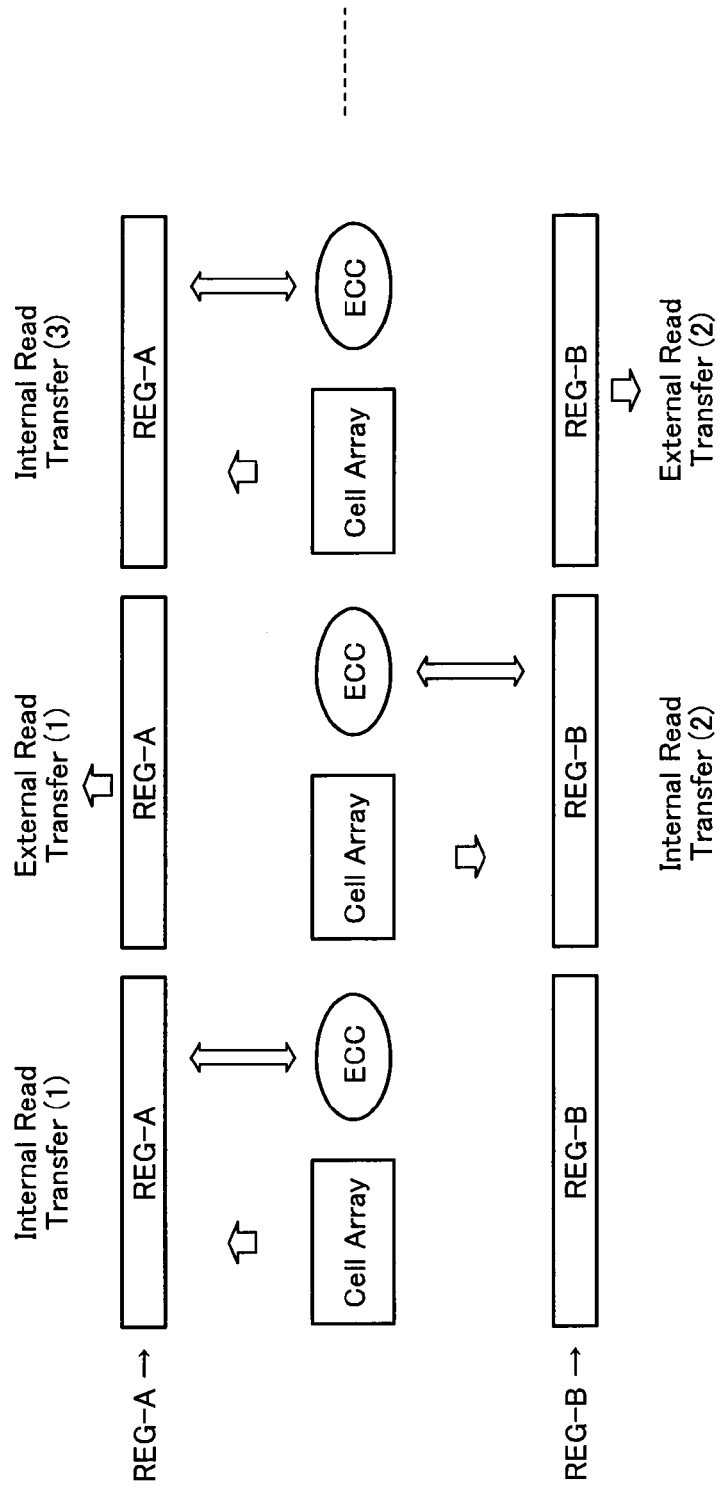
FIG. 23 shows an interleaved read burst transfer operation with two systems of buffer registers.

FIG. 23 is a diagram for explaining an interleave operation of read burst transfer with two systems of buffer registers REG-A and REG-B. Firstly, read data read from the memory cell array in the buffer register REG-A are ECC processed, and decoded data are transferred to and over-written in the buffer register REG-A (internal read transfer (1)). While the read data in the buffer register REG-A are burst-output to the external (external read transfer (1), next read data are transferred to the buffer register REG-B (internal read transfer (2)).

While the read data in the buffer register REG-B are burst-output to the external (external read transfer (2), next read data are transferred to the buffer register REG-A (internal read transfer (3)). The same operation will be repeated.

Write Procedure

Figure 24:
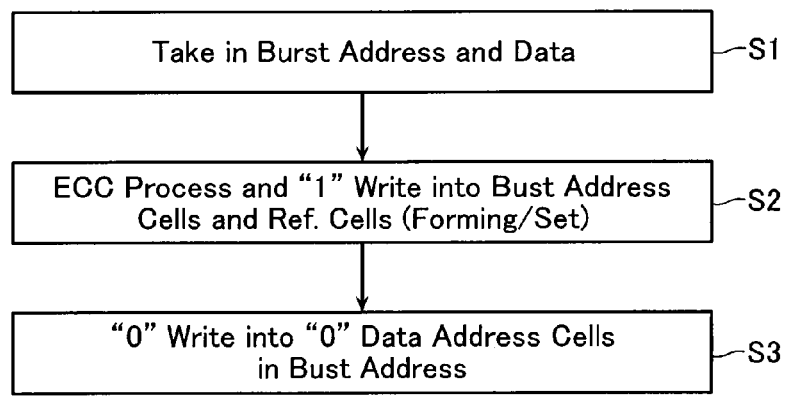
FIG. 24 shows a write procedure serving as re-forming/set.
Figure 25:
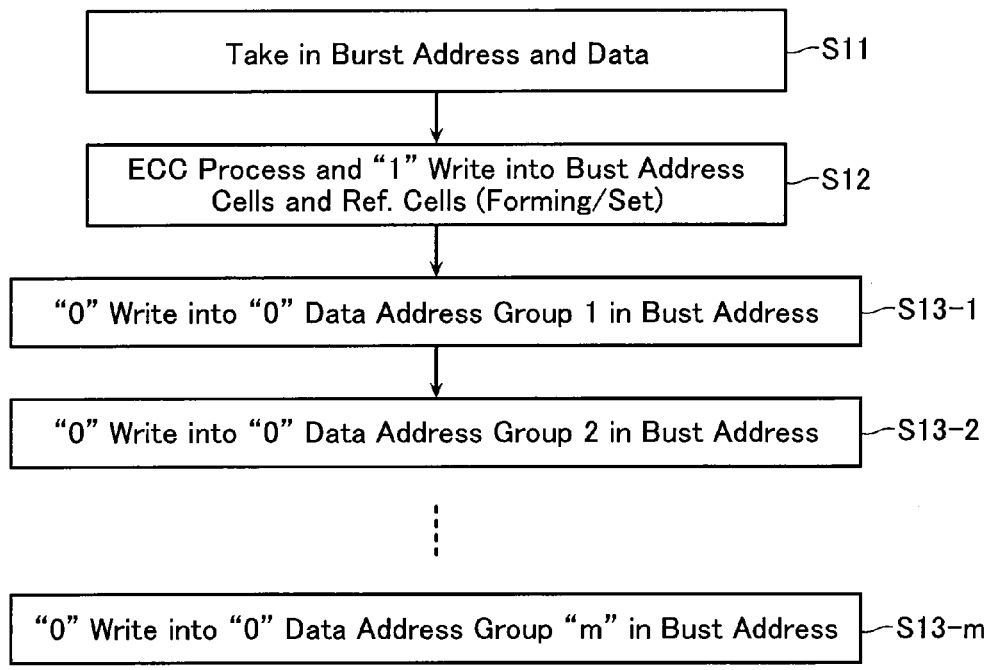
FIG. 25 shows another procedure serving as re-forming/set.

FIGS. 24 and 25 shows summarized write procedures in the internal data transfer explained above. It should be noted here that in case cell data retention and reliability are good, and there is no need of the ECC process, the over-write operation together with the ECC process may be omitted.

FIG. 24 is a write procedure in a case where the number of data bits simultaneously write-transferred on a selected word line is within a permissible range. It is assumed here that the two-step write scheme is adapted.

Firstly, take in burst address and write data (step S1), and then perform ECC encoding process for data stored in the buffer register and "1" write for burst address cells and reference cells simultaneously (step S2).

The above-described "1" write is a set operation meaning collective forming for the corresponding cells. Next, perform "0" write for "0" data address cells in the burst address (step S3).

FIG. 25 shows another write procedure in a case where the number of data bits simultaneously write-transferred on a selected word line is larger than the permissible range. In this example also, it is assumed that data write is performed with two steps.

Firstly, take in burst address and write data (step S11), and then perform ECC encoding process for data stored in the buffer register and "1" write for burst address cells and reference cells simultaneously (step S12). The above-described "1" write is a set operation meaning collective forming for the corresponding cells.

Next, ECC processed and over-written write data in the buffer register will be sequentially subjected to "0" data write for the respective groups, in each of which plural cells are simultaneously written. The simultaneously written bit numbers (cell numbers) are limited so as to suppress the total write current to be under a permissible value. That is, in case the cells on a selected word line are sectioned into "m" groups, "m" steps S13-1, S13-2~S13-$m$ of "0" write are repeatedly performed.

Next, the data transfer speed of external data transfer performed in parallel with internal data transfer will be explained with respect to some transfer combinations.

Read Burst Cycle

Figure 26:
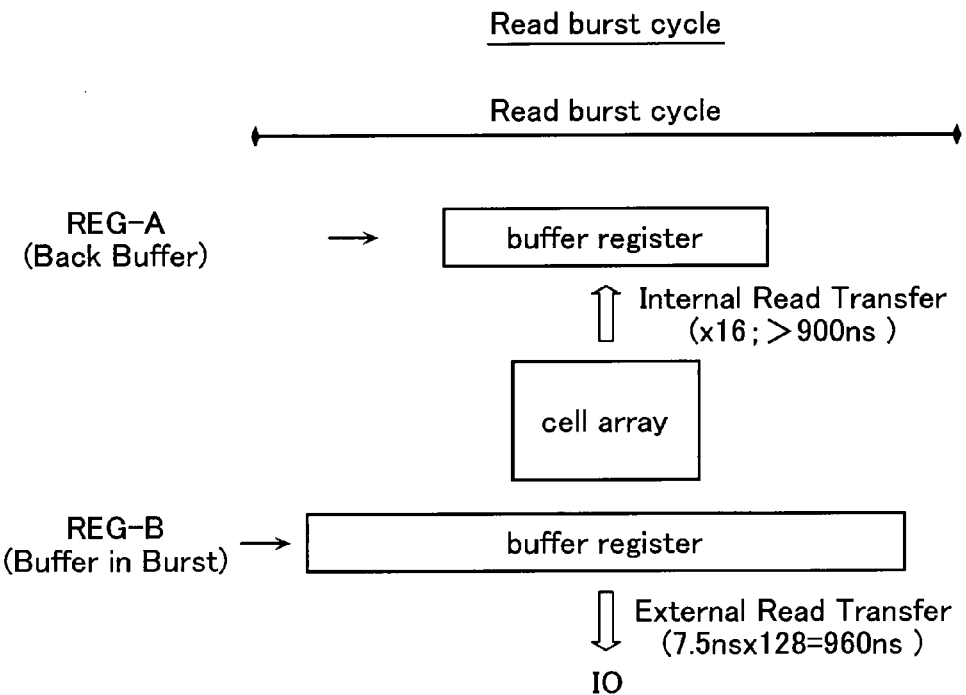
FIG. 26 shows a read burst cycle.

In case of a read burst cycle, as shown in FIG. 26, while read data in the buffer register REG-B are transferred to the external in the read burst cycle (i.e., external read transfer), cell array data are read in and transferred to buffer register REG-A (i.e., internal read transfer for the back buffer). Assuming that the memory chip is of ×16IO type and read data are ECC processed, it takes 900 ns or more to perform the internal read transfer in the buffer register REG-A.

It is assumed that the cycle time of the external read transfer is tRC=7.5 ns, the burst time is 128×7.5 ns=960 ns. Therefore, the internal read transfer will end in the burst time, and the external burst transfer will be performed with little gap. In case of ×16IO, the data transfer rate reaches 266 MByte/s.

Over-write Burst Cycle

Figure 27:
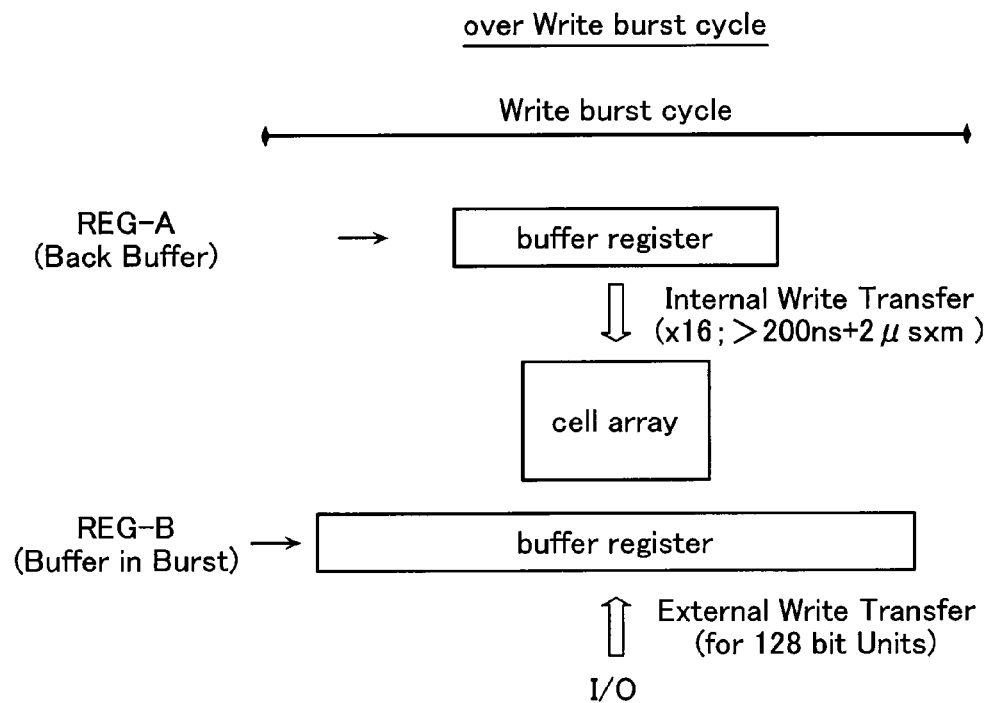
FIG. 27 shows an over-write burst cycle.

In case of an over-write burst cycle, as shown in FIG. 27, while write data are taken in the buffer register REG-B (i.e., external write transfer) in the write burst cycle, write data are transferred from buffer register REG-A to the memory cell array (i.e., internal write transfer for the back buffer). Assuming that the memory chip is of ×16IO type and the internal write transfer includes ECC processing, it takes 2 μs×m+200 ns or more to perform the internal write transfer in the buffer register REG-A.

If the transfer time of the external data transfer with 128 cycles is shorter than the internal write transfer time, there will be generated a data cycle gap. So, it means little for the data transfer speed to make the cycle time of the write burst short because the data transfer rate is defined by internal write data transfer. For example, the write cycle time tWC for the buffer register is set to be scores [ns], and a certain margin is applied. Additionally, it will be dealt with that the write data are divided into the respective 128 bit units, and the data transfer operations are sequentially performed after transferring the respective data units.

The above described over-write burst cycle will be used in a case where data to be stored in the memory is preliminarily determined, or new data is over-written into the memory, in which old data is stored. In other words, it will be adaptable in such a case that it is possible to take a sufficiently long time to write data in the memory.

ECC Refresh

Next, data refresh will be explained in relation to the over-write burst cycle. In a ReRAM, it may be difficult to avoid the deterioration of cell data retention due to the access disturbance. Therefore, it becomes material to correct data with the ECC circuit. However, if the number of errors is over a maximum value in ECC-correctable errors, it becomes impossible to deal with this situation. In consideration of it, there is prepared such a data refresh mode in this embodiment that cell data are refreshed in the read burst cycle under the influence of the active ECC situation.

The ECC refresh mode is basically a write operation, and two-step write will be adapted mainly for serving as re-forming or re-setting operation.

Figure 28:
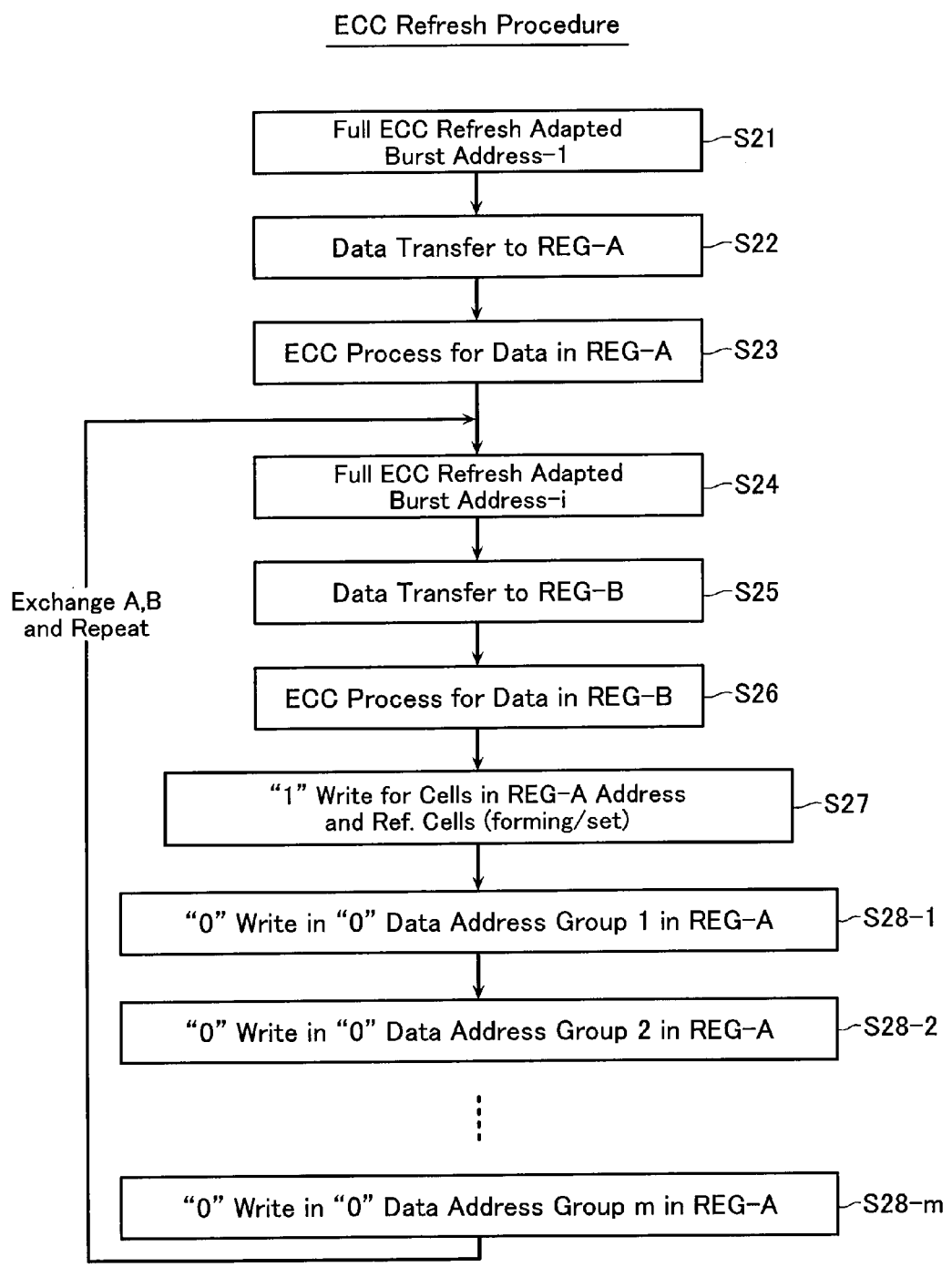
FIG. 28 shows an ECC refresh procedure.

FIG. 28 shows an ECC refresh procedure. The burst address to be refreshed will be recoded as "ECC refresh adapted burst address" in an ECC cycle in the internal data transfer in a read burst cycle in accordance with a signal generated from the ECC circuit for designating that the error correction has been adapted within the limit of the correctable error number. In FIG. 28, it is assumed that the ECC refresh adapted burst cycle is firstly applied to the internal data transfer cycle with one buffer register REG-A in two registers REG-A and REG-B.

That is, full ECC refresh adapted burst address-1 is recoded (step S21), and the addressed data is transferred to buffer register REG-A (step S22), so that the data in REG-A is subjected to ECC decoding (step S23).

If there is another full ECC refresh adapted burst address-i, it also is recoded (step S24), and data thereof is transferred to buffer register REG-B (step S25). Then, the data in REG-B is subjected to ECC decoding (step S26).

In parallel with the ECC decoding of the data in REG-B, "1" write (i.e., forming/set) is performed for "1" data cells together with reference cells with respect to the ECC refreshed data in REG-A (step s27). This "1" write is performed for all cells in the burst address in a lump, or selectively for only "1" data addresses.

Next, over-written write data in the buffer register REG-A will be sequentially subjected to "0" data write for the respective groups, which are sectioned on the condition that the total cell current of simultaneously written cells is limited under a permissible value. In case the cells on a selected word line are sectioned into "m" groups, "m" steps S28-1, S28-2~S28-$m$ of "0" write are repeatedly performed.

After completing the above-described "0" write, buffer registers REG-A and REG-B are exchanged, and the same operation as described above will be repeatedly performed for the corresponding burst addresses until the ECC refresh adapted burst addresses are run out.

Since there are a few or several error bits to be refreshed, even if "0" write is performed in a lump, the cell current will be in a permissible range in many cases. Therefore, "0" write is completed once in a time shorter than the normal over-write burst.

Next, the relationship between the ECC refresh and cycle timings thereof will be explained as a "refresh burst cycle" with reference to FIG. 29.

When starting the refresh burst cycle, read data transfer of the first refresh burst address Ref.add.1 is performed, for example, for buffer register REG-A. Read data in the register REG-A is finally error-corrected and over-written. It takes about 900 ns to do this read data transfer.

Next, data of the following refresh burst address Ref.add.2 is read and transferred to buffer register REG-B, and ECC processed. During this ECC processing, based on the data in buffer register REG-A, "1" write and "0" write are sequentially performed as cell refresh for cells in the refresh burst address Ref.add.1.

Write data transfer from the register REG-A need not to be ECC-processed because this data has already been ECC-decoded in the previous read data transfer. In this cycle of the refresh burst address Ref.add2, it takes 100 ns to do the read data transfer for the register REG-B and 2 μs×m to do write data transfer without ECC process.

When completing this transfer, data of the third refresh burst address Ref.add3 is read and transferred to register REG-A, and ECC processed. During this ECC processing, the following data refresh is performed based on the data in register REG-B.

The above-described refresh operations with buffer resisters REG-A and REG-B exchanged are repeatedly performed until the refresh burst addresses are run out.

Excepting the first refresh cycle, each cycle time is 100 ns+2 μs×m. To complete at least one refresh cycle, it takes 1 μs+2 μs×m in addition to the first cycle of 900 ns. That is, ECC refresh needs scores [μs] order. Note here that there are only several bits to be refreshed, and "0" write may be performed in a lump. Therefore, it is possible to set m=1. Times shown in FIG. 29 are in the case of m=1.

So far, data write is performed basically as over-write, and it is assumed such a memory specification that it takes a relatively long time to do data write, and data read is performed at high speed. However, there is another memory specification, in which data write needs a high-speed performance equivalent to or higher than that of data read. For example, there is a real time recoding method with respect to a high definition image, and it is desired to be adaptable to such high-speed data write.

The resistance of a kind of ReRAM cell material is rapidly changed in the voltage mode (i.e., set mode), and it will be lowered certainly in 50 ns or less. In consideration of it, high-speed data should be performed only with the voltage mode under the condition that current mode write (i.e., reset) with a lot of time required is completely excluded.

"1" only Write Procedure

The above-described high-speed write mode is defined as a ""1" only write" mode hereinafter, and the procedure will be explained below.

To achieve this write mode, it is required of the data write area to be preliminarily reset. This preparation step is (1) first step; "0" all write mode shown in FIG. 30. In this mode, burst addresses to be reset and "0" data are set, for example, in a buffer register (step S31), and "0" write (i.e., reset) is performed for the burst address cells (step S32).

"0" write is a current mode. Therefore, if necessary, the burst address is divided into multiple groups, and "0" write is sequentially performed for the respective groups. Repeating this "0" write for the necessary burst address areas, the cell area reset ends.

After preparing the memory area described above, (2) second step; "1" only write mode will be executed. This step is a voltage mode write step, and simultaneously accessed multibit may be written in a lump. Therefore, it becomes possible to do high-speed write.

The procedure of the "1" only write includes: setting burst address and the data in a buffer register (step S41); generating ECC check bits for data in the buffer register (step S42); and perform "1" only write in a lump for the burst address cells in the buffer register and reference cells.

Since this "1" write is a voltage mode, there is no need of grouping cells, and the cell's resistance change will occur in a short time. Repeatedly performing the above described burst address and data taking-in and "1" write for necessary cycles, the high-speed data write ends.

In the description of the "1" only write mode, there has been explained that "0" all write is performed for preliminarily resetting the area to be written with data. In relation to this, a "1" all write burst cycle for setting an area in the cell array in the "1" data state, and a "0" all write burst cycle for setting an area in the "0" data state will be explained in detail below.

Figure 31:
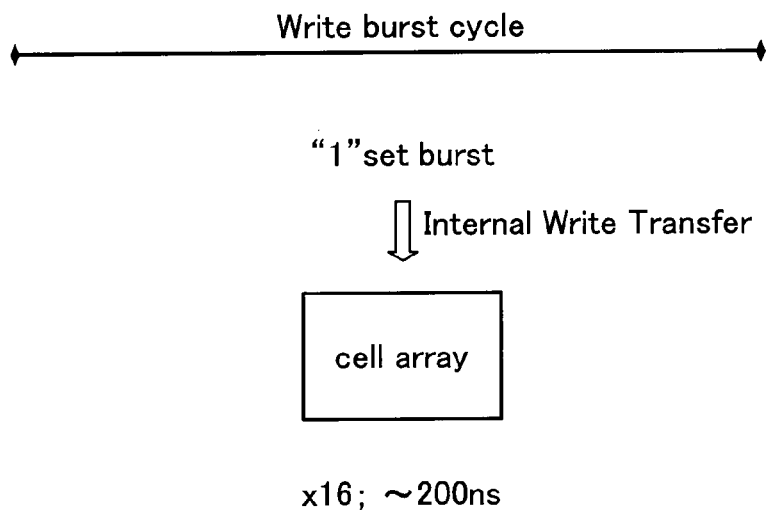
FIG. 31 shows "1" all write burst cycle.

FIG. 31 is a diagram for explaining the "1" all write burst cycle. This is mainly used as a preparing step for making the manufactured memory device operable in a stable state, and a forming step for restoring the memory state in a memory site used repeatedly for a certain time.

Here is shown that "1" data are write-transferred to a burst address in the cell array. It should be noted that it is possible to do this write mode only under the control of the decode system as the first step in the above-described two-step write. Since this write mode is a voltage mode for setting cells, it becomes possible to set all cells in a lump in the burst address on a selected word line, and it takes about 200 ns only. That is, forming or setting a cell area to be set may be achieved by repeated operations with 200 ns burst cycle.

The difference of the electric circumstances between "Forming" and "set" is in the maximum voltage to be applied to cells. The maximum voltage in the forming operation is higher in general than that in the set operation.

Figure 32:
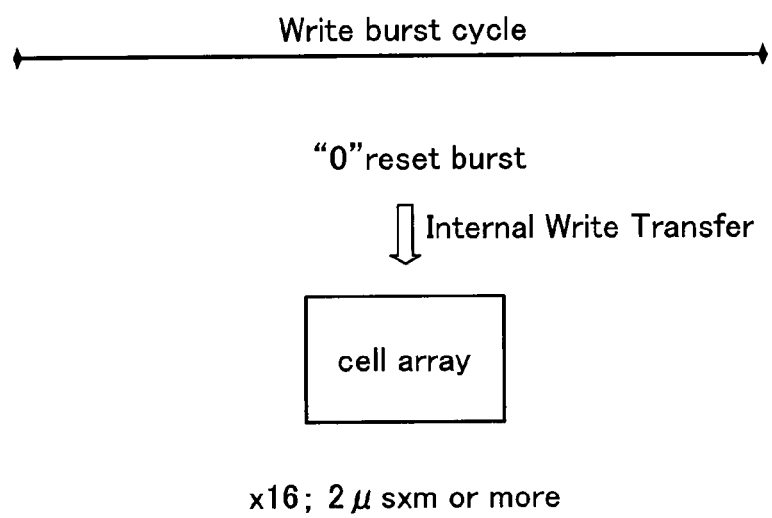
FIG. 32 shows "0" all write burst cycle.

FIG. 32 is a diagram for explaining the "0" all write burst cycle, in which a forming-processed cell array area is set in a "0" state for preparing a high speed write operation.

Here is shown that "0" data are write-transferred to a burst address in the cell array. It should be noted here that it is possible to do this write mode only under the control of the decode system as the first step in the above-described two-step write. Since this write mode is a current mode for resetting cells, it is impossible to reset all cells in a lump in the burst address on a selected word line.

Therefore, to limit the number of simultaneously selected cells in a range defined by the permissible power current of the word line driver, the cell area is sectioned to multiple groups, which are sequentially reset. Assuming that each reset time is about 2 μs, and the number of groups is "m", it takes 2 μs×m or more to reset "m" groups. That is, reset in a cell area may be achieved by repeated operations with this burst cycle.

Figure 33:
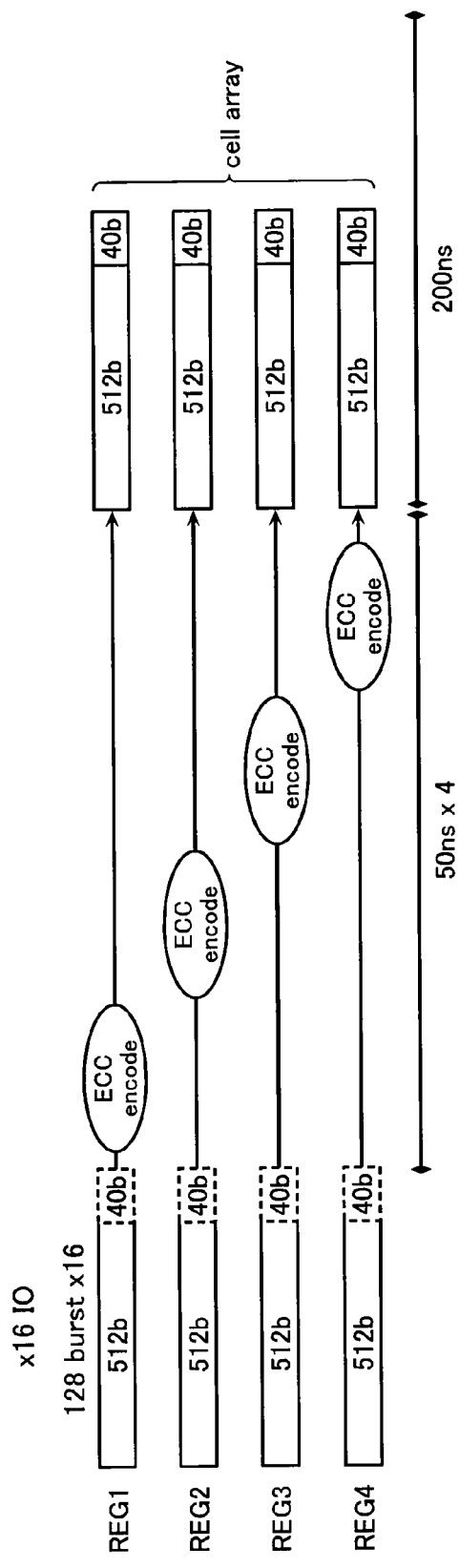
FIG. 33 shows "1" only write data transfer.

Next, "1" only write data transfer between the cell array and the buffer register will be explained below with reference to FIG. 33. It is assumed here that all cells in the whole cell array or a certain area to be written are preliminarily written into a "0" data state.

In case of ×16IO, a burst per IO is formed of 128 bit, and 128×16=2048-bit buffer register will be prepared, which is formed of, for example, four registers REG1 to REG4 each having 512b+40b.

Data read in the buffer register are ECC decoded and overwritten in the respective registers together with 40 check bit. That is, ECC process is time-divisionally performed four times for the respective 512 bit. Assuming that the encoding time unit is about 50 ns, it takes 50 ns×4=200 ns to encode the entire data.

ECC data code over-written in the registers will be subjected to "1" only write internal data transfer, which is performed in a lump with a voltage mode. Therefore, it takes about 200 ns to write the data in the cell array.

Figure 34:
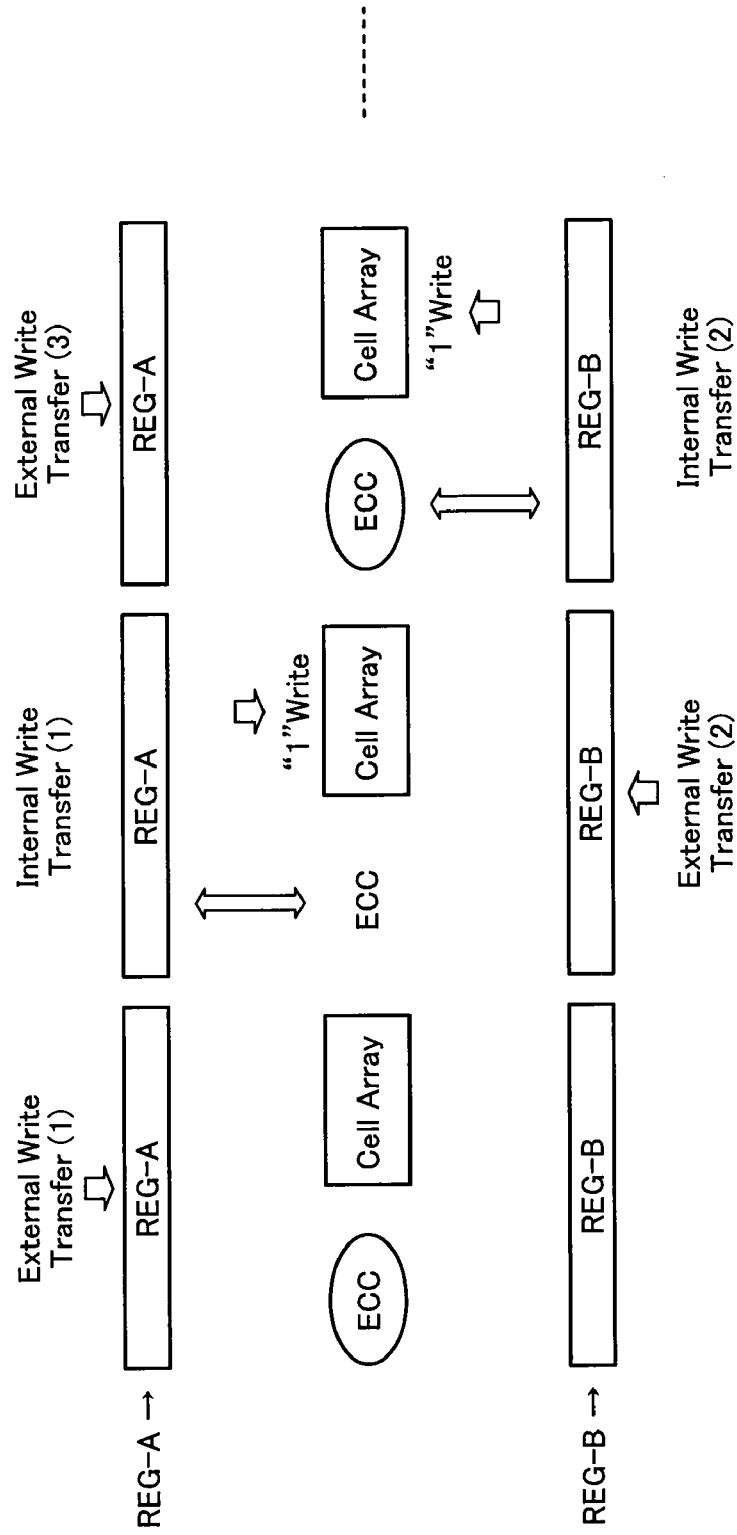
FIG. 34 shows an interleave operation of "1" only write data transfer.

In parallel with the ECC process and the internal data transfer, next burst data will be input to another buffer register. That is, two-system of buffer registers REG-A and REG-B are prepared as shown in FIG. 34. Firstly, write data is taken in the buffer register REG-A (external write transfer (1)), and the data is subjected to internal write transfer (1). This internal write transfer (1) is, as described above, as follows: data is ECC-encoded and over-written with check bits; and "1" only write is performed for the ECC-encoded data.

During this internal write transfer (1), next write data will be input to buffer register REG-B (external write transfer (2)). During the internal write transfer (2) of the buffer register REG-B, the next write data will be input to the buffer register REG-A (external write transfer (3)). As described above, the same operations will be repeatedly performed.

In this write mode, a buffer register, to which write data is to be taken in, is preliminarily set in the "0" data state. As a result, in case of write masking or interrupting, data compatibility will be kept without wasteful external data transfer.

Next, with reference to FIG. 35, the transfer speed of the "1" only write burst cycle, in which external write transfer is performed in parallel with the internal write transfer, will be explained below.

Figure 35:
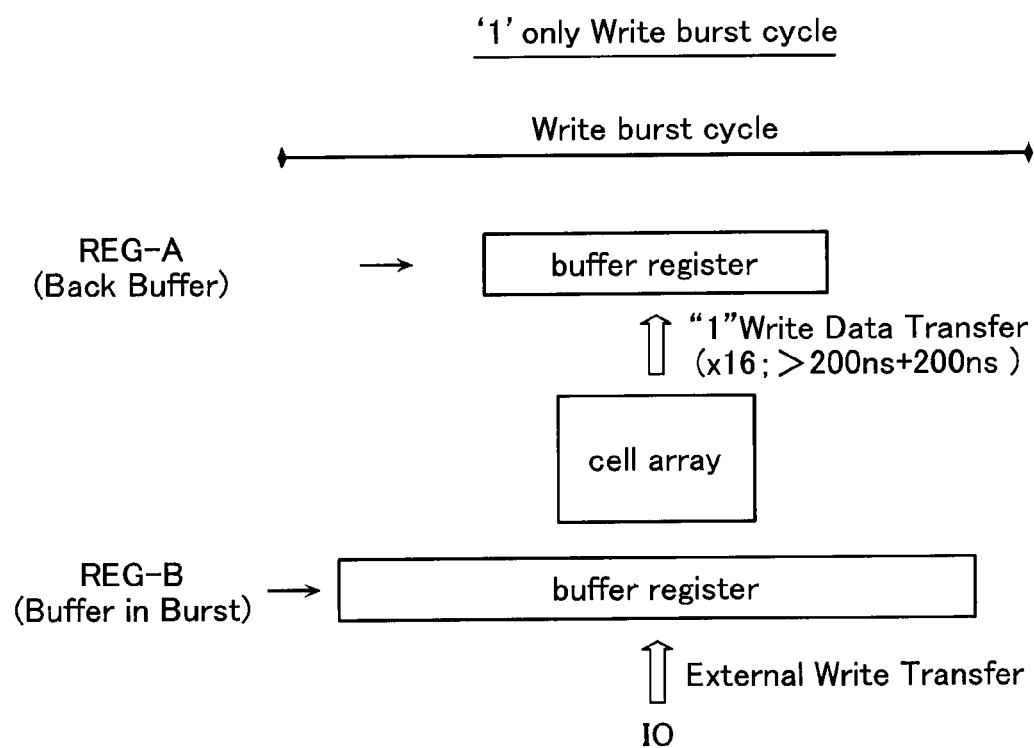
FIG. 35 shows "1" only write burst cycle.

As shown in FIG. 35, the internal data transfer needs "1" write of 200 ns in addition to ECC-process of 200 ns, and one cycle of the internal data transfer ends in the total time of 400 ns. Assuming that the external burst data transfer is presently performed for the buffer register REG-B, the internal data transfer is performed between the buffer register REG-A and the cell array.

It is assumed that write cycle time of the external data transfer is tWC=4 ns, the burst time becomes 512 ns in case of 128-bit burst length. Therefore, it becomes possible to complete the internal data transfer in the burst time and to do the external data transfer without generating any cycle gap. In case of ×16IO, the data transfer rate reaches 500 MByte.

Problems and Solution Method Thereof in Sense System Circuit (1)

Next, with respect to the high-speed and multi-bit access adaptable sense system circuit explained with reference to FIGS. 10 and 13, troublesome two problems and an improved sense system for solving them will be explained below.

One problem is as follows. In this system, when a word line is selected, non-selected word lines and non-selected bit lines all are set in a floating state. Therefore, all bit lines in a cell array mat shared by the selected word line appear as load capacitances.

Figure 36:
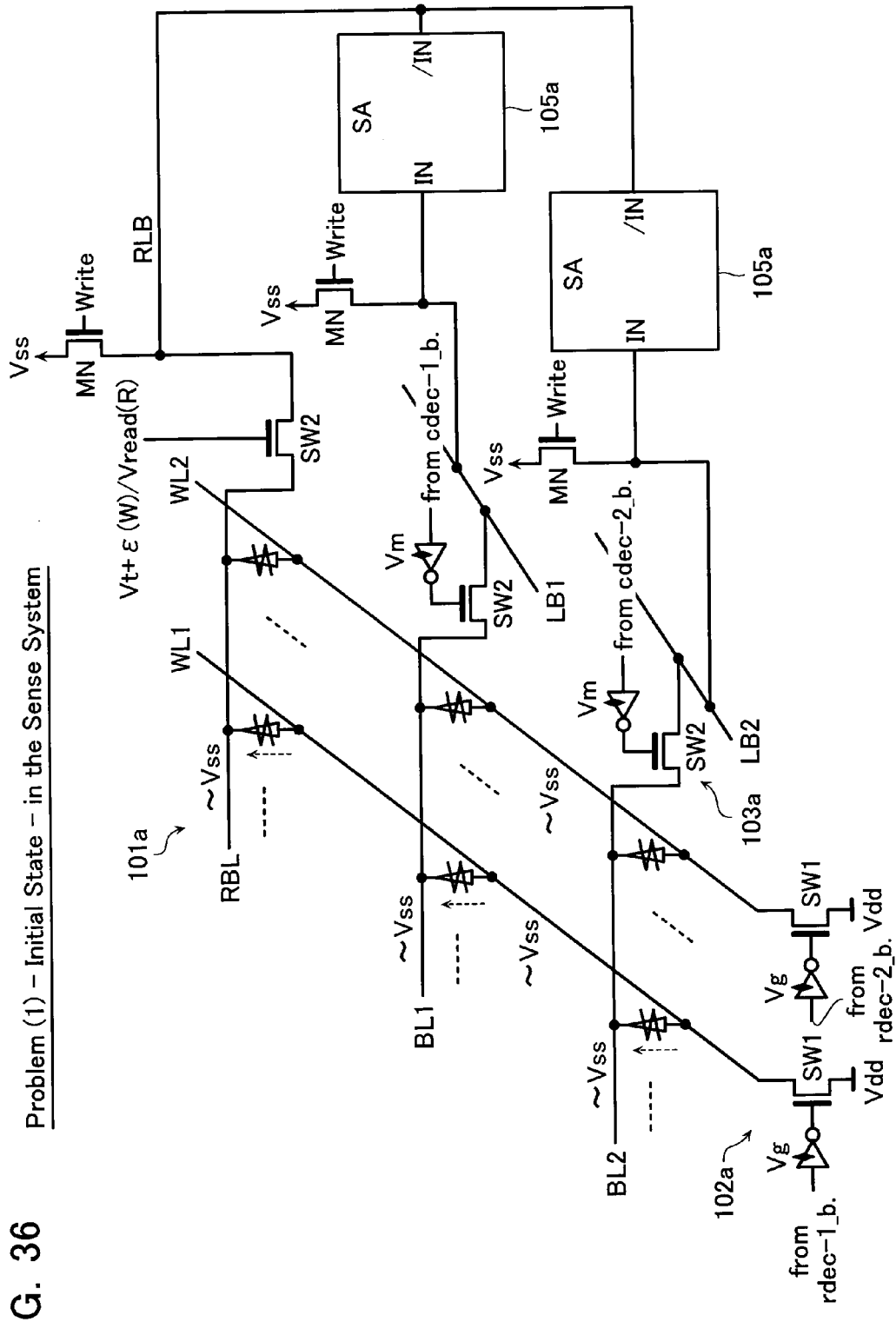
FIG. 36 shows the problem of the initial state in multi-bit adaptable sense system circuit.

For example, as shown in FIG. 36, it is assumed that word line WL1 is selected. In this case, as shown by arrows of dotted lines, charging current flows in bit lines and reference bit lines through cells coupled to the selected word line WL1. This is because that all word lines and bit lines are set at about Vss because the initial state is floating.

This load state will be continued until when the floating bit lines are charged-up and forward-biased cell diodes becomes off after raising the selected word. Due to this charging current, it takes a long time to stabilize the selected word line after raising it. This situation is not desirable for the high-speed access.

The other problem is in a bad cell with a large leakage current. If there is a bad cell, which has a diode with a low reverse-breakdown voltage, on the simultaneously accessed bit lines, and leakage current flows in it, it becomes impossible to set multiple cells in a lump. This problem is noticeable in a write operation in accordance with the voltage mode.

Figure 37:
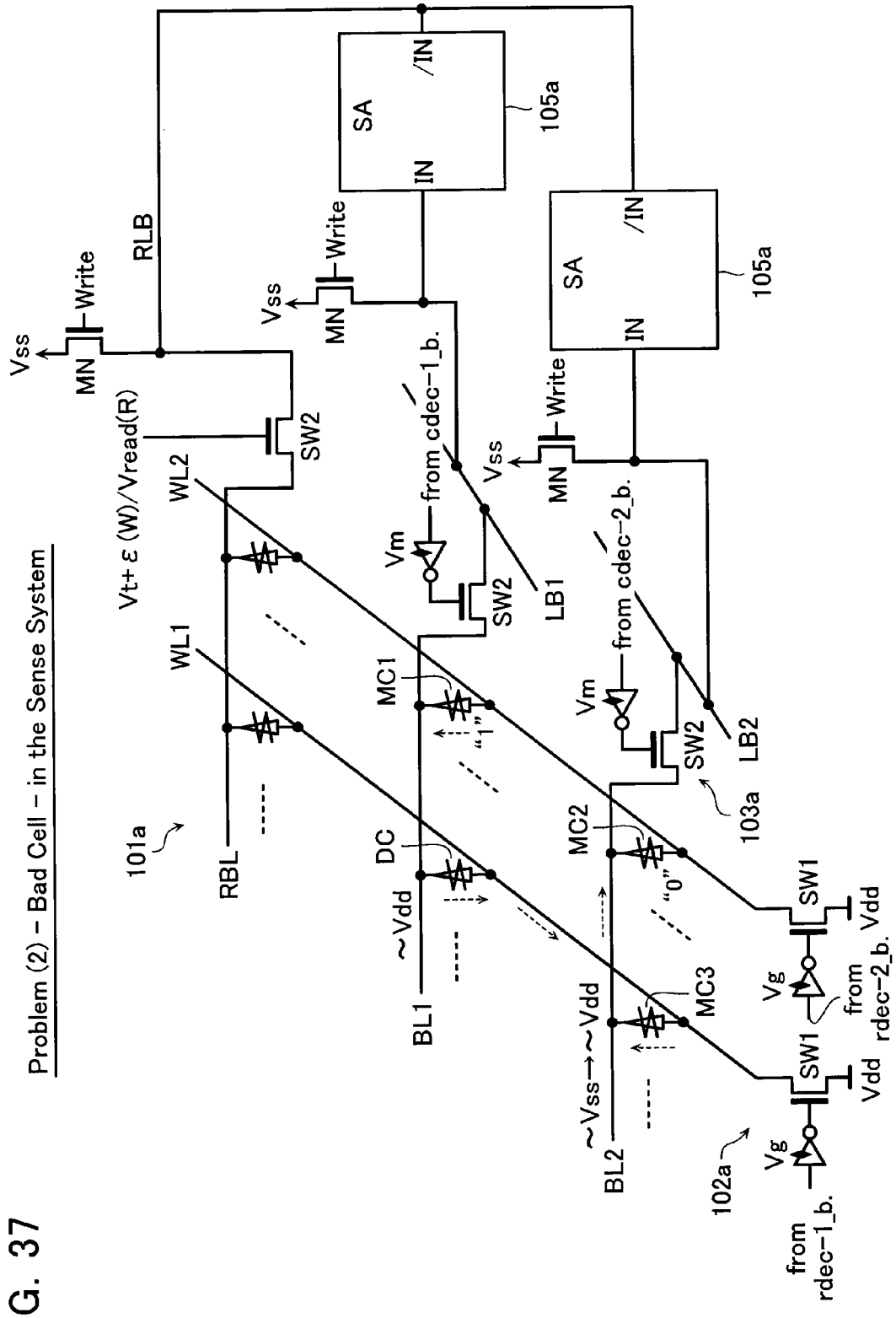
FIG. 37 shows the problem of bad cells in multi-bit adaptable sense system circuit.

This problem will be explained in detail with reference to FIG. 37. It is assumed here that all cells on the word line WL2 are preliminarily set in a "0" state, and some of them are set in a "1" state. If cell MC1 disposed between bit line BL1 and the selected word line WL2 is set in the "1" state, this bit line BL1 is boosted to about the same Vdd level as the word line in accordance with the setting of bit line selection switch SW2.

This prevents the cell MC1 set in a low resistance state from being reset again with a large current. However, if there is a bad cell DC at the cross point between this bit line BL1 and non-selected word line WL1, the floating level of the non-selected word line WL1 will be boosted due to the leakage current of bad cell DC. As a result, cell MC3 on the word line WL1 is forward-biased, and the cell current flows in bit line BL2, thereby raising this bit line level to near Vdd. That is, there is generated a current-charging path as follows: BL1→DC→WL1→MC3→BL2.

This results in that cell MC2 between the selected word line WL2 and the selected bit line BL2 is not applied with voltage, and it is not set. That is, if there is a bad cell, when one cell is set in a multi-bit simultaneous access mode, the remaining cells become set-impossible.

The second problem matters because the high-speed and multi-bit simultaneous access becomes impossible. The systematic cause is in that voltage and current are controlled by the both of word line selection switch SW1 and bit line selection switch SW2. This control scheme brings influences applied to selected cells through a bad cell.

A new sense system circuit, which is possible to clear up the second problem, will be explained with reference to FIGS. 38 to 40.

Figure 38:
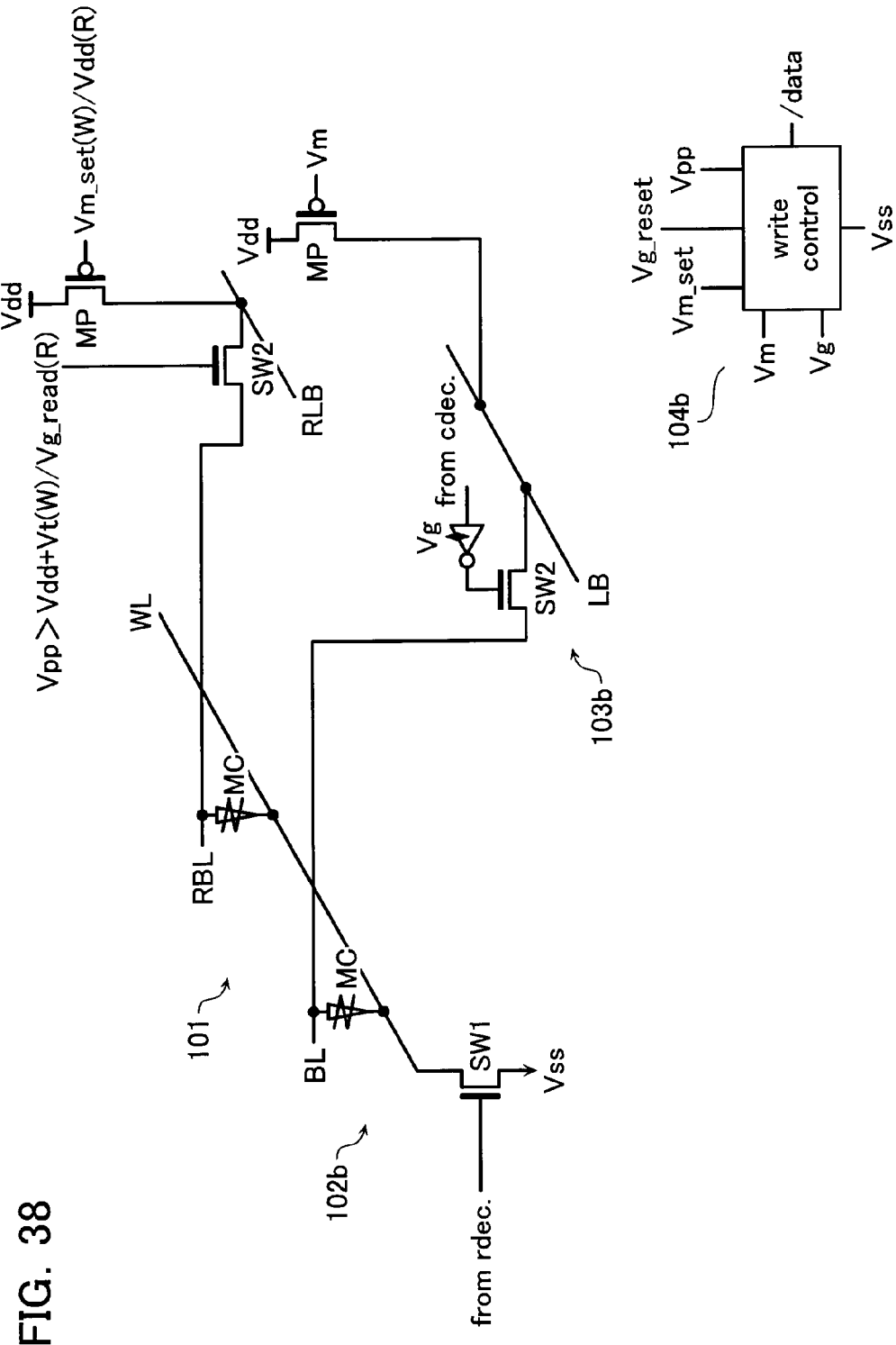
FIG. 38 shows an improved multi-bit adaptable sense system circuit.

As shown in FIG. 38, in this cell array 101, the anode side of the cell diode is coupled to bit line BL. This is basically the same as the sense system shown in FIG. 2, but there are a few differences therebetween as follows: word line selection switch SW1 in the word line driver 102*b* is turned on or off only with decoded signal "from rdec."; and voltage/current control in accordance with write data is performed with the bit line selection switch SW2 (i.e., NMOS transistor) in the bit line selection circuit 103*b* and PMOS transistor MP coupled to it via local buses LB and RLB.

The write control circuit 104*b* is slightly modified from the above-described write control circuit 104. Gate voltage Vg for controlling the bit line selection switch SW2 and gate voltage Vm for controlling PMOS transistor MP are set in correspondence with operation modes as shown in FIG. 40 with write control circuit 104*b*.

That is, in the cell reset mode, a sufficient amount current may be supplied to bit line BL from Vdd via PMOS transistor MP driven by Vm=Vss. On the other hand, bit line selection switch SW2 is driven by gate voltage Vg=Vg_reset lower than Vdd, so that high voltage such as Vdd is not applied to the high resistance cell after completing reset.

In the cell set mode, PMOS transistor MP is driven by gate voltage Vm=Vm_set higher than Vss, so that it serves for current-limiting. On the other hand, gate voltage Vg of the bit line selection switch SW2 is boosted level Vpp sufficiently higher than Vdd, so that local bus voltage is completely transferred to the bit line BL.

In the read mode, PMOS transistor MP is off with gate voltage Vm=Vdd. In addition, Vg is set at Vg_read sufficiently lower than Vdd, whereby it becomes possible to sense the current characteristic of a cell with low voltage applied.

With respect to the reference bit line RBL, it will be set as follows. In the write mode, gate levels of the bit line selection switch SW2 and PNOS transistor MP are set at Vpp and Vm_set, respectively, because the reference cell is always written into the "1" state. In the read mode, the reference bit line current will be transferred to the sense amplifier with the same bias as other bit lines.

The write control circuit 104b, as shown in detail in FIG. 39, generates the above-described gate voltages Vg and Vm in accordance with data and operation modes. On the assumption that Vdd is sufficiently high voltage necessary for generating the set voltage, the relationship between control voltages will be set as shown in FIG. 40 and as follows: Vss<Vm_set~Vg_read<Vg_reset<Vdd.

Multi-Bit Access Adaptable Sense System Circuit (2)

Figure 41:
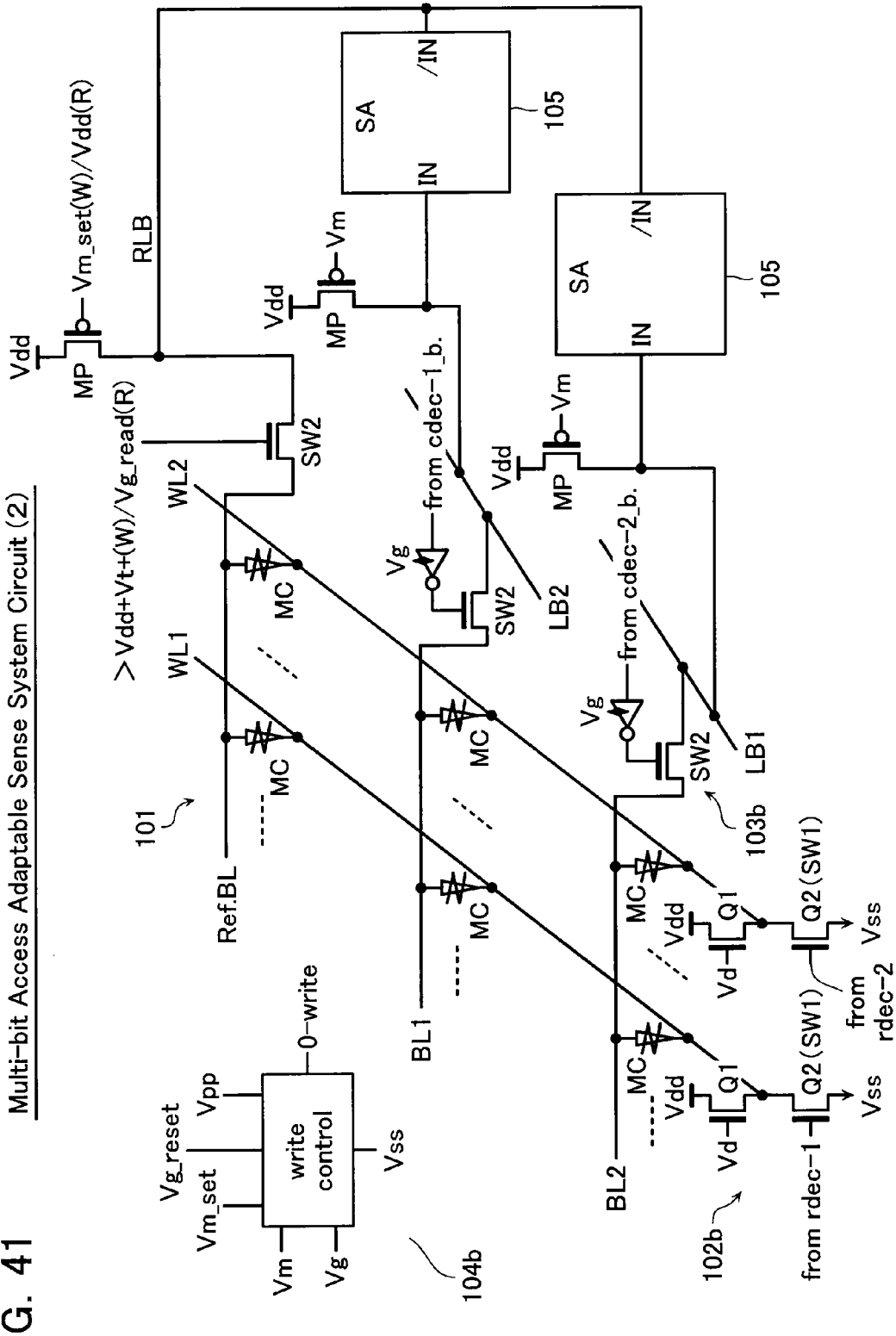
FIG. 41 shows another multi-bit adaptable sense system circuit (2).

FIG. 41 shows the multi-bit access adaptable sense system circuit (2), in which the elements explained in FIGS. 38-40 are collected. Means for clearing up the first problem described above also is added to this system. Cell array 101 is different from that 101a in the sense system (1) shown in FIG. 13, and the anode side of the cell is coupled to the bit line BL.

Word line driver 102b has, in addition to NMOS transistor Q2 (corresponding to switch SW1) used for setting the word line at Vss, NMOS transistor Q1 disposed on the Vdd side, the gate of which is driven by Vd(<Vdd). NMOS transistor Q1 serves as a stationary charging circuit for charging up the word line. PMOS transistor MP, which is coupled in series to the bit line selection switch SW2 via local bus LB, is used for controlling voltage/current in the write mode.

Sense amplifier 105 is different from that shown in FIG. 13, and the same as that shown in FIG. 3.

According to this sense system circuit, voltage/current control of the bit lines BL for stabilizing the data write is performed independently for the individual bit lines. Therefore, a bad cell does not influence other selected cells in the write mode, and the above-described second problem is cleared up.

In addition, NMOS transistor Q1, the gate of which is driven by Vd lower than Vdd, is added to each the word line selection switch for charging up the word line WL. Therefore, even if in a non-selected time, word line WL is set at about Vd−Vt. This leads to that, when raising a selected bit line, there is no need of caring about the forward-bias current of cell-diodes charging up the waiting word lines. That is, it becomes possible to raise the bit line rapidly.

Further, NMOS transistor Q1 added to the word line switch is formed to carry only small current, and it does not disturb the word line switch operation to Vss. Since a floating non-selected word line is set at a potential level sufficiently lower than Vd with the off-diode leakage, when falling the selected word line, the disturbance to cells on the non-selected bit lines is very small. Even if it is problematic, it becomes possible to ignore the influence of the transition current in such a way as to make the word line falling slightly slow.

With respect to the multi-bit over-write via the bit lines BL, it is preferable to use two steps as in the above-described system. The reason is that there is no need of controlling Vg and Vm for the respective bit lines individually, and the load of circuit layout becomes small. There will be disposed only one write control circuit 104b having data input (/data), to which "0" write signal "0-Write" is input. With this write control circuit, it becomes possible to do "1" write at the initial step, and "0" write at the second step. In a high-speed write mode such as "1" only write, in which cells are initially set in a state, it is adaptable to do one collective write step.

Although the word lines are always charged up in this system, it is not required of the charging circuit (NMOS transistor Q1) to carry large current. If it carries large current, it becomes problematic to make the drivability of the selected word line low.

Figure 42:
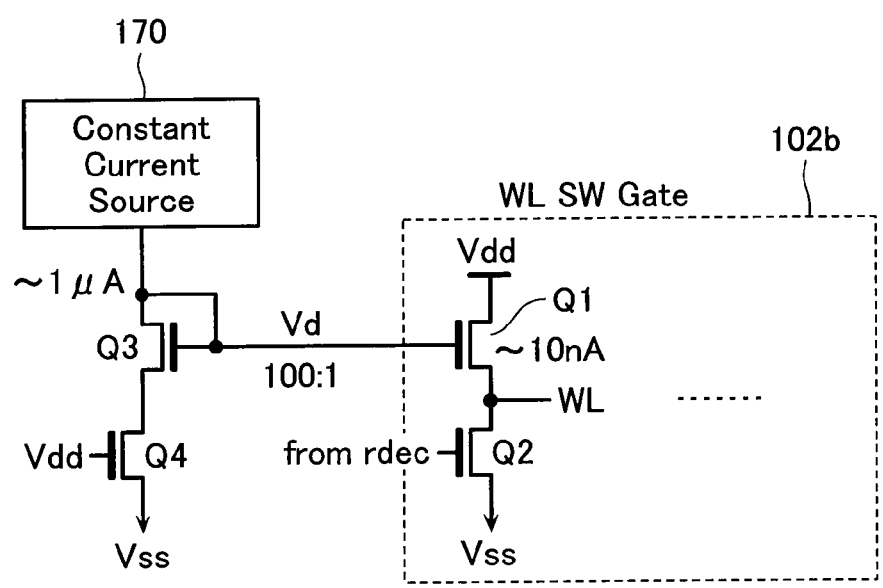
FIG. 42 shows the gate level generating circuit used in the system.

FIG. 42 shows the gate level (Vd) generating circuit in the word line charging circuit. There is disposed diode-connected NMOS transistor Q3 is coupled to the output node of constant current source 170 for generating gate level Vd corresponding to the threshold voltage at 1 µA. This NMOS transistor Q3 has hundred times channel width as large as NMOS transistor Q1 disposed on the Vdd side in the word line driver 102b, and these transistors Q3 and Q1 constitute a current mirror. With this current mirror, it becomes possible to charge the word lines with the maximum 10 nA current.

Figure 43:
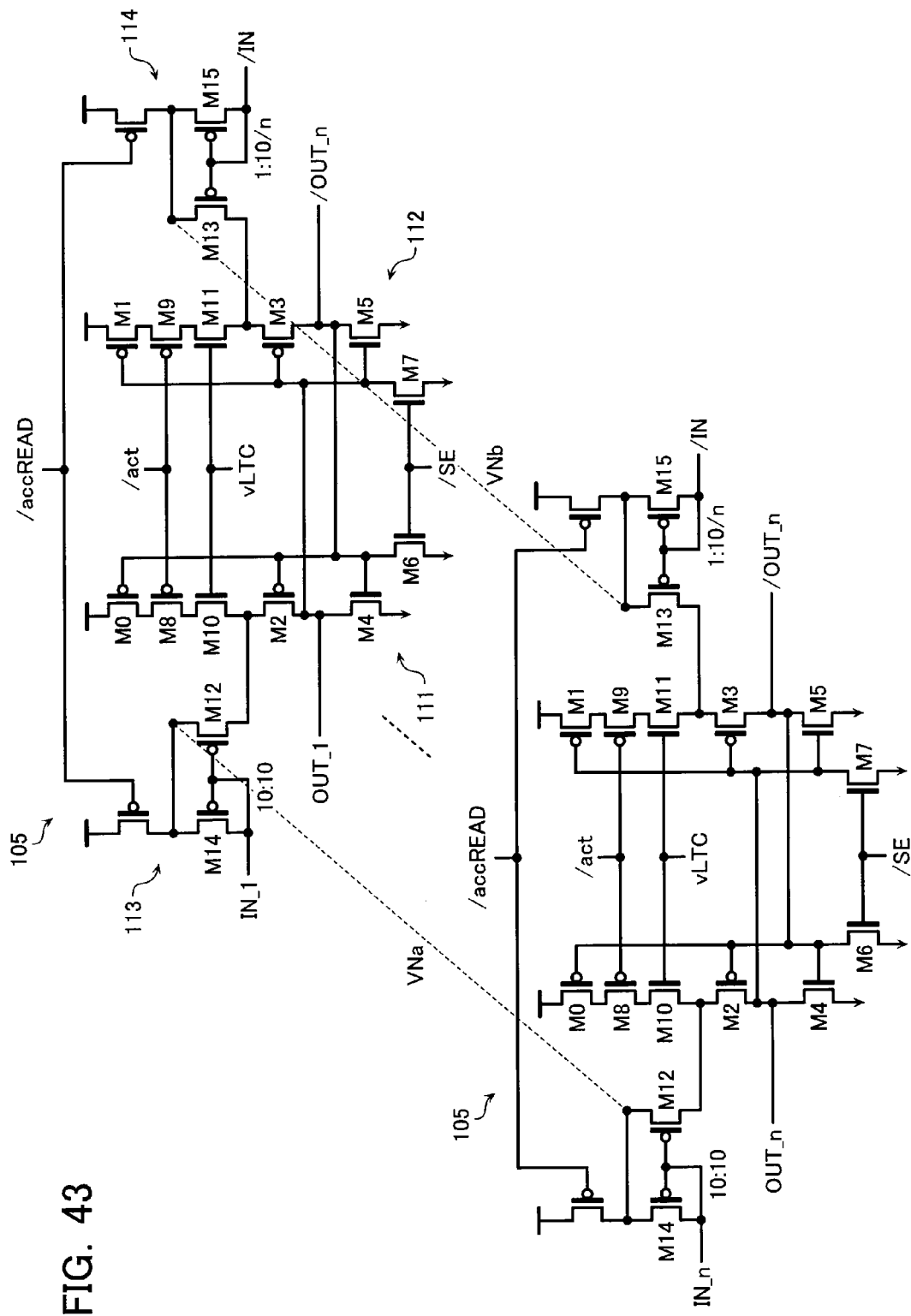
FIG. 43 shows the sense amplifier circuit used in the system.

FIG. 43 shows the sense amplifier circuit used in the new multi-bit access adaptable sense system circuit (2). This is formed of the same sense amplifiers 105 as shown in FIG. 3. That is, as different from that shown in FIG. 14, PMOS current mirrors 113 and 114 are used in this sense amplifier circuit.

Sense amplifiers 105, the number of which is equal to that of the selected bit lines (which are coupled to selected cells within the whole cells driven by a selected word line), are simultaneously activated. Assuming that the number is "n", one input nodes /IN in n-sense amplifiers 105 are coupled in common to the reference bit line RBL. If the simultaneously selected bit lines are dispersedly disposed in the cell array to have different circumstances from each other, it will be dealt with that bit lines with about the same circumstances are collected to be coupled to the reference bit line. As the other input nodes IN, individual input nodes IN_1~IN_n are disposed for the respective bit lines. Current mirror circuits 113 and 114 disposed at the input nodes of the sense amplifiers have common nodes VNa and VNb, respectively. Transistor size ratio of each current mirror 114 on the reference bit line RBL side is set at 1:10/n, and the collected current ratio becomes 1:10.

Next, it will be explained minimum operation modes necessary for the memory device and specifications thereof.

Forming Write Burst

Figure 44:
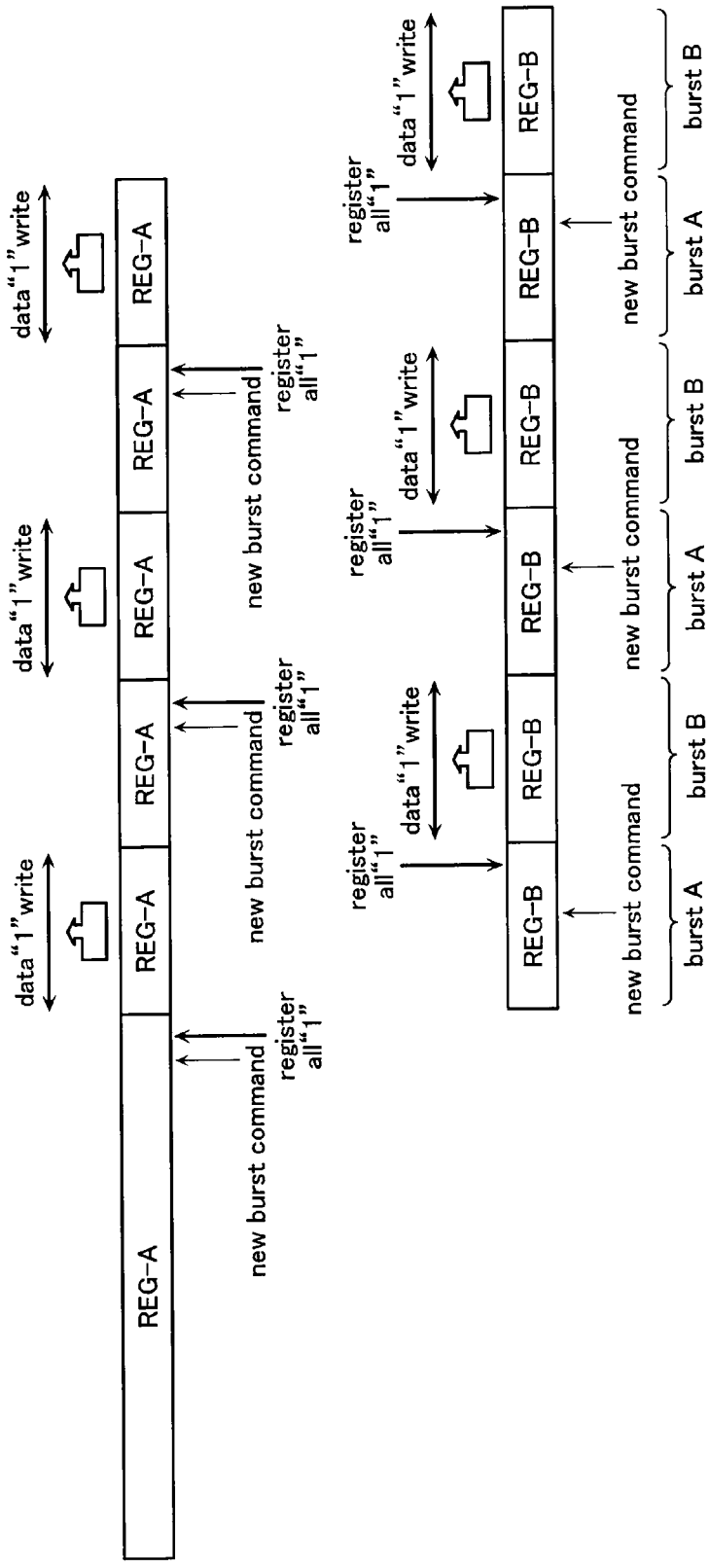
FIG. 44 shows the operation timing chart of forming write burst.

FIG. 44 shows a timing chart of forming write burst. This is a forming mode necessary to activate memory cells after manufacturing, in which a cell array area or the whole cells in the memory chip are written into a set state (i.e., "1" data state). The state to be initially set is different depending on the resistance change material used in cells.

The method shown in FIG. 44 is to use the internal data transfer between the buffer register and the cell array. If there is a margin in the periphery circuit around the cell array, it becomes possible to use a decoder for setting in place of the data transfer scheme.

First, burst command and address for forming are taken in, and then all "1" data is set in buffer register REG-A. Following it, in accordance with internal data transfer from the buffer register REG-A, "1" write is performed. At this time, the set voltage is adjusted to be suitable for the forming process.

Simultaneously with this internal write transfer, next burst command and address are taken in, and all "1" data is set in buffer register REG-B. Then, "1" write is performed in accordance with the internal data transfer from this buffer register REG-B.

The above-described operations are repeatedly performed for the entire burst addresses. The burst cycle time is about the same as collective "1" write, i.e., about 200 ns.

After completing the forming, a cell array area or the whole cells need to be set in reset state (i.e., "0" data state) for preparing the high-speed write. This is the following "0" all write burst.

"0" all Write Burst

Figure 45:
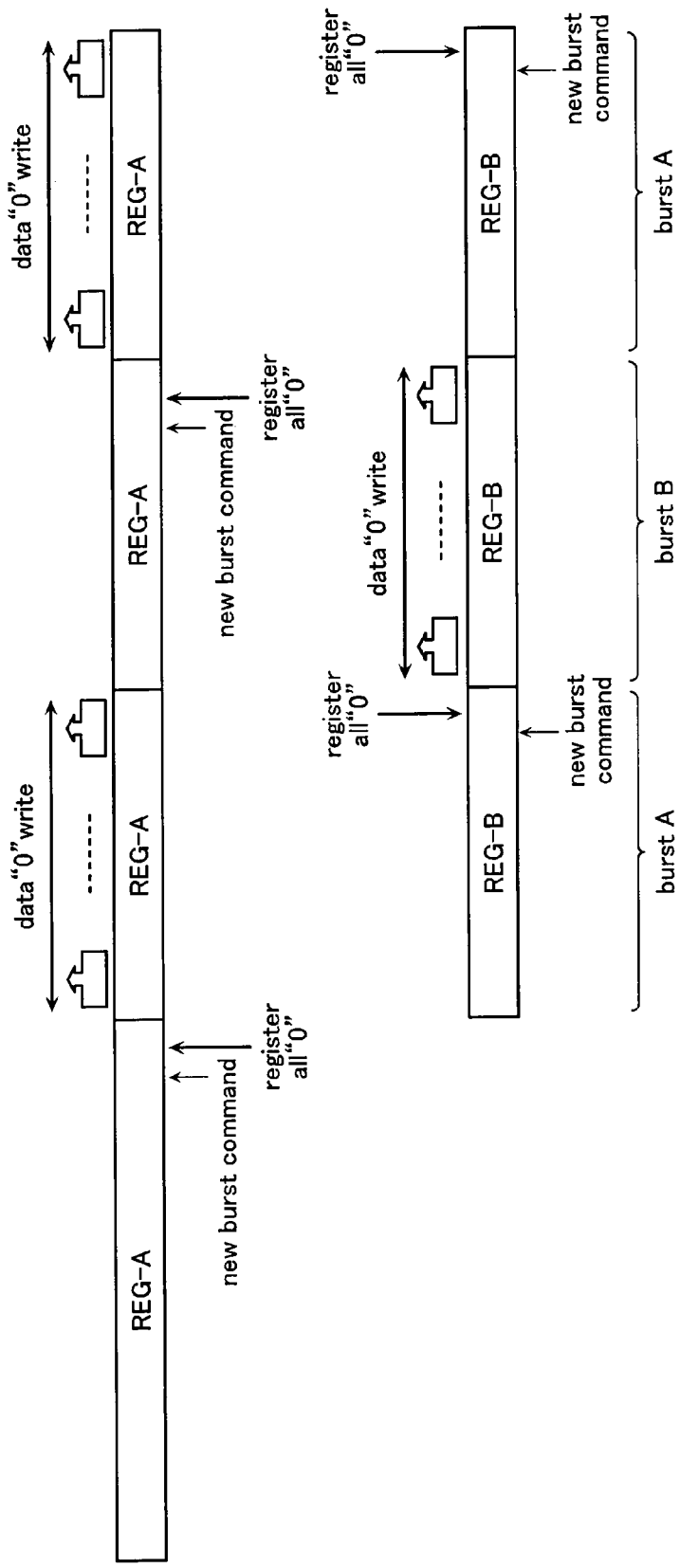
FIG. 45 shows the operation timing chart of "0" all write burst.

FIG. 45 shows a timing chart of "0" all write burst. It is the same as the forming that the state to be initially set is different depending on the resistance change material used in cells. This mode is a current write mode, i.e., write into a reset state with a long time taken.

The method shown in FIG. 45 is to use the internal data transfer between the buffer register and the cell array. If there is a margin in the periphery circuit around the cell array, it becomes possible to use a decoder for setting in place of the data transfer scheme.

First, burst command and address for performing "0" write are taken in, and then all "0" data is set in buffer register REG-A. Following it, in accordance with internal data transfer from the buffer register REG-A, "0" write is performed.

This "0" write is performed sequentially for the respective groups, each cell number of which is limited to suppress the current of the word line driver under a permissible value.

Simultaneously with this internal write transfer, next burst command and address are taken in, and all "0" data is set in buffer register REG-B. Then, "0" write is performed in accordance with the internal data transfer from this buffer register REG-B.

The above-described operations are repeatedly performed for the entire burst addresses to be written with "0" data. In case "m" groups are sectioned in the cell area to be written with "0", the burst cycle time becomes about 2 μs×m.

Interrupt and Stop of Burst Cycle

Next, it will be explained interrupt and stop of a burst cycle.

Figure 46:
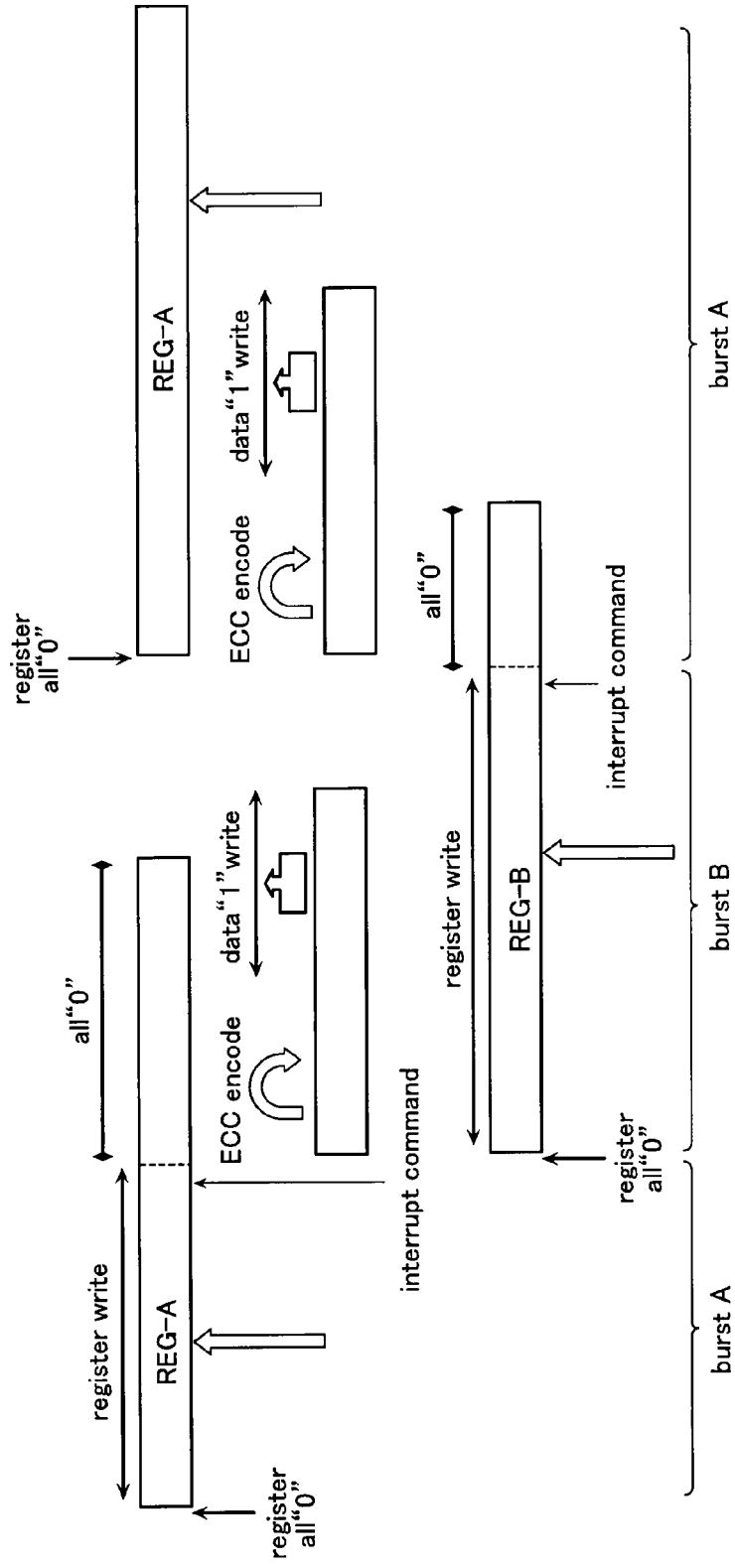
FIG. 46 shows the operation timing of interrupting "1" only write burst.

FIG. 46 is a diagram for explaining an interrupt operation against "1" only write burst cycle, which writes data at high speed in a reset cell array area. It is assumed that this write burst mode started from the external data transfer to the buffer register REG-A.

Prior to this external data transfer, all "0" is set in the buffer register REG-A, and data write burst address is taken in. All "0" setting is used for assuring that "0" data are remained in the buffer register after interrupting.

"1" data will be over-written in the register REG-A, in which "0" data are stored, in accordance with external data transfer (burst A). If interrupt command is input halfway during the external data transfer, this external data transfer is finished, and soon data in the register REG-A is ECC-encoded for generating check bits.

Just after the ECC-encode, internal data transfer of data "1" starts. This "1" write is performed at high speed in accordance with collective data transfer.

On the other hand, at the interrupt command timing, all "0" is set in the other buffer register REG-B, and new data write burst address is taken in (burst B). This all "0" setting is also for assuring that "0" data are remained in buffer register after interrupting. As similar to the previous cycle, "1" data is over-written in the register REG-B, in which "0" data are stored, in accordance with external data transfer.

It is useful that the above-described "0" setting is automatically performed after the internal data transfer. Alternatively, if the interrupt is out of consideration, "0" setting is not required. The above-described operations will be repeated. In a normal case, ECC-encode starting timing is after when the external data transfer of 128 bit to the buffer register is completely finished. By contrast, in the interrupt case, it is different from the normal case that ECC-encode is forcedly started with the command halfway during the external data transfer.

Figure 47:
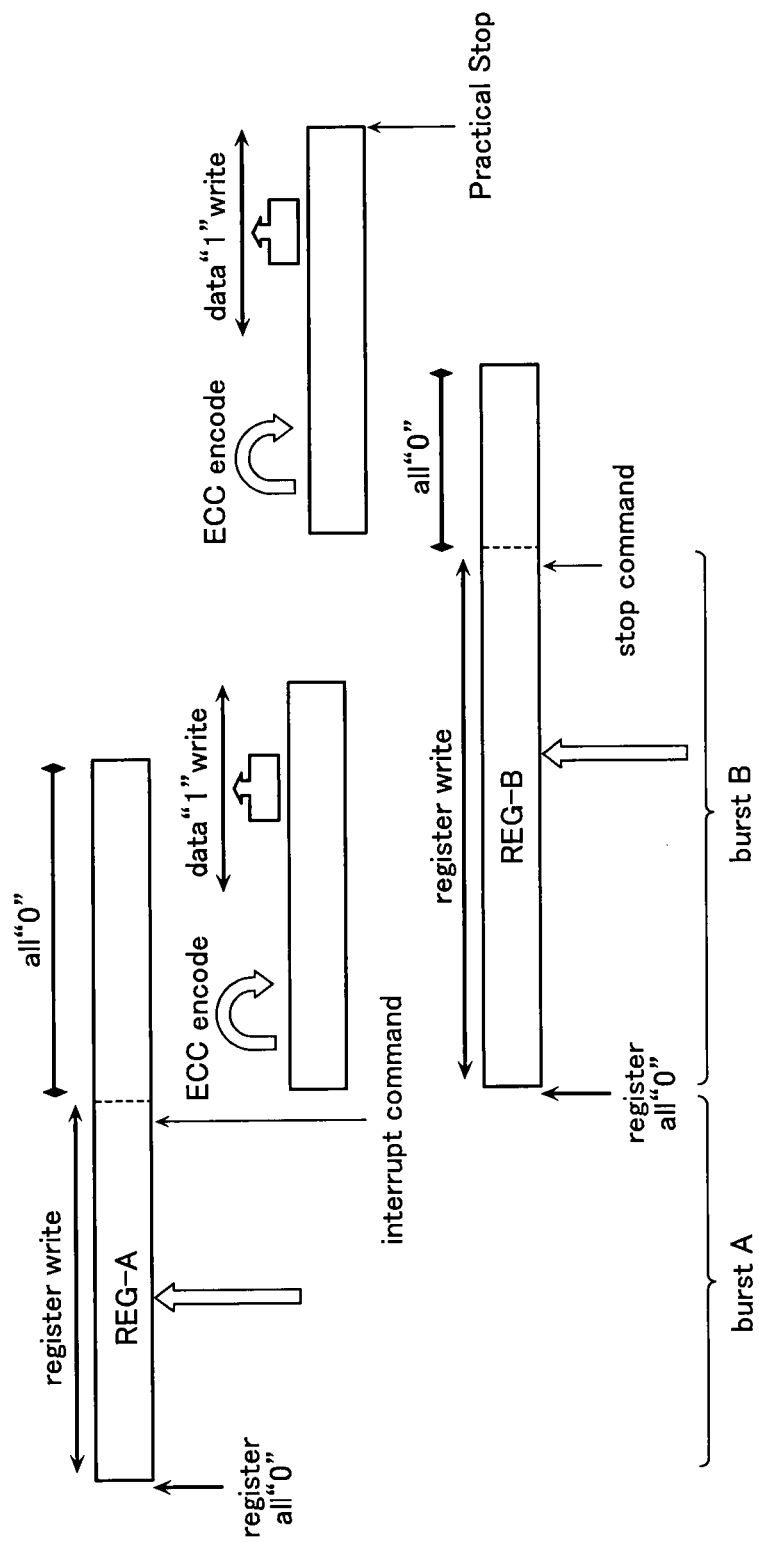
FIG. 47 shows the operation timing of stopping "1" only write burst.

FIG. 47 is a diagram for explaining a stop operation against "1" only write burst cycle. In the former half, as similar to the example shown in FIG. 46, it is shown that the burst A is interrupted halfway with interrupt command. If input is not interrupt command but stop command, for example, halfway burst B, the external data transfer stops, and ECC-encode starts soon. After finishing the ECC-encode, internal data transfer, i.e., "1" write starts. When this internal data transfer ends, the whole data write transfer stops.

Figure 48:
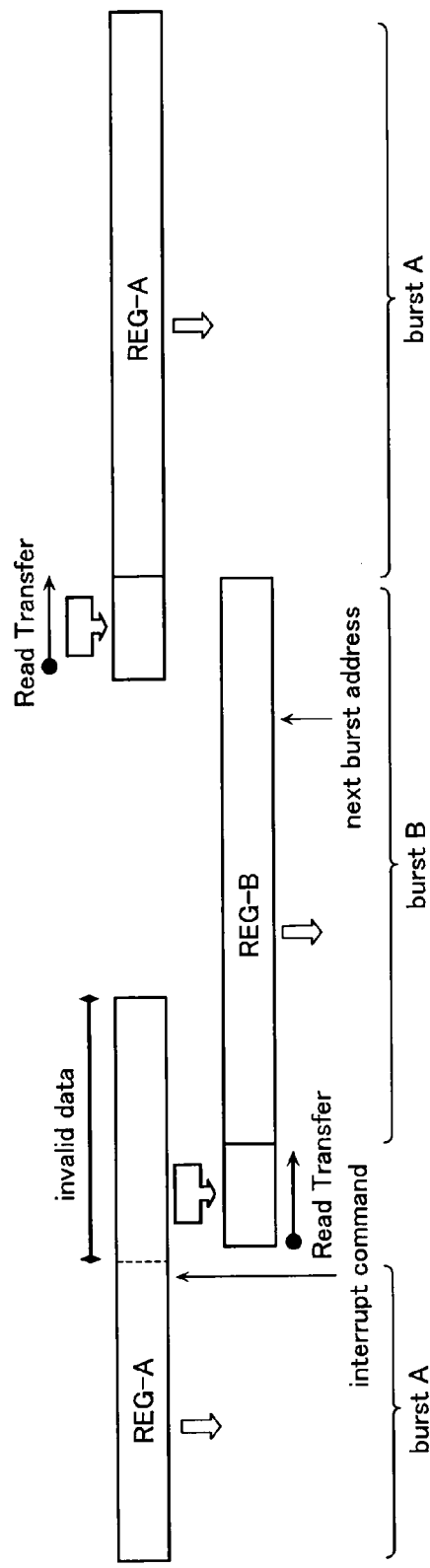
FIG. 48 shows the timing chart of interrupting read burst cycle.

FIG. 48 is a diagram for explaining an interrupt operation for read burst cycle. It is assumed here that the external data transfer cycle starts from buffer register REG-A. That is, prior to the external data transfer, data is stored in the buffer register REG-A in accordance with internal data transfer, and it will be transferred to the external (burst A).

When interrupt command is input halfway during the external data transfer, the external data transfer stops, and soon internal data transfer for designated burst address, i.e., read data transfer, is performed for the buffer register REG-B. After ECC-decoding this read data and over-writing it in the buffer register REG-B, external data transfer from the buffer register REG-B starts soon.

If there is not inputted the interrupt command, next burst address is input, and data of the burst address is read-transferred to register REG-A. When all 128 bit of the burst B are completely transferred to the external, new burst starts for the buffer register REG-A (burst A). The same operation will be repeated hereinafter.

Figure 49:
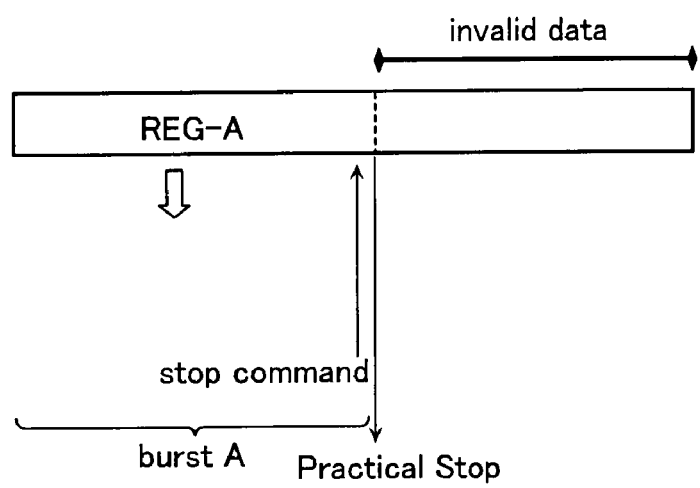
FIG. 49 shows the timing chart of stopping read burst cycle.

FIG. 49 shows a case of stopping read burst cycle. If there is inputted not interrupt command but stop command, for example, in the burst A, the external data transfer from the buffer register REG-A stops, and the read burst stops at once.

Figure 50:
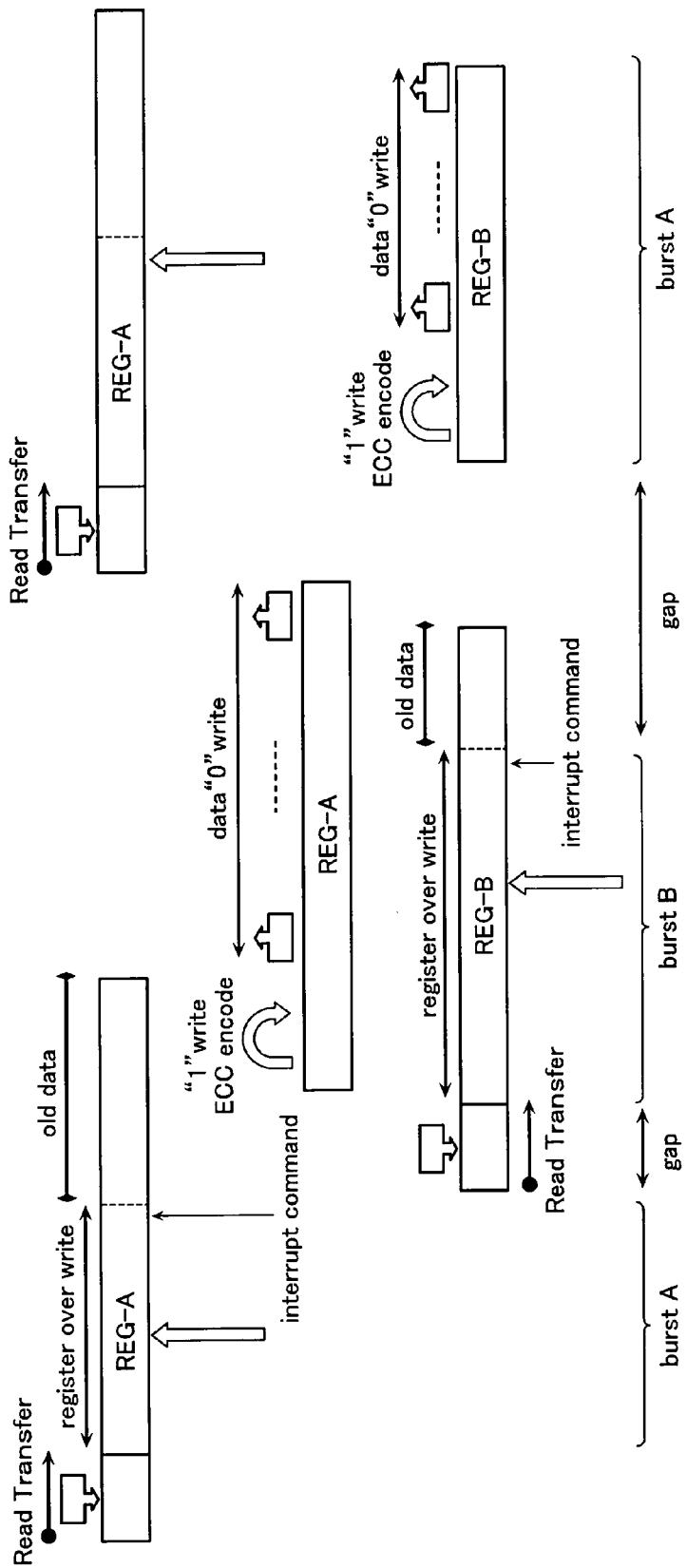
FIG. 50 shows the timing chart of interrupting over-write burst cycle.

FIG. 50 shows a case of interrupting over-write burst cycle, which is performed for over-writing data in a cell array area. It is assumed that external data transfer (burst A) starts for buffer register REG-A. Prior to this external data transfer, read data are transferred and written in the buffer register REG-A in accordance with internal data transfer. This is for assuring the compatibility of the remaining data in the register REG-A after interrupting.

If interrupt command is input halfway during the external data transfer (burst A) in the register REG-A, the external data transfer stops, and read data transfer to the buffer register REG-B is performed for designated burst address. During this internal data transfer, there is generated a gap, and it becomes possible to start the next burst, i.e., external data transfer (burst B).

On the other hand, when read data transfer for the register REG-B is finished, ECC circuit becomes usable. So data in the register REG-A is subjected to ECC-encode process, and simultaneously with it, "1" write within two-step write is performed. Following it, "0" write is performed for the respective groups. The write data transfer from the buffer register REG-A to the cell array ends with the two-step write.

If interrupt command is input in the burst B, the external data transfer stops. However, read data transfer for the register REG-A for preparing the next burst cycle is not able to start until when the internal data transfer, "0" write, for the register REG-A in the previous burst cycle is completed. Therefore, there is generated a gap between the external data transfer operations as shown in the drawing.

The same operation will be repeated hereinafter. There is only one difference between this write burst cycle and a normal write burst such that the external data transfer in the normal write burst is performed for all 128 bits while this write burst is forcedly finished halfway.

Figure 51:
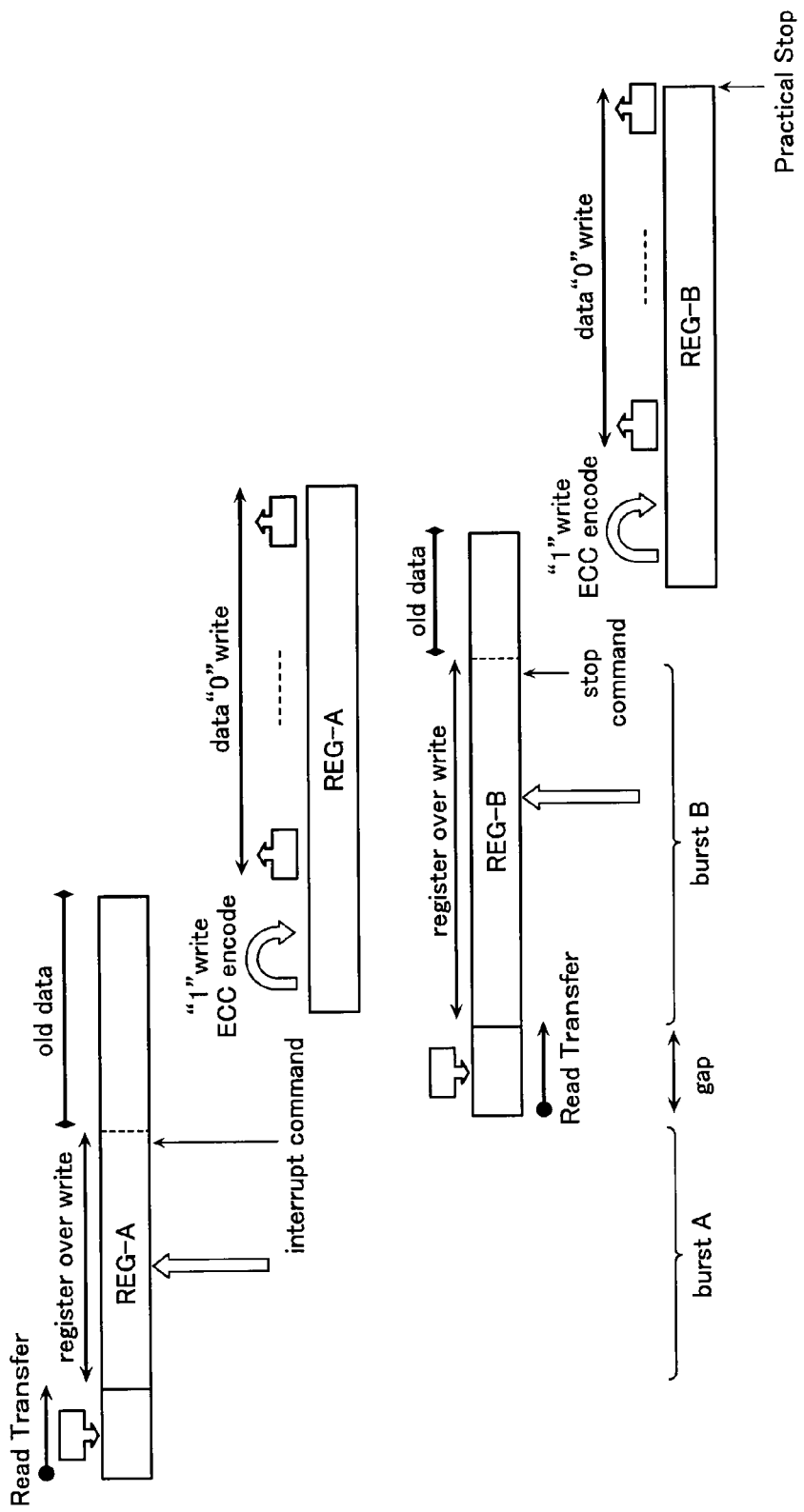
FIG. 51 shows the timing chart of stopping over-write burst cycle.

FIG. 51 shows a case of stopping over-write burst cycle. As similar to that shown in FIG. 50, it is shown that interrupt command is input halfway in the former burst A. If input is not interrupt command but stop command, for example, in the following burst B, the external data transfer of the buffer register REG-B stops, and ECC-encode starts at once, simultaneously with it "1" write in the two steps is performed.

When this "1" write is completed, and after completing the internal data transfer of "0" write from the register REG-A, it becomes possible to start the internal data transfer of "1" write from the register REG-B. When this internal write transfer is finished, the whole data transfer end.

Procedures of Main Operation Modes

External data transfer or internal data transfer is not permitted to go into the following process while sequential operations are continued. If not so, it becomes impossible to keep the compatibility between the stored data and the expected value. FIG. 52 shows a table, in which operation procedures for main operation modes serving as bases of timing specifications are summarized specifically in consideration of completion conditions of the respective operation processes.

In the table shown in FIG. 52, buffer registers REG-A and REG-B used in simultaneously processed operations are simply referred to as "A" and "B", respectively, and operations in the process are shown for the respective buffer registers "A" and "B". There are shown the respective timing points with upward arrows, from which the following operations may start after completion of the previous processes. "Tr." is abbreviation of "Transfer".

(i) Forming Write Burst

It is assumed here that buffer registers are used for this write burst. Since there is no external data transfer, it is possible to do this forming write burst with certain internal circuits and without the buffer registers. However, here is assumed such a case that the buffer registers used in other operations are used without increasing the circuit scale.

In a burst cycle, in which internal data transfer is performed with buffer register REG-B, new burst address is set together with command, and "1" data is set in all latches of buffer register REG-A. When "1" write in accordance with the internal data transfer with buffer register REG-B is completed, "1" data in the buffer register REG-A is internal-transferred at once to the new burst address.

That is, the completion of "1" setting in the buffer register REG-A and that of "1" write internal data transfer with the buffer register REG-B become a condition for starting the following operation process.

This forming write burst is "1" write (i.e., set) into cells, and it becomes possible to do collective write on a selected word line at high speed. And, this is basically performed for all cells. Therefore, it is preferable to perform this forming write burst or other equivalent processes for all cells at a certain device fabrication stage.

(0) "0" all Write Burst

It is also assumed here that buffer registers are used for this write burst. In a burst cycle, in which internal data transfer is performed with buffer register REG-B, new burst address is set together with command, and "0" data is set in all latches of buffer register REG-A.

When "0" write in accordance with the internal data transfer with buffer register REG-B is completed, "0" data in the buffer register REG-A is internal-transferred at once to the new burst address. That is, the completion of "0" setting in the buffer register REG-A and that of "0" write internal data transfer with the buffer register REG-B become a start point of the following operation process.

(1) Read Burst

While the external data transfer of read data is performed with buffer register REG-B, new burst address is set together with command. The burst data of the new address are ECC-decoded and over-written in buffer register REG-A in accordance with internal data transfer. After completing the internal data transfer to buffer register REG-A and external read data transfer with buffer register REG-B, it becomes possible to start the following new external data transfer.

(2) Over-Write Burst

Assume that while the external data transfer is performed for the buffer register REG-B, new burst address is set together with command. After ECC-encoding for data in buffer register REG-A and all "1" write performed in parallel with it, "0" write internal data transfer is performed. After completing the "0" write internal data transfer, new address data is internal-transferred to buffer register REG-A.

After finishing the internal data transfer of ECC-decoded data to buffer register REG-A, and finishing the external data transfer to buffer register REG-B, it becomes possible to start the external data transfer with buffer register REG-A.

(3) "1" only Write Burst

Assume that while the external data transfer is performed for buffer register REG-B, new burst address is set together with command. After completing ECC encoding for data in buffer register REG-A and the following "1" write internal data transfer, "0" data is set in buffer register REG-A.

After finishing the "0" data setting in buffer register REG-A, and finishing the external data transfer in buffer register REG-B, it becomes possible to start the external data transfer for buffer register REG-A.

(4) ECC Refresh Burst

There is no external data transfer operation. It is assumed that new command and burst address are set during the read data internal transfer to buffer register REG-B. After finishing the read transfer in register REG-B, in parallel with ECC-encoding for the read data in buffer register REG-B, "1" write for all cells in the address, to which data in buffer register REG-A is to be transferred. After completing "0" write transfer in accordance with internal data transfer from buffer register REG-A, it becomes possible to start internal data transfer of data read from the new address to buffer register REG-A.

In parallel with this read transfer, internal data transfer will be performed for register REG-B with two steps of "1" write and then "0" write.

Summarizing the data transfer conditions in the operation processes, it will appear the condition for starting new burst. If interruption, this condition will be adaptable for starting a new burst.

That is, in case of setting new burst start address for burst A performed in buffer register REG-A while burst B cycle progresses in buffer register REG-B, it becomes possible to start the new burst cycle when the following conditions (a) to (c) are satisfied in its entirety.

(a) The final transfer in a sequence of burst A ends. In other words, with respect to buffer register REG-A, the whole internal data transfer ends.

(b) Command cycle of burst B and additional "k" cycles lapse. That is, until when "k" cycles lapse after the command cycle for designating the command input start, it is impossible to start a new burst.

(c) The cycle or data transfer in burst B ends. Since buffer register REG-B is in burst, when the external or internal data transfer with register REG-B ends, it becomes possible to start a new burst.

The above-described final condition (c) becomes burst specifications of normal continuous burst, interrupt, ECC refresh, "0" all write burst and the like in accordance with the finishing ways of the burst cycle or data transfer as follows:

(A) In case of waiting the full burst finishing, it becomes "continuous burst", in which burst cycles are continuously exchanged.

(B) In case of the same burst as in command cycle plus "k"-cycles, it corresponds to "burst interrupt".

(C) If internal data transfer is finished without burst cycle, it is a mode without external data transfer, and it corresponds to "ECC refresh burst" or ""0" all write burst".

Next, the timing specification of interrupt of burst cycle will be explained in detail below.

New Burst Start Address Command Timing in Read Burst Cycle

Figure 53:
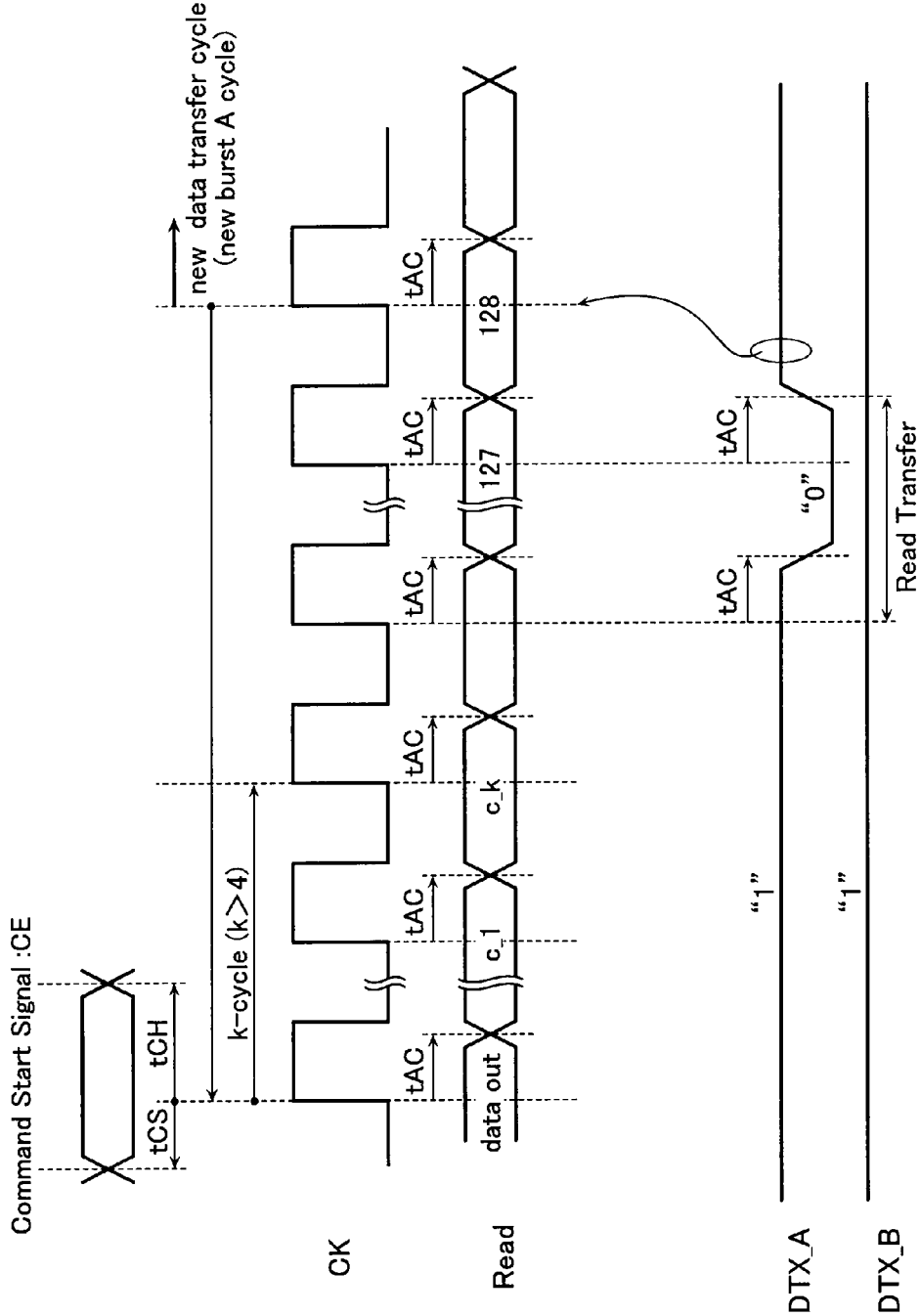
FIG. 53 shows the address command specification for starting a new burst cycle in read burst cycle.

With respect to a case where external data transfer is a read burst mode, the timing specification of the new burst start address command will be explained with reference to FIG. 53. Set at when the new burst is to be started (i.e., new data cycle is to be started) is command start signal CE, which instructs the start of command acceptance.

This command start signal CE has set-up time tCS and hold time tCH defined on the base timing, i.e., clock edge, and data to be output from the buffer register is output during the access time tAC from the clock edge.

Command code and address bit are received from a clock followed the clock cycle, in which the command start signal CE is received. With respect to the presently progressing burst data, after all 128-cycle data are output, the following new burst cycle starts. In case of "interrupt" or "stop", after finishing "k"-cycle data output ("k" is an integer, e.g., k>4, counted from the command start cycle, and "k"-cycle means a command decode time), it will be stopped the data transfer presently progressing between the buffer register and the external. "k"-cycle is defined as explained above in relation to the command start signal cycle, and mode setting and new burst address taking-in are performed within it.

The cycle of command start signal CE is to be set in consideration of the new data transfer cycle to be started. It may be generated due to CE setting timing such a situation that the new burst preparation or presently progressing data transfer performed in parallel with the burst to be interrupted or stopped become impossible. In consideration of this situation, data transfer signals DTX_A and DTX_B are output from the memory for designating the internal data transfer states in the buffer register REG-A and REG-B (for example, one of these buffer is busy in the internal data transfer), respectively.

For example, while buffer register REG-A is using the internal data bus for the new internal data transfer, and then the ECC circuit is active, there is output DTX_A="0"(="L"). By contrast, while buffer register REG-B is using the internal data bus for the new internal data transfer, and then the ECC circuit is active, there is output DTX_B="0"(="L").

Explaining in other words, when buffer registers are in an external data acceptable state, DTX_A or DTX_B becomes "1". These signals are exchanged in level becomes synchronously with the clock after finishing the internal data transfer between the cell array and the corresponding buffer register. The signal exchanging timing is tAC measured from the clock edge as similar to the data output.

The new burst cycle or the new data transfer cycle starts after at least "k" cycles or more lapsed from the command setting cycle and at a cycle after when the signal DTX_A or DTX_B is exchanged in level to the state usable for the data transfer in accordance with the command-set cycle.

To avoid gap generation during the continuous burst cycles without interruption, it should be noticed the following point. That is, if DTX_A is "1" in the command start cycle, it is possible to do internal data transfer for buffer register REG-A, and it is in need of taking 900 ns or more until when DTX_A becomes "0" after the internal read data transfer is executed for buffer register REG-A. Therefore, in case the clock cycle is set to have 128 cycles corresponding to about 900 ns burst, it is necessary to set the next burst address soon after the burst exchange.

New Burst Start Address Command Timing in Write Burst Cycle

Next, with respect to a case where external data transfer is a burst write mode, the timing specification of the new burst start address command will be explained with reference to FIG. 54. Here is assumed that write is "1" only write, and forming write burst, "0" all write burst, over-write burst and ECC refresh burst are excluded. These excepted write modes will be additionally explained in brief later only with respect to different points.

Command start signal CE is set when new burst is to be started (i.e., new data transfer cycle is to be started), which instructs the start of command acceptance. This is the same as in the read burst described above. Data input to the buffer register is defined by set-up time tCS and hold time tCH.

From a clock followed the clock cycle, in which the start signal CE is accepted, command code and address bits are received. With respect to the presently progressing burst data, after all 128-cycle data are input, the following new burst cycle starts. In case of "interrupt" or "stop", after finishing "k"-cycle data input ("k" is counted from the command start cycle, and "k"-cycle means a command decode time), it will be stopped the data transfer presently progressing between the buffer register and the external. Mode setting and new burst address taking-in are performed during "k" cycle.

The cycle of command start signal CE is to be set in consideration of the new data transfer cycle to be started. It may be generated due to CE setting timing such a situation that it becomes impossible to prepare the new burst or stop the presently progressing data transfer performed in parallel with the burst to be interrupted or stopped. In consideration of this situation, data transfer signals DTX_A and DTX_B are output from the memory for designating the internal data transfer states in the buffer register REG-A and REG-B (for example, one of these buffer registers is busy in the internal data transfer), respectively.

For example, while buffer register REG-A is using the internal data bus for ECC processing and for the new internal data transfer, there is output DTX_A="0"(="L"). By contrast, while buffer register REG-B is using the internal data bus for ECC processing and for the new internal data transfer, there is output DTXB="0"(="L").

Explaining in other words, when buffer registers are in an external data acceptable state, DTX_A or DTX_B becomes "1" while these signals are kept in "0" until when data to be subjected to internal data transfer are stored in the buffer registers and new external data transfer becomes possible. Further, while "0" data is set in the registers, these signals are "0".

The new burst cycle or the new data transfer cycle starts after at least "k" cycles or more lapsed from the command setting cycle and at a cycle after the signal DTX_A or DTX_B is exchanged in level to the state usable for the data transfer in the command-set cycle.

If buffer register REG-A is released from the internal data transfer in the command start cycle or thereafter, set "0" data in it from the data transfer end timing, and it is generated DTX_A="1" when "0"-setting ends. It becomes possible to start a new burst cycle after completing this set operation.

Since "0" setting in the buffer register will be finished in several clock cycles, "α", it is necessary to set the command start cycle at least "k+α" cycle before prior to the ending time of 128 burst cycle. If the new burst cycle starts, ECC processing and internal data transfer starts in buffer register REG-B. Finishing this operation, buffer resister REG-B is set with "0", and DTX_B becomes "1".

In case of the forming write burst, there is not used the external data transfer between the buffer register and the external. Therefore, there is not used the timing specification in relation to write data inputting explained in FIG. 54. In addition, the buffer register after the command start cycle is set with "1" data in place of "0" data as explained in FIG. 54, and the new burst cycle starts for internal-transferring this "1" data. Therefore, the command sequence is controlled with interrupt command.

Figure 54:
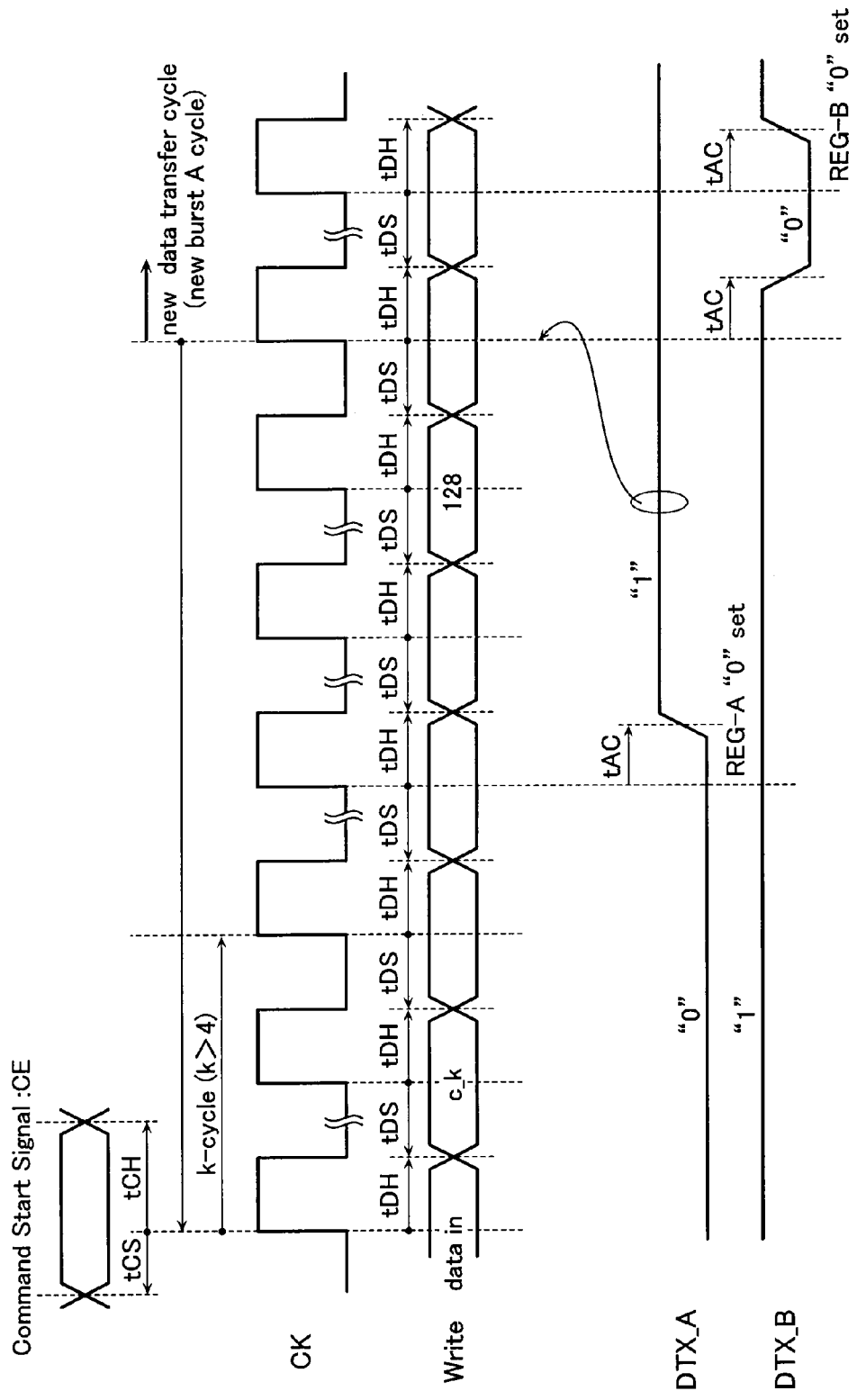
FIG. 54 shows the address command specification for starting a new burst cycle in write burst cycle.

Also in case of "0" all write burst, there is also not used the external data transfer and the timing specification in relation to write data inputting explained in FIG. 54. In addition, the buffer register is set with "0" after the command start cycle as similar to FIG. 54, and the new burst cycle starts soon for internal-transferring this "0" data. Therefore, the command sequence is controlled with interrupt command.

In case the internal data transfer starting as the new burst cycle is "0" write transfer, it is in need of grouping the cells, and it takes a long time of about several μs. This is reflected on that it takes a long time to exchange the state of DTX_A and DTX_B, and it becomes difficult to start a new burst soon.

The over-write specification is about the same as "0" only write burst shown in FIG. 54. The differences are as follows. In case of over-write burst, internal read transfer to the register REG-A is performed in place of "0" set operation in the buffer register REG-A, so that the register is previously set with data of the new burst address with about 900 ns taken. The internal data transfer performed as the new burst cycle includes "0" write, and it takes a long time of about several μs due to multi-group transferring, so that there is inevitably generated a large gap during the external data transfer. This is reflected on that it takes a long time to exchange the state of DTX_A and DTX_B, and it becomes difficult to start a new burst soon.

In case of ECC refresh burst also, there is not used the external data transfer and the timing specification in relation to write data inputting explained in FIG. 54. Therefore, the command sequence is controlled with interrupt command.

In addition, in place of "0" set operation to the buffer register shown in FIG. 54, internal read data transfer is performed. Therefore, it takes about 900 ns to previously set with data of the new burst address in the register, and it takes a long time of about several μs to perform "0" write in accordance with the internal data transfer for multiple cell groups. This means that the cycle time becomes long. This is reflected on that it takes a long time to exchange the state of DTX_A and DTX_B, and it becomes difficult to start a new burst soon.

ECC refresh burst is performed only for burst addresses to be refreshed. Next, a method of extracting the burst addresses to be refreshed will be explained.

In case of read burst, read data is previously internal-transferred to the buffer register, and ECC-decoded to correct data. The ECC system is constructed to output various information signals for designating the error states. For example, it is constructed to generate a kind of warning signal "correctable max" when the number of errors is over a certain value, or reaches the maximum value permitted in the system or near it.

Every time this "correctable max" is output, the corresponding burst addresses are stored in a memory circuit as refresh addresses, which are not erased until when ECC refresh is performed.

The memory circuit for storing the refresh addresses is prepared as a specified area in the cell array, or as another latch cell array disposed independently of the normal cell array.

Figure 55:
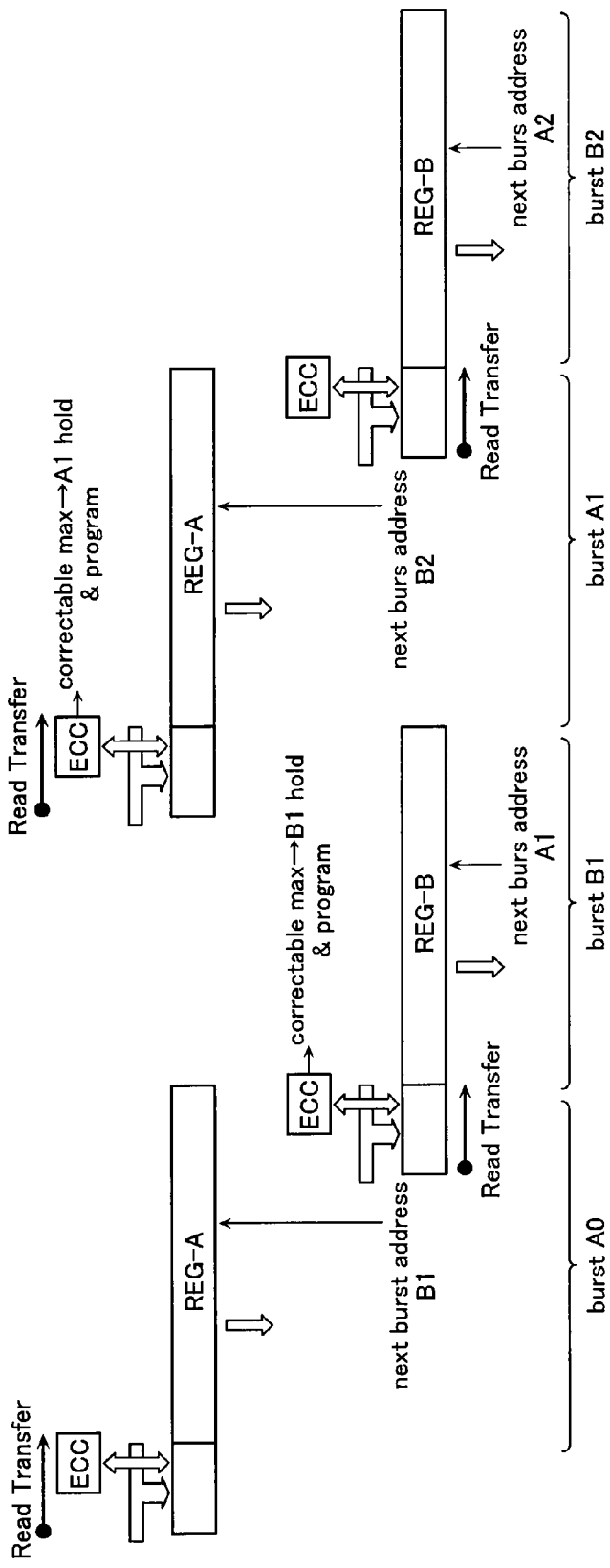
FIG. 55 shows the address extraction method used in read burst and ECC refresh burst.

FIG. 55 shows an ECC refresh address setting example. In burst of address A0 in buffer register REG-A (referred to as "burst A0"), next burst address B1 is set, and read data is internal-transferred to buffer register REG-B. It is assumed that signal "correctable max" is generated as a result of the ECC-process at this procedure.

At this time, the burst address B1 is stored as a refresh address in a non-volatile manner. Then, in burst B1, next burst address A1 is set, and read data is internal-transferred to buffer register REG-A. Assuming that signal "correctable max" is generated as a result of the ECC-process at this procedure, burst address A1 also is stored as a refresh address.

During external data transfer performed for ECC-processed data in buffer register REG-A (burst A1), next burst address B2 is set, and read data is internal-transferred to buffer register REG-B. Assuming that ECC correction is performed with a margin at this time, the sequence continues as it is.

Figure 56:
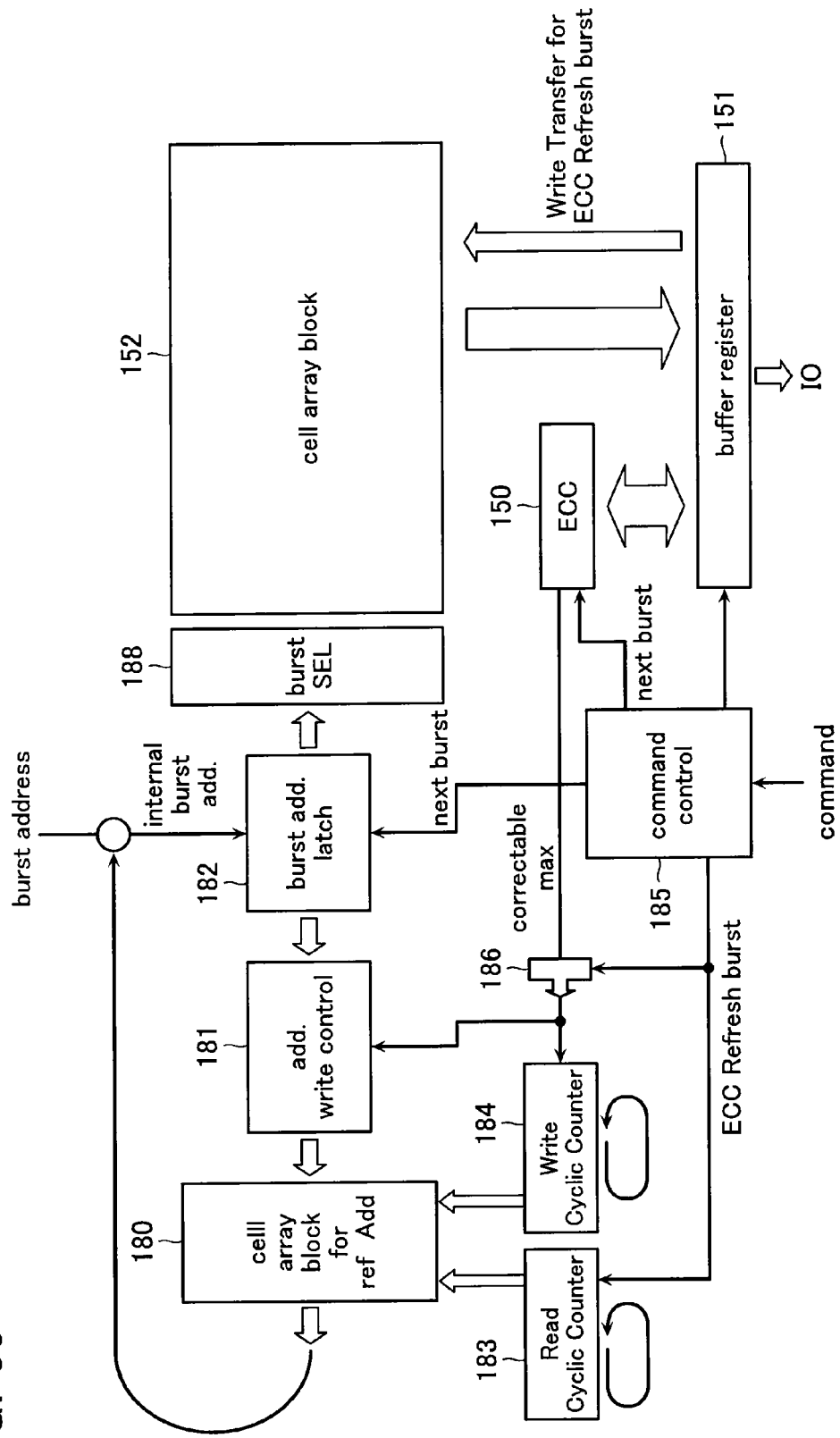
FIG. 56 shows the circuit block for storing and generating refresh addresses.

FIG. 56 shows a circuit block used for storing the refresh addresses and for controlling ECC refresh burst with the refresh addresses.

Main cell array block 152, buffer register 151 and ECC circuit 150 are attached with the same reference numbers as in FIG. 19. Cell array block 180 is a non-volatile memory circuit prepared for storing the refresh addresses. As described above, this memory circuit is prepared in practice as a specified area in the cell array block 152, or as another latch cell array disposed independently of the cell array block 152.

Command being input, next burst address is output from command control circuit 185, and it is transferred to not only burst address latch circuit 182 but also ECC circuit 150 and buffer register 151. The stored burst address is supplied to burst selection circuit 188 prepared for accessing the cell array block 152, and stored in cell array block 180 as a refresh address if necessary.

Burst selection circuit 188 is a kind of decoder, which selects the burst address. Read data of the selected address is internal-transferred to buffer register 151, and ECC-processed data is over-written in it.

During this ECC-processing, if the number of corrected errors reaches a correctable limit or near, signal "correctable max" is output, and it is transferred to address write control circuit 181 for write-controlling the cell array block 152 and write-use cyclic counter 184 via gate 186.

Write-use cyclic counter 184 is for cyclically accessing the cell array block 180 to designate write address thereof while address write control circuit 181 is for controlling data (i.e., refresh address) write into the cell array block 180. With these circuits, the burst address is stored at a new memory position as a refresh address every time when signal "correctable max" is generated.

In a refresh operation, when it is judged in the command control circuit 185 that the input command is ECC refresh-use one, ECC refresh burst address signal is transferred to read-use cyclic counter 183. The next burst address signal is transferred to burst address latch 182; and data thereof is transferred to buffer register 151 and ECC circuit 150.

The read-use cyclic counter 183 is for cyclically accessing the cell array block 180 to read data (i.e., refresh addresses), and to set them as burst addresses. That is, in place of the externally supplied address, refresh addresses stored in the cell array bloc 180 are used as burst addresses in the ECC refresh burst cycle. Burst data read in the buffer register 151 from the cell array block 152 with these burst addresses are ECC-refreshed and write-transferred to the cell array block 152 as it is.

In the ECC refresh cycle, "correctable max" signal generated from ECC circuit 150 is blocked and not transferred to the address write control circuit 181 and write-use cyclic counter 184. In addition, in the ECC refresh cycle, data in the buffer register 151 is not transferred to the external.

Although the ECC refresh addresses are stored in a nonvolatile manner in the cell array block 180, the capacity is not set to be too large. Therefore, when the refresh addresses become a certain amount stored, cell data are over-written in accordance with these refresh addresses cyclically used. Used for cyclically accessing the refresh addresses are write-use cyclic counter 184 and read-use cyclic counter 183.

The cell array block 180 is cyclically accessed to store address data. This stored address data are, as if running after the write access points, read out to be used for ECC refresh. The address data used for ECC refresh are over-written in cyclic write operations to serve as new ECC refresh address data.

The operation procedures of write-use cyclic counter 184 and read-use cyclic counter 183 will be explained below.

Figure 57:
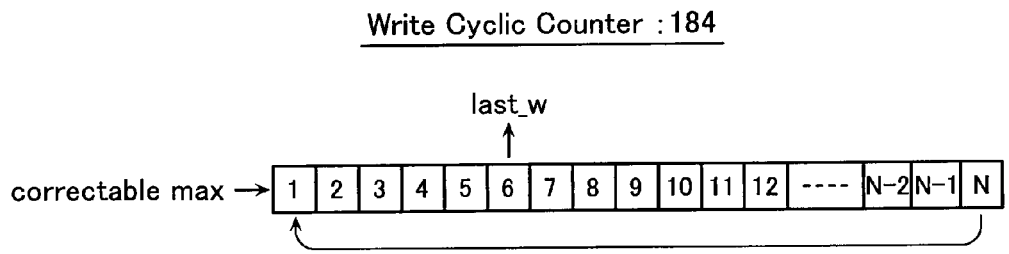
FIG. 57 shows a write-use cyclic counter.
Figure 58:
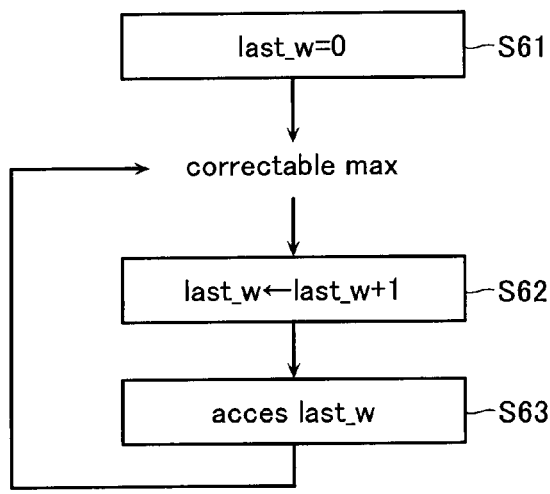
FIG. 58 shows the operation flow of the write-use cyclic counter.

FIGS. 57 and 58 show the write-use cyclic counter 184 and operation flow thereof. Assume that the last written counter number is "last_w", and the output is defined as last_w+1 (mod N), where "N" is the number of counter units.

As shown in FIG. 58, in the initial access operation, "last_w" is reset to "0" (step S61). Thereafter, "1" is added to "last_w" every time when "correctable max" is input (step S62), and "last_w" position in the cell array block 180 is accessed and data is written in it (step S63).

Figure 59:
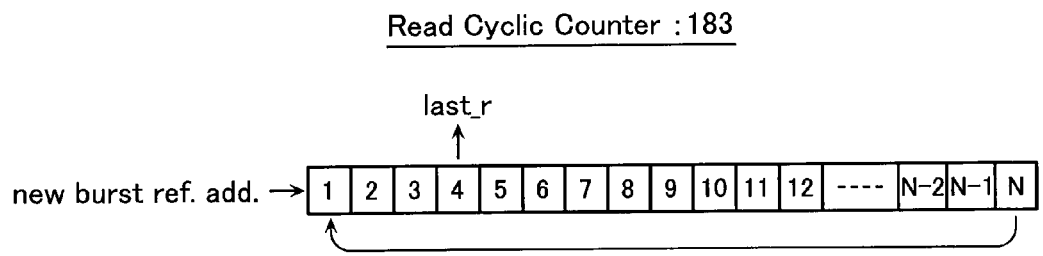
FIG. 59 shows a read-use cyclic counter.
Figure 60:
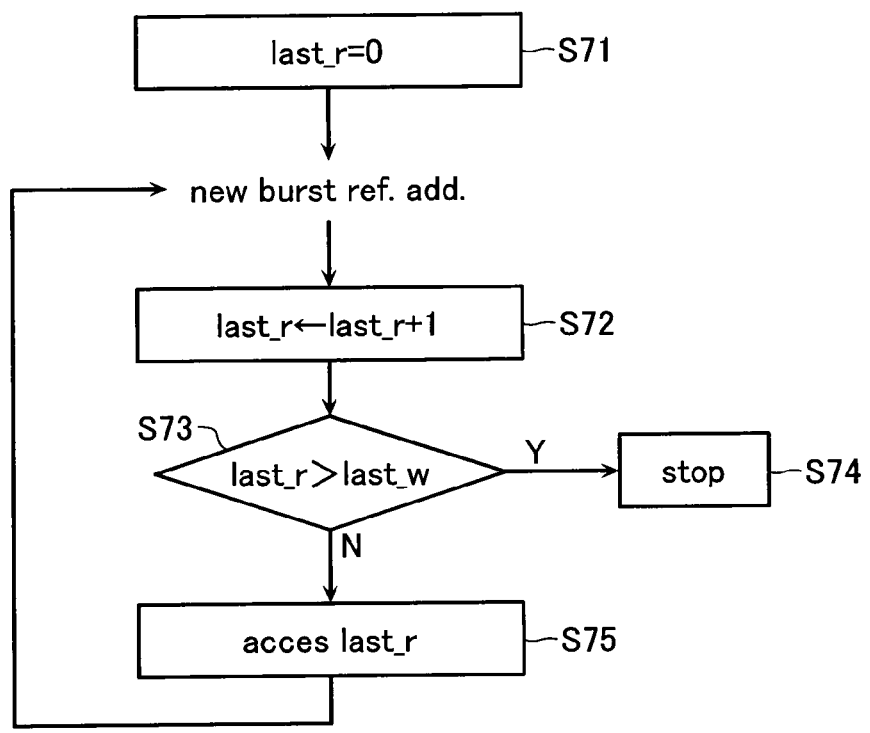
FIG. 60 shows the operation flow of the read-use cyclic counter.

FIGS. 59 and 60 show the read-use cyclic counter 183 and operation flow thereof. It is assumed here that the last read counter number is "last_r". As shown in FIG. 60, in the initial access operation, "last_r" is reset to "0" (step S71). Thereafter, when a new refresh burst address is required in the ECC refresh burst setting operation, "1" is added to "last_r" (step S72). Then it is judged whether "last_r" is over "last_w" or not (step S73). If last_r>last_w, it designate that all refresh addresses have been processed, so that the operation flow stops (step S74).

If "last_r" is not over "last_w", "last_r" position in the cell array block 180 is accessed, and refresh is performed at this refresh address (step S75). This counter 183 is cyclic one, and it is the same as the write-use cyclic counter 184 that the output is defined as last_r+1 (mod N).

Figure 61:
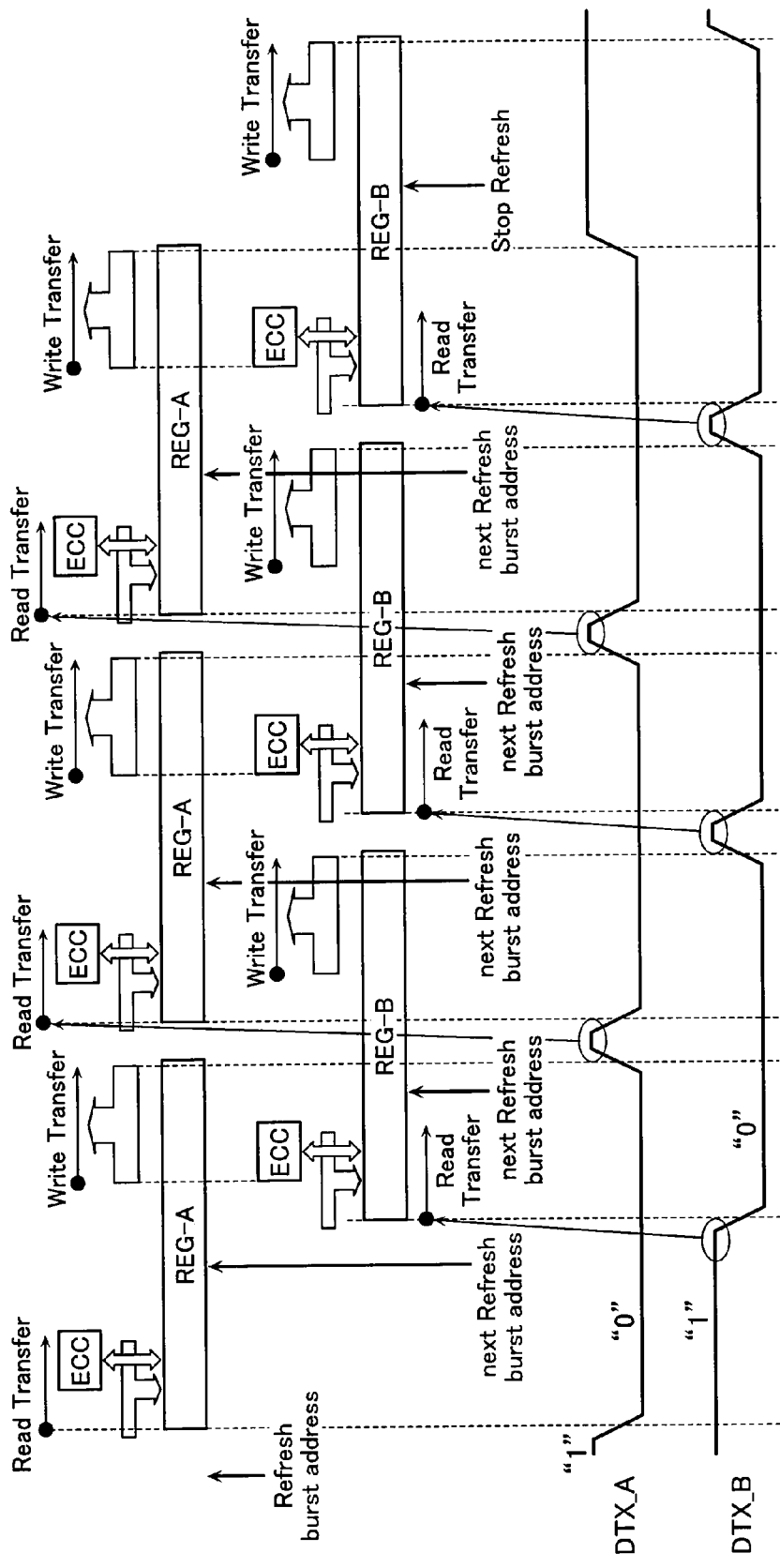
FIG. 61 shows the operation timing chart for explaining the ECC refresh address setting.

Next, the ECC refresh burst address setting and the refresh data transfer operation sequence will be explained with reference to FIG. 61. Judging that the memory is in an idle state, in which the memory is not accessed for the external data transfer, the ECC refresh operation is performed for the collected refresh addresses. FIG. 61 shows a sequence of the continuous refresh burst cycles.

When ECC refresh burst starts and a refresh address is set, read transfer (i.e., internal data transfer) is performed for buffer register REG-A, which is adaptable for internal data transfer, and the read data is ECC-decoded. During this time, the next refresh burst address is set.

The new set refresh burst address becomes the read transfer address for buffer register REG-B, which is adaptable for internal data transfer with DTX_B="1"(="H"). Soon after the read data is subjected to ECC-process and the internal data bus is released, write transfer (i.e., internal data transfer) is performed for buffer register REG-A.

This write transfer is for over-writing data in the burst address of the cell array, and error-corrected data in the register REG-A are written back, so that correct burst data will be restored. Corrected here are at most several bits. Therefore, "0" write in the current mode may be performed in a lump, and the internal data transfer may be completed only with two steps of "1" write and "0" write. In other words, it becomes possible to do the internal data transfer at higher speed in comparison with the normal over-write transfer.

When the next burst address is set, new read data transfer is performed for register REG-A after waiting the release of the internal data bus (DTX_A="1"). When ECC process starts in the register REG-A, write transfer (internal data transfer) is performed for data in the register REG-B. The same operations as described above will be repeated.

Finally, to finish the ECC refresh, stop refresh command is set. In receipt of it, ECC refresh burst ends after write-transferring the remained data in the buffer register.

Figure 62:
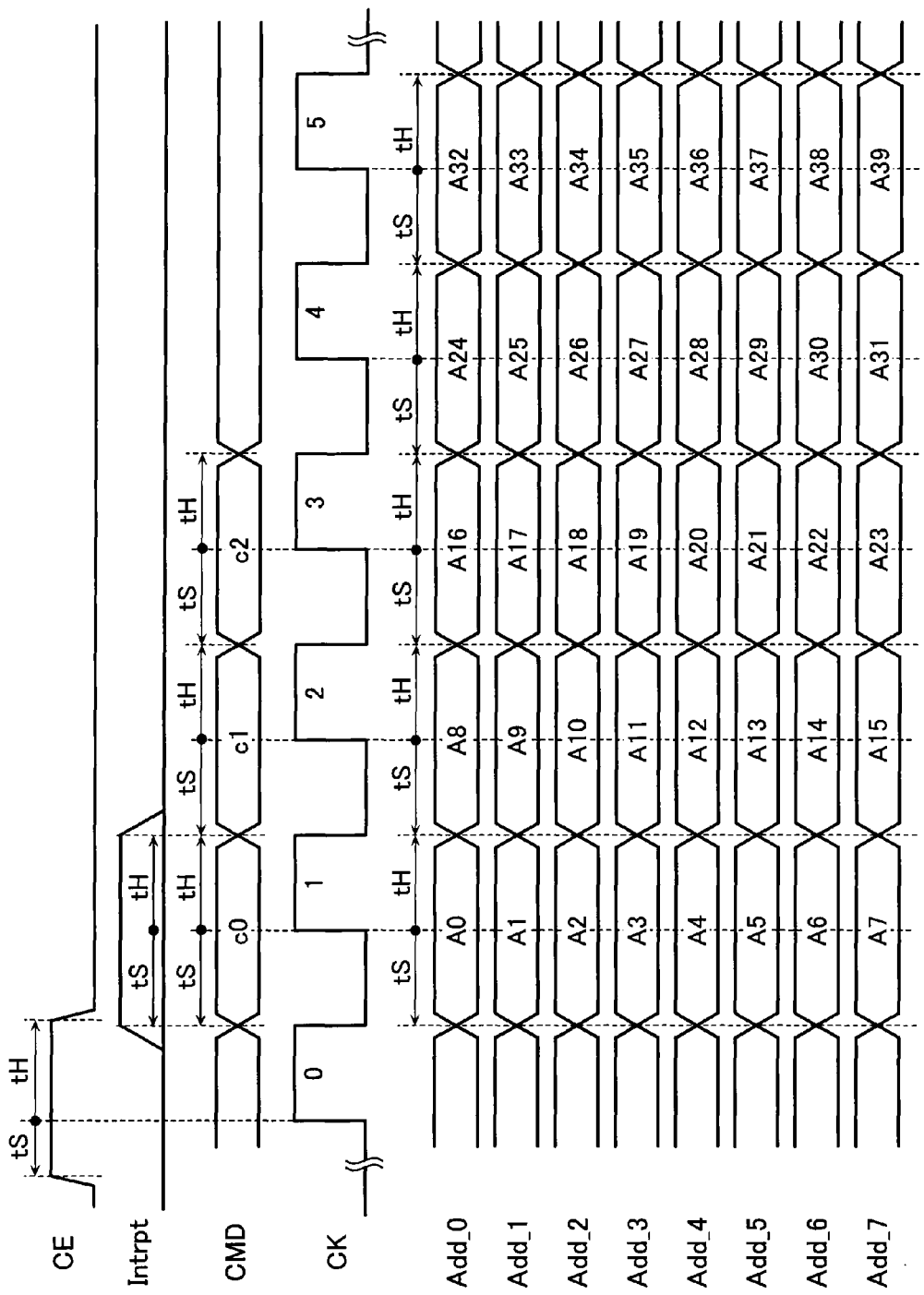
FIG. 62 shows various kinds of signals used for controlling the memory.

FIG. 62 shows the signals to be input to the chip pins in relation to the memory control excepting the power supply. Clock CK is a basic clock signal for synchronously controlling the memory. In a DDR (Dual Data Rate) scheme, complementary clock CKB may be used in combination with CK, or strobe signal DQS may be additionally used.

Command start signal CE is used for activating command and address receivers and decoders with only one receiver activated. That is, CE prevents all signal receivers and decoders from being activated every cycle, and serves for suppressing the wasteful power consumption. In detail, one receiver for receiving CE becomes inactive during a period defined by certain cycle numbers when detecting CE="H" while the remaining receivers become active during the period.

Command CMD is a signal for coding command, which designates an operation mode. Interrupt command "Intrpt" is a command signal for interrupting a burst cycle, and designating to progress to the next burst.

Address Add_0~Add_7 designate address bits A0~A39. There is not shown in FIG. 62 the following signals: input/output IO0~IO15, which are 16-bit input/output data; and data transfer signal DTX_A, DTX_B, which designate data transfer states on the internal data bus, and external and internal data transferable periods.

Next, main burst mode signals and command codes thereof, and address setting example will be explained with reference to FIG. 63.

Command input cycle will start as follows: Initially set command start signal CE to be "H" at a certain cycle; and then take in a certain level at a clock edge. When a command cycle starts, input buffers are activated for receiving other signals, and data are taken in the successive cycles to be decoded, so that an internal operation mode is decided.

Shown in FIG. 62 is an SDR (Single Data Rate) scheme, in which only clock-rising edges are used as base timings. However, a DDR scheme may be used in this embodiment. Assuming that the CE taking-in cycle is "0", command bits "c0", "c1" and "c2" are taken in at clock cycles "1", "2" and "3", respectively. In case of interrupting a burst cycle, interrupt signal "Intrpt" is taken in at clock cycle "1". In accordance with Intrpt="H", the burst cycle is interrupted, and a new burst cycle will be prepared.

When CE is decided, CE receiver becomes inactive during clock cycles "0" to "5" while other receivers become active in this example. With the active/inactive operation of the receivers, it will be suppressed the power consumption in the input waiting state of the receivers.

FIG. 63 shows the command code examples and operation modes designated by them. That is, designates read burst; "over W" designates over-write burst; "0 all W" designates "0" all write burst; "0 only W" designates "0" only write burst; "1 only W" designates "1" only write burst; "Stop" designates burst stop; "Refresh" designates ECC refresh burst; and "Forming" designates forming write burst.

One example of the address bit assignment also is shown in FIG. 63. That is, in case of ×16IO, A0~A21 designate a burst position in a mat; A22~A28 designate the head address of a burst cycle; and A29 and the following bits designate address bits used for mat-selecting.

The memory specification described in the embodiment is summarized as a "write and read isolated mode (WRIM)", in which a write period and a read period are not overlapped each other. This is an effective method for hiding low-speed write data type out of the sight and making the high-speed property of the memory effective in a case where write properties of data "0" and "1" are largely different from each other. However, WRIM brings limitation of the adapting mode when circulating the memory device in the market.

Figure 64:
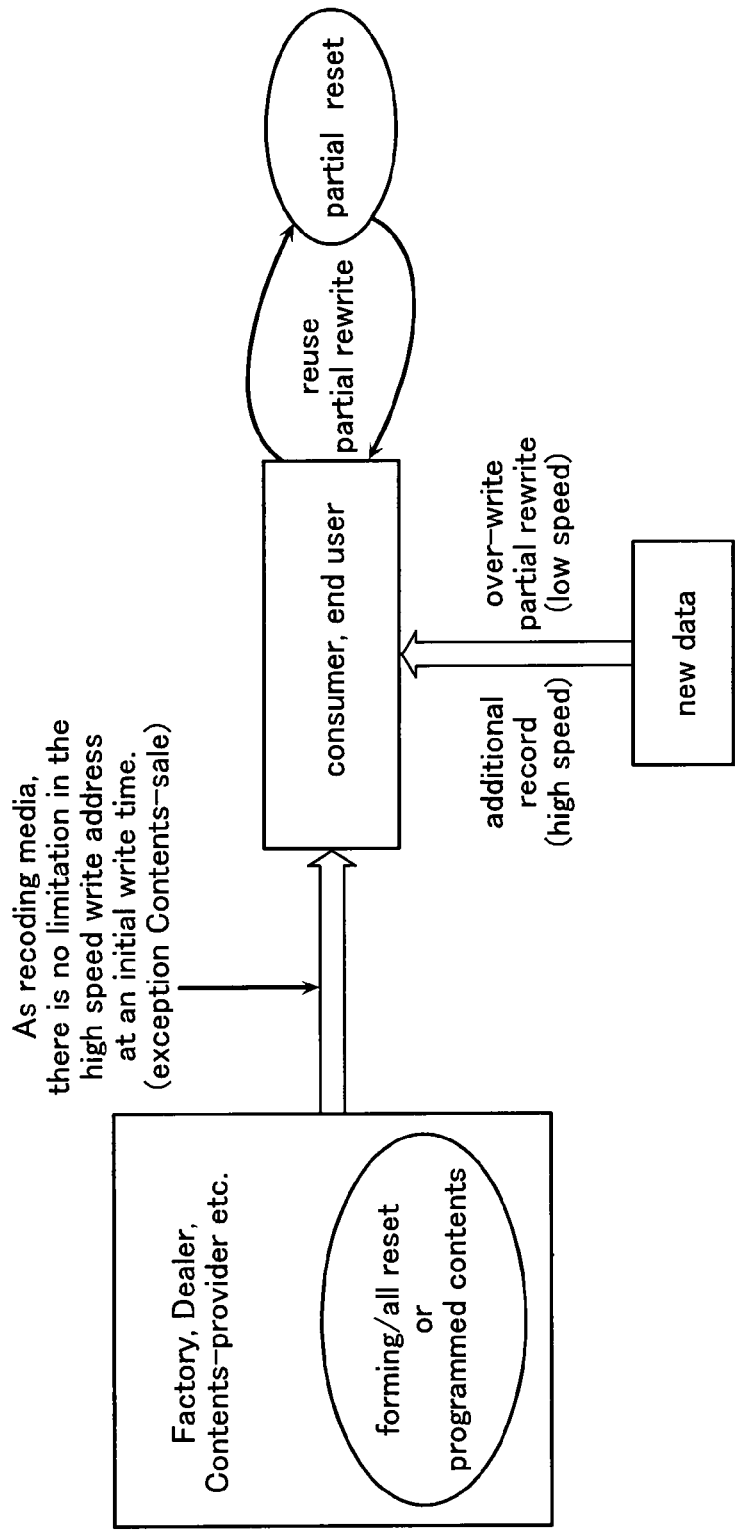
FIG. 64 shows the embodying mode of WRIM in the memory in accordance with the embodiment.

The limitation of the adapting mode will be summarized as shown in FIG. 64.

There is a previous stage such as a factory, a dealer, a contents-provider and the like where the memory device is not yet given to a consumer. Assuming that the consumer recodes data in the memory device, it is desirable that the memory device has been forming-processed and all cells have been reset. This corresponds to the embodiment described above, in which the reset operation needs a longer time than the set operation.

Additionally assuming that data contents stored in the memory device is dealt with goods, in the previous stage, "programmed contents" is written as data in the memory device. Assuming that the consumer uses the memory device as a recording media, "1" only write burst mode is desirable for writing data at high speed, and it is required of all cells to be set in a "0" data state. This assures that there is no limitation in the burst address to be performed with high speed "1" only write burst.

After the memory device is given to the consumer, i.e., an end user, the initial write may be performed at high speed. That is, dealing with the memory device in such a way that new data is additionally recoded in a vacant area, the high speed property is maintained as it is, and it becomes possible to recode high definition and large capacity of image data, or down-load contents delivered from a retailer or at a store.

Data recoded in the memory device is often required to be over-written or partially rewritten. In this case, it is not adaptable the high speed write mode. However, using the over-write burst mode, it becomes possible to rewrite data without any trouble.

When the memory capacity has been lacked, to erase unnecessary data and increase the memory capacity, and to rewrite a reused part of the memory device, it becomes possible to perform a partial "1" reset mode, which partially resets a memory area to be reused, by use of "0" all write burst. As a result, it becomes possible to adapt again the high speed write mode for the memory area.

The embodiments described above will be summarized as follows:

(M1) A resistance change memory device including a cell array, in which memory cells are arranged, the memory cell being reversibly set in one of a first data state and a second data state defined in accordance with the difference of the resistance value, wherein the memory device has a data write mode including: a first write procedure for writing the first data in at least cells to be written in the first data state in a selected cell area in the cell array; and a second write procedure for writing the second data in the remaining cells to be written in the second data state (refer to FIGS. 24, 25, 28 and 30).

(M1-1) The resistance change memory device defined in (M1), wherein the memory cell has such a property that the time necessary for writing the second data is twice or more as long as the first data, and wherein the first write procedure is for writing the first data in all cells in the selected cell area in a lump, and the second write procedure is for sequentially writing the second data in multiple cell groups sectioned in the selected cell area on the condition that the total cell current of simultaneously written cells is limited under a permissible value (refer to FIGS. 25 and 28).

(M1-2) The resistance change memory device defined in (M1-1), wherein the first write procedure is for reforming cell data in the selected cell area.

(M1-3) The resistance change memory device defined in (M1-1), wherein the first and second write procedures are for refreshing cell data in the selected cell area.

Figure 30:
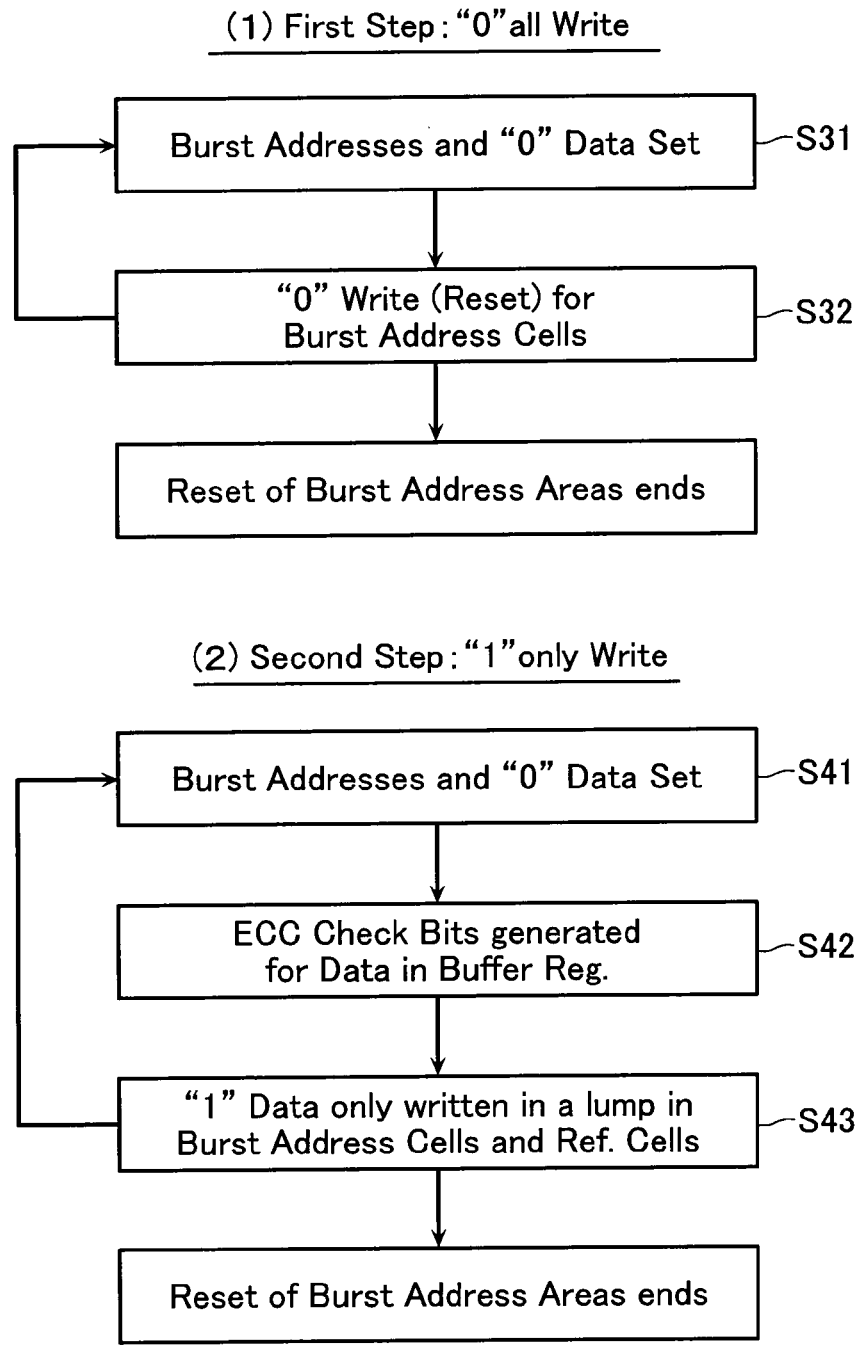
FIG. 30 shows "1" only write procedure.

(M1-4) The resistance change memory device defined in (M1), wherein the memory cell has such a property that the time necessary for writing the first data is twice or more as long as the second data, and wherein the first write procedure is for initializing all cells in the selected cell area in the first data state, and the second write procedure is for writing the second data in the cells to be written in the second data state in the selected cell area in a lump (refer to FIG. 30).

(M1-5) The resistance change memory device defined in (M1-4), wherein the first write procedure is for sequentially writing the first data in multiple cell groups sectioned in the selected cell area on the condition that the total cell current of simultaneously written cells is limited under a permissible value.

(M1-6) The resistance change memory device defined in (M1-4), wherein the first write procedure is for initializing all cells in the cell array.

(M1-7) The resistance change memory device defined in 1, further including:

an ECC circuit configured to encode write data to be written into the cell array, thereby generating check bits to be stored in the cell array together with the write data, and decode read data read from the cell array to detect and correct errors; and a buffer register configured to temporally store read data and write data of the cell array.

(M1-8) The resistance change memory device defined in (M1-7), wherein in the data write mode, the first write procedure is performed for encoding the write data stored in the buffer register with the ECC circuit, and write-transferring the first data in the cell array simultaneously with the encoding process while the second write procedure is performed for write-transferring the second data in the write data in the cell array after the encoding process (refer to FIG. 21).

Figure 29:
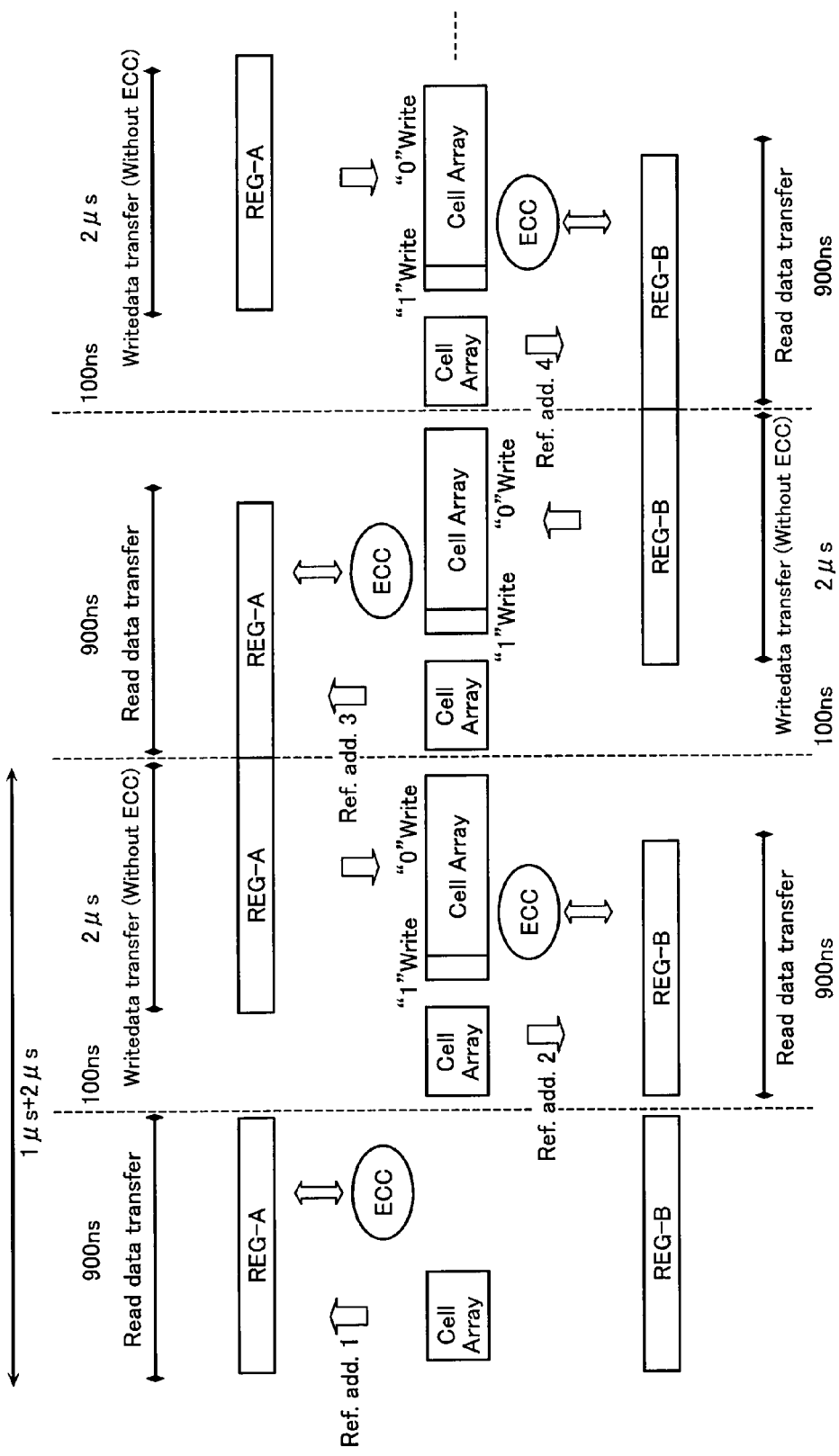
FIG. 29 shows a refresh burst cycle.

(M1-9) The resistance change memory device defined in (M1-7), wherein
the data write mode is a data refresh mode for refreshing data in the cell array, in which read data read from the cell array in the buffer register are decoded with the ECC circuit and over-written in the buffer register; and the first and second write procedures are sequentially performed for transferring the over-written data to the cell array (refer to FIG. 29).

(M1-10) The resistance change memory device defined in (M1-7), wherein
there are disposed two systems of the buffer registers serving for alternately burst-transferring read or write data.

(M2) A resistance change memory device including a cell array, in which memory cells are arranged, the memory cell being reversibly set in one of a first data state and a second data state defined in accordance with the difference of the resistance value, the time necessary for writing the first data being twice or more as long as the second data, wherein
the memory device has a data write mode including: a preliminary write operation for writing the first data in all cells in a selected cell area in the cell array; and a collective write operation for writing the second data in cells to be written in the second data state.

(M2-1) The resistance change memory device defined in (M2), wherein
the preliminary write operation is for initializing all cells in the selected cell area in the first data state.

(M2-2) The resistance change memory device defined in (M2), wherein
the preliminary write operation is for sequentially writing the first data state in multiple cell groups sectioned in the selected area on the condition that the total cell current of simultaneously written cells is limited under a permissible value.

(M3) A resistance change memory device including:
a cell array, in which memory cells are arranged, the memory cell being reversibly set in one of a first data state and a second data state defined in accordance with the difference of the resistance value, the time necessary for writing the first data being twice or more as long as the second data;
an ECC circuit configured to encode write data to be written into the cell array, thereby generating check bits to be stored in the cell array together with the write data, and decode read data read from the cell array to detect and correct errors;
a buffer register configured to temporally store read data and write data of the cell array; and
a data write mode for preliminarily writing the first data in all cells in a selected cell area in the cell array, and then writing only the second data within write data loaded in the buffer register in the selected cell area in a lump, the write data being encode-processed with the ECC circuit and over-written in the buffer register.

(M3-1) The resistance change memory device defined in (M3), wherein
there are disposed two systems of the buffer registers, and wherein
in the data write mode, while write data loaded in one of the two systems of the buffer registers are encode-processed with the ECC circuit and write-transferred to the cell array, next write data are transferred to the other buffer register.

(M3-2) The resistance change memory device defined in (M3), wherein
the preliminarily writing procedure is for sequentially writing the first data state in multiple cell groups sectioned in the selected cell area on the condition that the total cell current of simultaneously written cells is limited under a permissible value.

(M4) A resistance change memory device including:
a cell array, in which memory cells are arranged, the memory cell being reversibly set in one of a first data state and a second data state defined in accordance with the difference of the resistance value;
an ECC circuit configured to encode write data to be written into the cell array, thereby generating check bits to be stored in the cell array together with the write data, and decode read data read from the cell array to detect and correct errors;
a buffer register configured to temporally store read data and write data of the cell array; and
a data refresh mode for reading data from a certain cell area in the cell array to the buffer register, decoding the read data with the ECC circuit, and then over-writing the decoded data in the certain cell area.

(M4-1) The resistance change memory device defined in (M4), wherein
the time necessary for writing the first data being twice or more as long as the second data, and wherein
in the data refresh mode, the second data are over-written in the certain area in parallel with decoding-process of the read data in the buffer register with the ECC circuit, and then the first data in the read data are over-written in the certain cell area after the decode-processing.

(M4-2) The resistance change memory device defined in (M4), wherein
the data write after the decode-processing is for sequentially writing the first data in multiple cell groups sectioned in the certain cell area on the condition that the total cell current of simultaneously written cells is limited under a permissible value.

(M4-3) The resistance change memory device defined in (M4), wherein
there are disposed two systems of the buffer registers, and wherein
in the data refresh mode, a refresh operation in one of the buffer registers for an address data and another refresh operation in the other buffer register for the next address data are repeatedly performed with a overlapped time.

(M5) A resistance change memory device including:
a cell array, in which memory cells are arranged, the memory cell being reversibly set in one of a first data state and a second data state defined in accordance with the difference of the resistance value;
an ECC circuit configured to encode write data to be written into the cell array, thereby generating check bits to be stored in the cell array together with the write data, and decode read data read from the cell array to detect and correct errors;
an address memory circuit configured to store read data addresses in a non-volatile manner in accordance with a warning signal generated from the ECC circuit every when it detects that the error number has been over a certain value; and
a data refresh mode for reading data corresponding to the read data addresses stored in the address memory circuit, decoding data with the ECC circuit and over-writing the decoded data in the cell array.

(M5-1) The resistance change memory device defined in (M5), wherein
the data refresh mode is set by a command.

(M5-2) The resistance change memory device defined in (M5), further including:
a write-use cyclic counter configured to cyclically accesses the address memory circuit for writing the read data addresses; and
a read-use cyclic counter configured to cyclically accesses the address memory circuit for reading the read data addresses.

This invention is not limited to the above-described embodiments. It will be understood by those skilled in the art that various changes in form and detail may be made without departing from the spirit, scope, and teaching of the invention.

What is claimed is:

1. A resistance change memory device comprising a cell array, in which memory cells are arranged, the memory cell being reversibly set in one of a first data state and a second data state defined in accordance with the resistance value, wherein
the memory device has a data write mode including: a first write procedure for writing the first data in the cell array; and a second write procedure for writing the second data in the cell array, the second write procedure being different from the first write procedure, wherein
the memory cell has such a property that the time necessary for writing the second data is twice or more as long as the first data, and wherein
the first write procedure is for writing the first data in all cells in a selected cell area in a lump while the second write procedure is for sequentially writing the second data in multiple cell groups sectioned in the selected cell area on the condition that the total cell current of simultaneously written cells is limited under a permissible value.

2. The resistance change memory device according to claim 1, wherein
the first write procedure is for reforming cell data in the selected area.

3. The resistance change memory device according to claim 1, wherein
the first and second write procedures are for refreshing cell data in the selected area.

4. The resistance change memory device according to claim 1, wherein
the memory cell has such a property that the time necessary for writing the first data is twice or more as long as the second data, and wherein
the first write procedure is for sequentially writing the first data in multiple cell groups sectioned in a selected cell area on the condition that the total cell current of simultaneously written cells is limited under a permissible value while the second write procedure is for writing the second data in the selected cell in a lump.

5. The resistance change memory device according to claim 4, wherein
the first write procedure is for initializing all cells in the cell array.

6. The resistance change memory device according to claim 1, further comprising:
an ECC circuit configured to encode write data to be written into the cell array, thereby generating check bits to be stored in the cell array together with the write data, and decode read data read from the cell array to detect and correct errors; and
a buffer register configured to temporally store read data and write data of the cell array.

7. The resistance change memory device according to claim 6, wherein
in the data write mode, the first write procedure is performed for encoding the write data stored in the buffer register with the ECC circuit, and write-transferring the first data in the cell array simultaneously with the encoding process while the second write procedure is performed for write-transferring the second data within the write data in the cell array after the encoding process.

8. The resistance change memory device according to claim 6, further comprising a data refresh mode for refreshing data in the cell array, wherein
in the data refresh mode, read data read from a certain area to the buffer register are decoded with the ECC circuit and over-written in the buffer register; the first data are write-transferred to the certain area simultaneously with the decoding process; and the second data within the decoded read data are write-transferred to the certain area after the decoding process.

9. The resistance change memory device according to claim 6, wherein
there are disposed two systems of the buffer registers serving for alternately burst-transferring read or write data.

10. A resistance change memory device comprising:
a cell array, in which memory cells are arranged, the memory cell being reversibly set in one of a first data state and a second data state defined in accordance with the resistance value, the time necessary for writing the first data being twice or more as long as the second data; and
a data write mode for writing multi-bit data containing the first data and the second data in the cell array, the data write mode including a first write operation for writing only the first data and a second write operation for writing only the second data, the second write operation being different from the first write operation.

11. The resistance change memory device according to claim 10, wherein
in the data write mode, the first write operation is for initializing all cells in a selected cell area in the cell array.

12. The resistance change memory device according to claim 10, wherein
in the data write mode, the first write operation is for sequentially writing the first data in multiple cell groups sectioned in a selected cell area on the condition that the total cell current of simultaneously written cells is limited under a permissible value.

13. The resistance change memory device according to claim 10, further comprising:
an ECC circuit configured to encode write data to be written into the cell array, thereby generating check bits to be stored in the cell array together with the write data, and decode read data read from the cell array to detect and correct errors; and
a buffer register configured to temporally store read data and write data of the cell array.

14. The resistance change memory device according to claim 13, wherein
the data write mode includes: a first procedure for encoding write data with the ECC circuit and over-writing it in the buffer register, the write data being stored in the buffer register to be written in a selected cell area; a second procedure for writing the second data in the selected cell area in its entirety in a lump in parallel with the first procedure; and a third procedure for writing the first data contained in the write data in the selected cell area after completion of the first and second procedures.

15. The resistance change memory device according to claim 14, wherein the third procedure is for sequentially writing the first data in multiple cell groups sectioned in the selected cell area on the condition that the total cell current of simultaneously written cells is limited under a permissible value.

16. The resistance change memory device according to claim 13, wherein there are disposed two systems of the buffer registers, and wherein in the data write mode, while write data loaded in one of the two systems of the buffer registers are encode-processed with the ECC circuit and write-transferred to the cell array, next write data are transferred to the other buffer register.

17. The resistance change memory device according to claim 13, further comprising:

a data refresh mode for reading data from a certain cell area in the cell array to the buffer register, decoding the read data with the ECC circuit, and then over-writing the decoded data in the certain area.

18. The resistance change memory device according to claim 17, wherein in the data refresh mode, the second data are written in the certain cell area in its entirety in parallel with the ECC-decoding of the read data in the buffer, and the first data within the decoded read data are written in the certain area after the ECC-decoding.

19. The resistance change memory device according to claim 18, wherein in the data refresh mode, the data write after the ECC-decoding is for sequentially writing the first data in multiple cell groups sectioned in the certain area on the condition that the total cell current of simultaneously written cells is limited under a permissible value.

20. The resistance change memory device according to claim 17, wherein there are disposed two systems of the buffer registers, and wherein in the data refresh mode, a refresh operation in one of the buffer registers for an address data and another refresh operation in the other buffer register for the next address data are repeatedly performed with an overlapped time.

21. The resistance change memory device according to claim 13, further comprising:

an address memory circuit configured to store read data addresses in a non-volatile manner in accordance with a warning signal generated from the ECC circuit every when it detects that the error number has been over a certain value; and a data refresh mode for reading data corresponding to the read data addresses stored in the address memory circuit, decoding data with the ECC circuit and over-writing the decoded data in the cell array.

22. The resistance change memory device according to claim 21, wherein the data refresh mode is set by a command.

23. The resistance change memory device according to claim 21, further comprising:

a write-use cyclic counter configured to cyclically access the address memory circuit for writing the read data addresses; and a read-use cyclic counter configured to cyclically access the address memory circuit for reading the read data addresses.

* * * * *